US011723222B2

(12) United States Patent
Leng et al.

(10) Patent No.: US 11,723,222 B2
(45) Date of Patent: Aug. 8, 2023

(54) INTEGRATED CIRCUIT (IC) PACKAGE WITH INTEGRATED INDUCTOR HAVING CORE MAGNETIC FIELD (B FIELD) EXTENDING PARALLEL TO SUBSTRATE

(71) Applicant: Microchip Technology Incorporated, Chandler, AZ (US)

(72) Inventors: Yaojian Leng, Portland, OR (US); Justin Sato, West Linn, OR (US); Bomy Chen, Newark, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 141 days.

(21) Appl. No.: 17/074,848

(22) Filed: Oct. 20, 2020

(65) Prior Publication Data

US 2021/0036059 A1 Feb. 4, 2021

Related U.S. Application Data

(63) Continuation-in-part of application No. 16/540,117, filed on Aug. 14, 2019, now Pat. No. 11,043,471.
(Continued)

(51) Int. Cl.
*H10K 19/00* (2023.01)
*H10K 19/10* (2023.01)
*H01L 49/02* (2006.01)

(52) U.S. Cl.
CPC ......... *H10K 19/201* (2023.02); *H10K 19/10* (2023.02); *H01L 28/10* (2013.01)

(58) Field of Classification Search
CPC ..... H01L 27/281; H01L 27/283; H01L 28/10; H01L 23/5383; H01L 23/13; H01L 24/16;
(Continued)

(56) References Cited

U.S. PATENT DOCUMENTS

| 5,362,986 A | 11/1994 | Angiulli et al. ............... 257/723 |
| 8,703,543 B2 | 4/2014 | Wan et al. ..................... 438/121 |

(Continued)

FOREIGN PATENT DOCUMENTS

WO     2018/125486 A1     7/2018     ............. H01L 23/00

OTHER PUBLICATIONS

International Search Report and Written Opinion, Application No. PCT/US2019/060388, 11 pages, dated Mar. 20, 2020.
(Continued)

*Primary Examiner* — Jasmine J Clark
(74) *Attorney, Agent, or Firm* — Slayden Grubert Beard PLLC

(57) ABSTRACT

An integrated circuit (IC) package product, e.g., system-on-chip (SoC) or system-in-package (SiP) product, may include at least one integrated inductor having a core magnetic field (B field) that extends parallel to the substrate major plane of at least one die or chiplet included in or mounted to the product, which may reduce the eddy currents within each die/chiplet substrate, and thereby reduce energy loss of the indictor. The IC package product may include a horizontally-extending IC package substrate, a horizontally-extending die mount base arranged on the IC package substrate, at least one die mounted to the die mount base in a vertical orientation, and an integrated inductor having a B field extending in a vertical direction parallel to the silicon substrate of each vertically-mounted die, thereby providing a reduced substrate loss in the integrated inductor, which provides an increased quality factor (Q) of the inductor.

18 Claims, 34 Drawing Sheets

Related U.S. Application Data

(60) Provisional application No. 62/845,833, filed on May 9, 2019, provisional application No. 63/007,872, filed on Apr. 9, 2020.

(58) Field of Classification Search
CPC ..... H01L 23/5385; H01L 24/81; H01L 25/50; H01L 25/18; H01L 2224/02371; H01L 2224/05548; H01L 2224/05553; H01L 2224/05557; H01L 2224/16227; H01L 2224/16235; H01L 2224/291; H01L 2224/81141; H01L 2224/05624; H01L 2224/05647; H01L 2224/05663; H01L 2224/06181; H01L 2224/10135; H01L 2224/10165; H01L 2224/13013; H01L 2224/131; H01L 2224/13124; H01L 2224/136; H01L 2224/1607; H01L 2224/16105

See application file for complete search history.

(56) References Cited

U.S. PATENT DOCUMENTS

| | | |
|---|---|---|
| 11,094,628 B2 | 8/2021 | Leng |
| 2011/0057306 A1 | 3/2011 | Mcshane et al. ............. 257/706 |
| 2014/0036462 A1 | 2/2014 | Wang et al. ................. 361/765 |
| 2015/0302974 A1* | 10/2015 | Zhao .................... H01F 41/046 336/200 |
| 2017/0033059 A1 | 2/2017 | Song et al. .................. 257/503 |

OTHER PUBLICATIONS

International Search Report and Written Opinion, Application No. PCT/US2020/063201, 12 pages, dated Mar. 3, 2021.

* cited by examiner

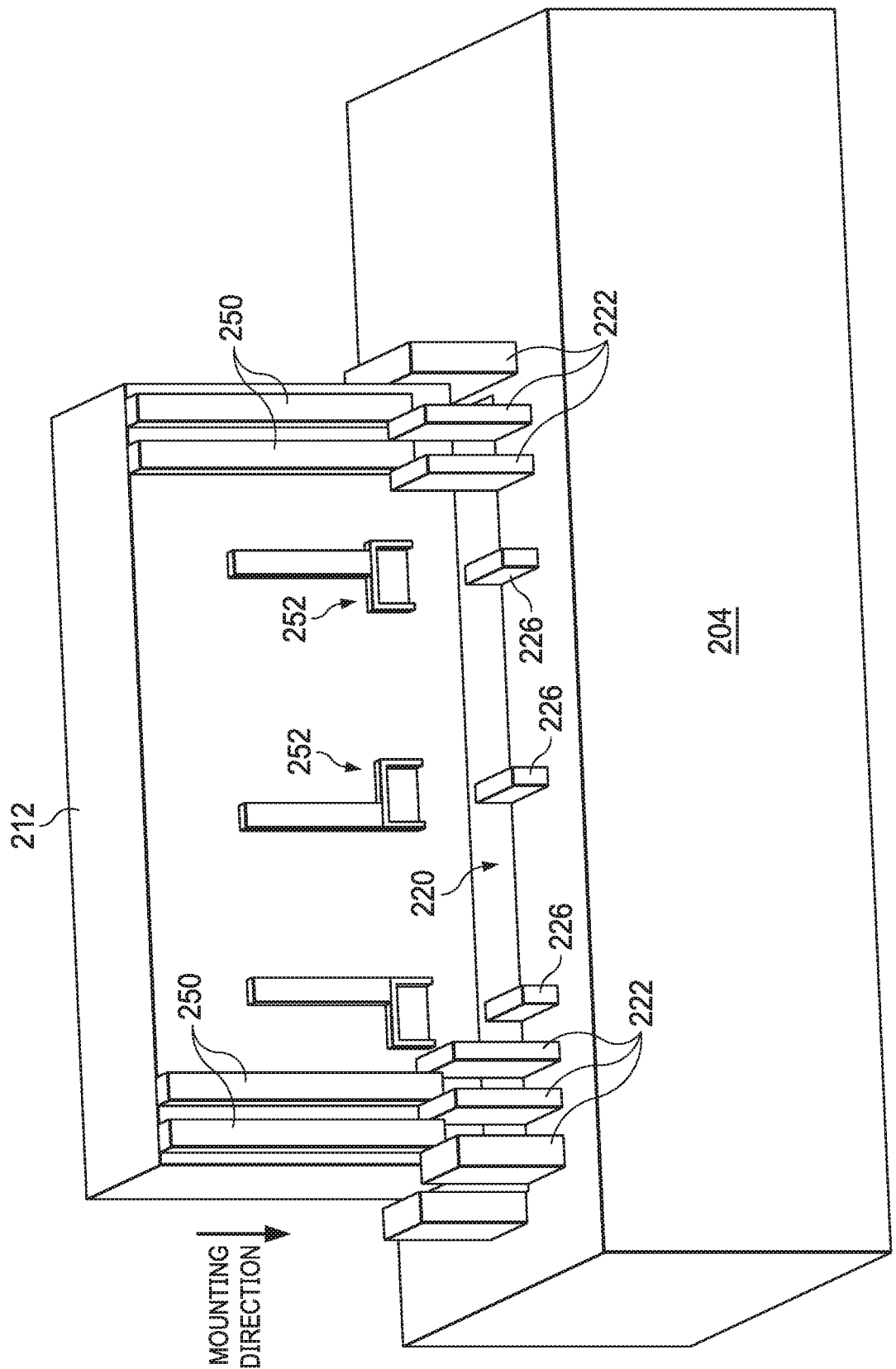

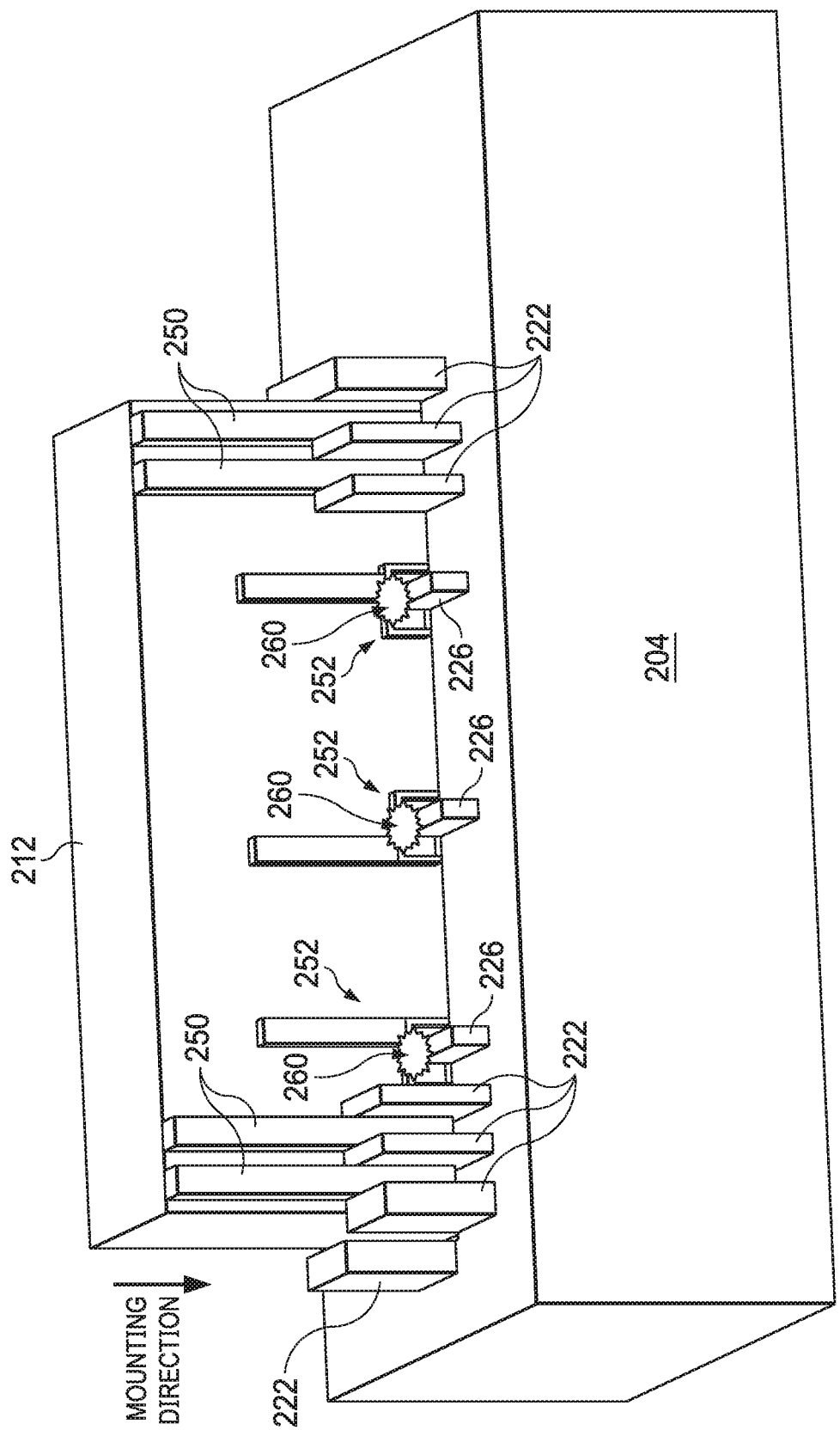

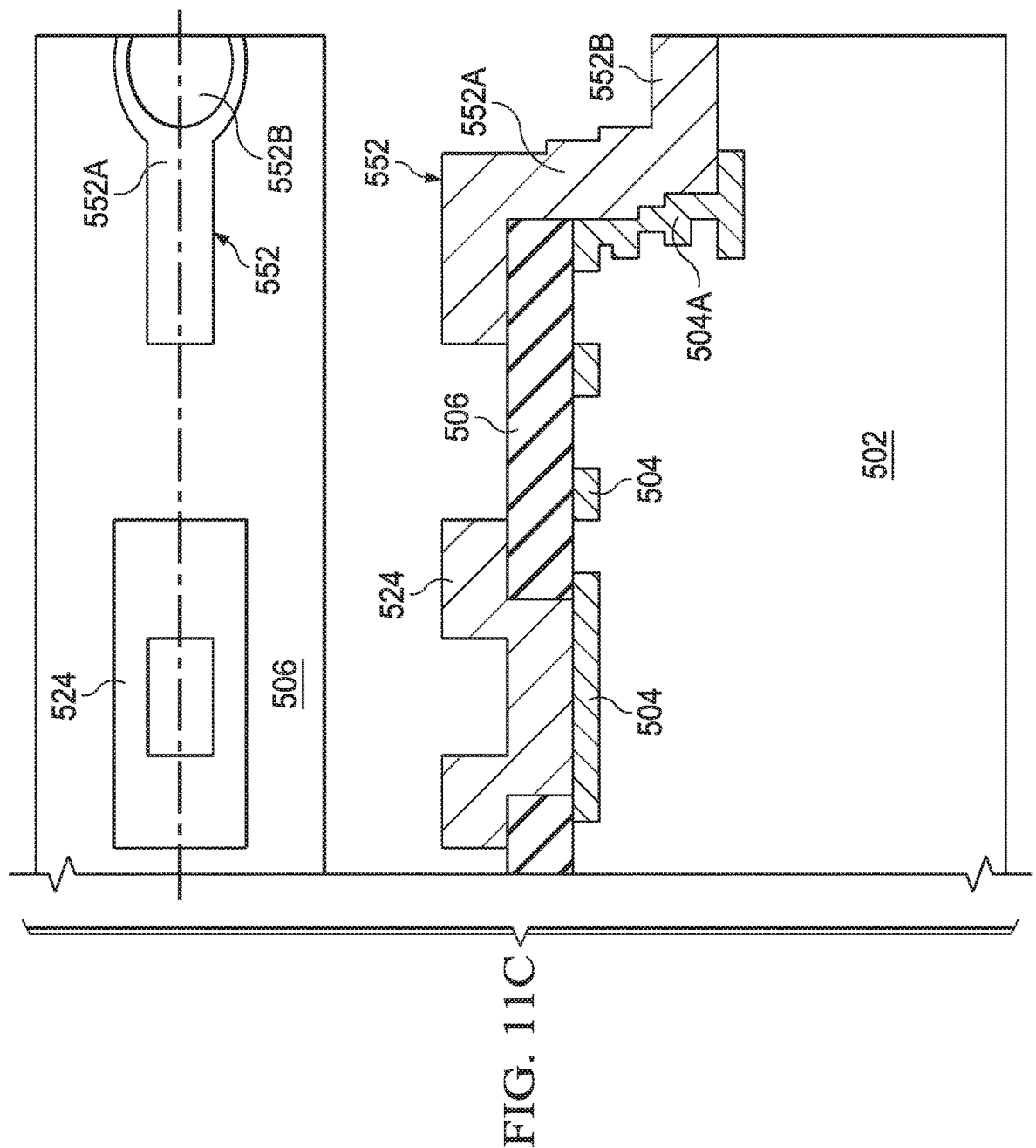

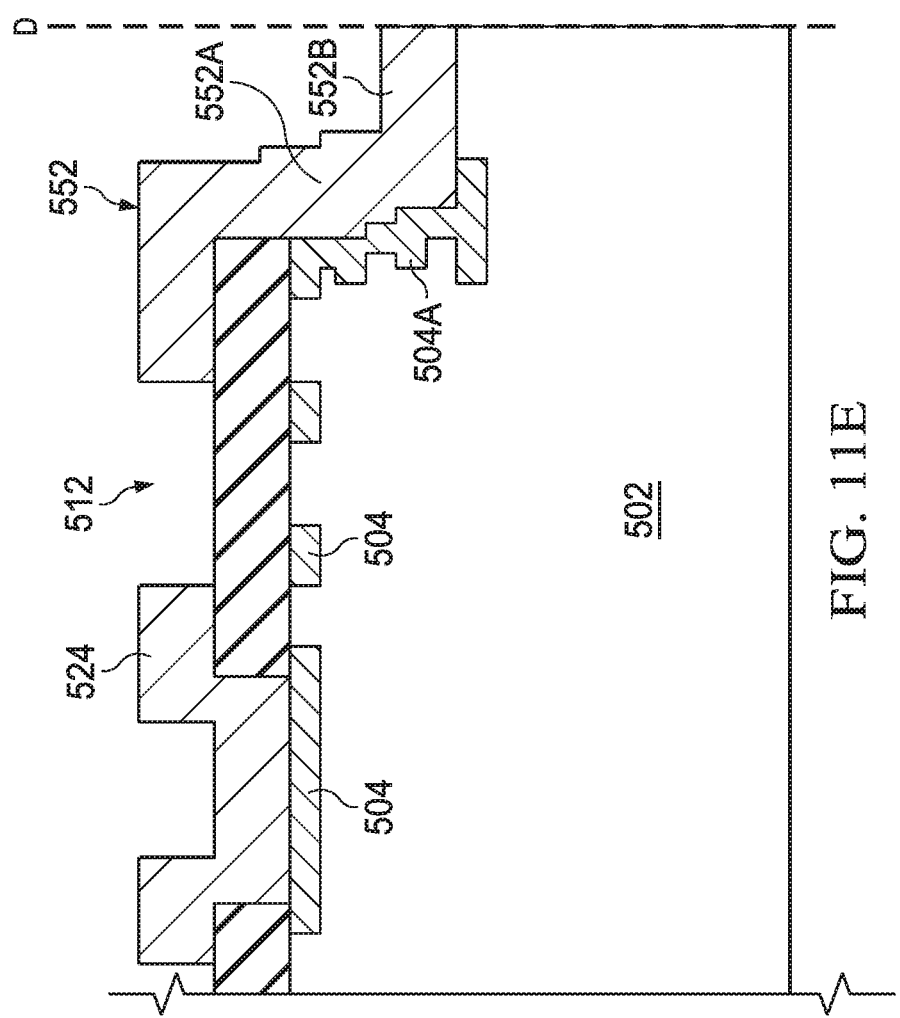

INTEGRATED CIRCUIT (IC) PACKAGE WITH INTEGRATED INDUCTOR HAVING CORE MAGNETIC FIELD (B FIELD) EXTENDING PARALLEL TO SUBSTRATE

RELATED APPLICATION

This application is a continuation-in-part of U.S. patent application Ser. No. 16/540,117 filed Aug. 14, 2019, now U.S. Pat. No. 11,043,471, and entitled "Mixed-Orientation Multi-Die Integrated Circuit Package With At Least One Vertically-Mounted Die," which claims priority to U.S. Provisional Patent Application No. 62/845,833 filed May 9, 2019, the entire contents of which applications are hereby incorporated by reference for all purposes. This application also claims priority to U.S. Provisional Patent Application No. 63/007,872 filed Apr. 9, 2020, the entire contents of which application is hereby incorporated by reference for all purposes.

TECHNICAL FIELD

The present disclosure relates to integrate circuit packages, and more particularly to integrated circuit (IC) packages, e.g., system-on-chip (SoC) or system-in-package (SiP), including vertically-mounted die(s) and an integrated inductor having a core magnetic field (B field) extending parallel to at least one substrate (e.g., lossy silicon substrate) in the IC package, to thereby reduce eddy current loss of the integrated inductor.

BACKGROUND

Moore's law has partially moved away from pure-Si process integration to die-assembly and heterogeneous die integration (i.e., a move from cost-per-transistor to cost-per-packaged transistor) to provide total-system-solutions (TSS) in a single IC package, e.g., system-on-chip (SoC) or system-in-package (SiP) solutions. For example, a heterogeneous multi-die SiP package may include multiple different types of dies mounted in a common package.

Known multi-die SiP packages include 3-D or 2.5D heterogeneous die integration products including multiple dies mounted in a horizontal (flat) orientation on a package substrate, which in turn may be mounted on a printed circuit board (PCB). Multiple dies in the package may be connected to each other by interconnects or other connections formed in the package substrate or in a silicon "interposer" arranged between the dies and the package substrate.

For example, FIG. 1 shows a cross-section of an example multi-die FPGA package 10 by Intel Corporation, which includes an FPGA die 12 mounted centrally on a multi-die package substrate 14, and a number of DRAM dies (not shown) and transceiver dies 18 mounted on the package substrate 14 around the periphery of the FPGA 12 and each connected to the FPGA 12 by interconnects 20 formed in (i.e., routed through) the package substrate 14, referred to by Intel as Embedded Multi-die Interconnect Bridge (EMIB) connections. A package lid 22 is formed over the multi-die FPGA package 10 to seal the multi-die FPGA package 10.

The cross-section shown in FIG. 1 shows a pair of transceiver dies 18 on opposing sides of the FPGA die 12, with each transceiver die 18 connected to the FPGA 12 by EMIB interconnects 20 routed through the multi-die package substrate 14. As shown, the multi-die FPGA package 10 may be solder mounted on a PCB 24. The devices mounted on the package substrate 14 (FPGA 12, DRAM (not shown), and transceivers 18) are connected to electronics on the PCB 24 by "through-silicon vias" (TSVs) 26 extending vertically through the multi-die package substrate 14.

In other multi-die SiP packages, the various dies in the package are connected to each other by interconnects formed in a discrete "interposer" structure provided between the dies and the multi-die package substrate. FIG. 2 shows a cross-section of an example multi-die FPGA package 50 by Xilinx, Inc. and Taiwan Semiconductor Manufacturing Company Limited (TSMC). The cross-sectional view of FPGA package 50 shows an FPGA die 52 and a memory die 54 solder mounted on a silicon interposer 56, which is in turn solder mounted on a package substrate 58. The silicon interposer 56 includes (a) interconnections 60 between FPGA 52 and memory 54 (and similar interconnections between other dies mounted on the silicon interposer 56), and (b) TSVs 62 extending vertically through the interposer 56 to connect the FPGA 52 and memory 54 to the package substrate 58 (and to electronics on a PCB to which the multi-die FPGA package 50 is mounted through TSVs or other connections (not shown) extending vertically though the package substrate 58).

There is a need for improved heterogeneous multi-die packages (packages including multiple different types of dies), for example, heterogeneous multi-die packages having a reduced footprint/area.

In a typical SoC or SiP product, e.g., the example multi-die SiP packages discussed above, the substrate and/or interposer may include various types of integrated passive components, for example various resistors, capacitors, and inductors. Integrating such components into the SoC or SiP product, as opposed to using external components mounted to a PCB, may (a) significantly reduce power usage in the product, thereby improving battery life, (b) allow for a reduced form factor, (c) reduce cost, and (d) provide better product reliability.

Integrated inductors have a wide range of applications. For example, integrated inductors are advantageous in RF and mm-wave circuits (e.g., in mobile device) in which high frequency operation requires small inductance, as compared with external inductors (e.g., mounted to a PCB) which are often overwhelmed by parasitic effects. Some example applications in which integrated inductors are particularly suitable include low-noise amplifiers (LNAs), resonant load and matching network applications, and RF filters. As another example, integrated inductors are very useful in constructing a power supply on a chip (PowerSoC), e.g., in a power management device (e.g., DC-DC converter). Such integrated inductors may be used in integrated voltage regulators (IVRs) and switch mode power supplied (SMPSs), such as buck-boost converters, for example.

However, although integrated inductors are beneficial in many different applications, they are typically more difficult to manufacture than integrated resistors or capacitors in an SoC or SiP product. Integrated inductors are typically constructed with thick wires (typically Al or Cu) using customized processes, and thus are relatively expensive.

In addition, integrated inductors generate magnetic fields that create eddy currents, i.e., loops of electrical current, in nearby conductive structures that may affect the inductor performance. In particular, eddy currents flow in closed loops within conductive structures, in planes perpendicular to the magnetic field. For example, an integrated inductor in a conventional SoC or SiP product generates a large eddy current, both in strength and current loop size, within each lossy substrate in the package, including the package substrate (typically silicon) and the substrate (also typically silicon) of each die/chiplet included or mounted in the SoC or SiP product. The large eddy currents within the lossy substrates increases the energy loss of the inductor and thereby reduces a quality factor (Q) of the inductor.

For example, each integrated inductor is typically built on a silicon substrate and creates large eddy currents, resulting from the inductor's core magnetic field (B field), that cause significant losses in the substrate. Further, in an SiP product including dies/chiplets mounted to the package substrate or to an interposer, each integrated inductor may create large eddy currents causing significant losses in the mounted dies/chiplets as well as the package substrate. For convenience, inductor-related loss in both substrates and mounted dies/chiplets are collectively referred to herein as "substrate loss."

FIG. 3A shows an example integrated inductor 80 formed in the interposer 56 of the multi-die FPGA package 50 of FIG. 2, along with a representation of the inductor's core magnetic field (B field) lines, indicated at 82. An integrated inductor 80 is typically shaped as a squared or rounded coil, e.g., a solenoid. As shown, the B field runs generally perpendicular to elongated (horizontal) direction of both the package substrate 58 and the FPGA 52 located below and above the inductor 80, respectively, thus creating strong magnetic fields in the package substrate 58 and FPGA 52. These strong magnetic fields generate eddy currents, indicated at 84, flowing in the elongated (horizontal) direction of the package substrate 58 and FPGA 52. These eddy currently are typically large, in both strength and current loop size, which may result in large overall substrate loss, thereby reducing the quality factor (Q) of the integrated inductor 80.

FIG. 3B shows a representation of the integrated inductor 80, modelled as a cylindrical coil (solenoid) 80', and the core magnetic field (B field) generated by the solenoid inductor 80'. As shown, the B field lines generally run perpendicular to the current path through the coiled conductor of the solenoid inductor 80'. Applying Ampere's circuital law, the magnetic flux density B for a long solenoid may be approximated by the formula $B = \mu NI$, where $\rho$ represents the magnetic permeability of free space, N represents the number of turns of wire per meter, and I represents the current through the wire.

IC device manufacturers have expended great effort and expense in attempting to reduce the inductor-related substrate loss described above. Some manufacturers have developed patterned ground shields. Others have adopted silicon-on-insulator (SOI) constructions. Still others attempt to physically move the integrated inductors away from the substrate, although this solution is limited by the relevant interconnect layers. Each of these solutions is relative expensive and provides limited effectiveness in reducing substrate loss from inductor-related eddy currents.

There is a need for providing integrated inductors that reduce substrate loss from inductor-related eddy currents in an efficient and cost-effective manner.

SUMMARY

One aspect of the present disclosure provides system-in-package (SiP) IC packages with at least one die or chiplet mounted orthogonally with respect to a package substrate and/or a die mount base on which the at least one die or chiplet is mounted. Such IC packages are referred to herein as "orthogonal-die-mount packages" or "ODM packages." For example, some embodiments provide an ODM package including at least one die or chiplet mounted vertically to a horizontally-extending die mount base mounted to or arranged on a horizontally-extending package substrate. Such vertically-mounted dies or chiplets are referred to herein as "VMDs." The terms "die" and "chiplet" are used interchangeably herein.

In some embodiments, all dies mounted to an ODM package are VMDs, e.g., orthogonal to the die mount base and underlying package substrate. In other embodiments, an ODM package includes both (a) one or more VMDs (extending orthogonal to the die mount base and underlying package substrate) and (b) one or more horizontally-mounted dies, or "HMDs" (extending parallel to the die mount base and underlying package substrate). A multi-die system-in-package (SiP) IC package including a combination of dies mounted in different physical orientations, e.g., a combination of VMDs and HMDs is referred to herein as a mixed-orientation multi-die ("MOMD") package. Thus, it should be understood that MOMD packages, i.e., packages that include dies mounted in multiple different orientations with respect to a die mount base/package substrate (e.g., one or more VMD and one or more HMD mounted to a horizontal die mount base), comprise a subset of ODM packages, i.e., packages that include at least one die mounted orthogonal to the die mount base/package substrate (e.g., one or more VMD mounted to a horizontal die mount base).

Some MOMD package embodiments include at least one FPGA or other "high performance" chiplet (e.g., a chiplet that operates at 300 MHz or higher frequency) mounted horizontally as HMD(s), and at least one other chiplet mounted vertically as VMD(s). VMDs may include various types of devices, e.g., including "low performance" chiplets (e.g., chiplets that operate at <300 MHz frequency), and other physical structures such as heat dissipators, memory, high voltage/analog devices, sensors, or micro-electro-mechanical systems (MEMS), for example.

In some embodiments, MOMD packages may be more advanced with a smaller lateral footprint and may provide more die integration per unit area, as compared with existing designs, e.g., designs discussed above in the Background section.

In some embodiments, an MOMD package includes a horizontally-extending die mount base including structures for mounting both HMD(s) and VMD(s). The MOMD die mount base may include vertically-extending VMD slots for receiving at least a portion of each VMD mounted thereto. The MOMD may also include VMD alignment structures, e.g., extending vertically upward from an upper side of the horizontally-extending die mount base, that facilitate aligning and/or guiding a vertical mounting of each VMD, e.g., to guide a leading portion of the VMD into a respective VMD slot in the die mount base. The VMD alignment structures may also physically support each VMD in its mounted position. VMD alignment structures may be formed from a polymer (e.g., polyimide) or other suitable materials. In some embodiments, a VMD may include alignment structures, e.g., elongated rails or grooves, configure to interact with corresponding VMD alignment structures provided on the MOMD die mount base, to help align and/or guide the mounting of the VMD. Further, VMDs may include specialized contact pads, e.g., formed in a scribeline area of a VMD die wafer. In some embodiments, VMDs may include U-shaped, cup-shaped, or arched contacts configured to provide an effective engagement with corresponding contact pads provided on the MOMD die mount base.

In some embodiments, the MOMD die mount base may include contact pads for bonding HMD(s) and VMD(s) to the MOMD die mount base. In some embodiments, the MOMD die mount base may include a larger number of bond pads for mounting each HMD than each VMD, as each HMD (e.g., a high-performance die) may require more pin-outs or other contacts than each VMD. The MOMD die mount base may include interconnects and/or other structures for conductively connect all of the dice together, and may include bonds pads for wire-bonding the die mount base to an underlying package substrate.

In some embodiments, the MOMD die mount base includes solder-coated contact pads for the following functions: mounting HMDs, mounting VMDs, and/or wire bonding (e.g., to an underlying substrate or other device). The solder coated contact pads may provide improved bonding for HMDs, VMDs, and/or wire bonds.

In some embodiments, the MOMD die mount base is an interconnect-only device formed from a non-electrical grade silicon substrate, or other inexpensive substrate. In some embodiments, the MOMD die mount base may perform the upper-level metal routing for at least one (or all) dice bonded to the die mount base. For example, the MOMD die mount base may include metal routing layers 5-N (e.g., metal layers 5-12), such that a high-performance die (e.g., FPGA) mounted to the MOMD may be manufactured with only metal layers 1-4. Thus, for some HMDs, a partially processed foundry die (including a subset of metal layers) may be used, while the remaining metal layers (e.g., layers 5-10+) may be formed in the MOMD die mount base, e.g., using copper wiring, which may reduce the extremely expensive conventional foundry manufacturing costs for up to 12+ mask-layers for FPGA and other high performance chiplets.

In some embodiments, an MOMD package includes no transistors, but only low latency metal routing and specialized bond pads. In some embodiments, all dies are interconnected in the MOMD package with copper interconnects, which provides ultra-low latency. Further, in some embodiments, unlike certain existing products (e.g., products discussed above in the Background section), the MOMD package may include no TSV, and no interposer.

Another aspect of the present disclosure provides an IC package, e.g., a system-on-chip (SoC) or system-in-package (SiP) product, that includes an integrated inductor (or multiple integrated inductors) arranged such that the core magnetic field (B field) of the inductor extends parallel to the major plane of at least one substrate (e.g. silicon substrate) in the product, including at least one of (a) the package substrate and/or (b) the respective substrate of at least one die/chiplet mounted to the package substrate (directly or indirectly, e.g., mounted via a die mount base mounted to the package substrate). The major plane of a substrate, whether referring to the substrate of an IC package or the substrate of a die/chiplet mounted in an IC package, is referred to a "substrate major plane."

A parallel orientation of an inductor B field relative to a substrate major plane of a respective substrate in an IC package (e.g., the package substrate or the substrate of a respective die/chiplet mounted in the product) generally provides a low or reduced eddy current in the respective substrate (as compared with an orthogonal relationship between the B field and VMD substrates), and thus a reduced substrate loss in the inductor. As a result, in an IC product including an integrated inductor, each substrate in the product (including the package substrate and/or the substrate of each die/chiplet mounted in the product) that is oriented with its substrate major plane parallel to the inductor B field reduces the overall substrate loss of the inductor, due to reduced eddy currents in the respective substrate. Thus, some embodiments of the invention provide an ODM in which the various components are arranged and oriented such that the B field of an integrated inductor is parallel to the substrate major plane of at least one, or a majority, or all substrates in the package, to thereby reduce the overall substrate loss and increase the quality factor (Q) of the inductor.

Further, in embodiments in which one or more substrates are oriented orthogonal to the inductor B field, one, some, or all of such orthogonal substrates may be formed from a high resistivity substrate material to further reduce substrate loss of the inductor. As used herein, a "high resistivity substrate material" refers to a substrate material having a resistivity of greater than 5 ohm-cm, including for example sapphire, purified silicon, and any other substrate material having a resistivity of greater than 5 ohm-cm.

In some embodiments, an ODM package may include at least one die mounted orthogonally to a die mount base, and an integrated inductor formed in the die mount base (e.g., formed by interconnect elements in the die mount base) such that the inductor B field extends parallel to the substrate major plane of each orthogonally mounted die. For example, an ODM package may include at least one VMD mounted to a horizontal die mount base, and an integrated inductor formed in the die mount base such that the inductor B field extends parallel to the substrate major plane of each VMD.

In some embodiments, an ODM package includes a horizontally-extending package substrate, a horizontally-extending die mount base mounted or otherwise arranged on the package substrate, at least one VMD having a vertically-extending substrate, and an integrated inductor having a B field extending in a vertical direction (a) perpendicular to the substrate major plane of the IC package substrate and (b) parallel to the vertically-extending substrate of each VMD. The parallel orientation of the inductor B field relative to the vertically-extending substrate of each VMD provides a reduced eddy current in each VMD substrate, as compared with an orthogonal relationship between the B field and VMD substrates. The reduced VMD substrate eddy currents may provide a reduced substrate loss in the inductor, which may provide an increased quality factor (Q) of the inductor. In addition, the package substrate, oriented orthogonal to the inductor B field, may be formed from an high resistivity substrate material to further reduce substrate loss of the inductor.

In some embodiments, the vertically-extending substrate of the VMD is formed from a more lossy material than the ODM package substrate. For example, the package substrate may be formed from an high resistivity substrate material to reduce eddy current loss in the inductor.

In some embodiments, the ODM package includes multiple VMDs, each mounted to the die mount base in a vertical orientation, such that the inductor B field is parallel to each of the multiple VMDs.

In some embodiments, the ODM package is a MOMD including at least one VMD and at least one HMD, wherein the inductor B field is parallel to each of VMD and orthogonal to each HMD. For example, an MOMD may include HMD(s) and VMD(s) mounted to a horizontally-extending die mount base that is mounted to an underlying package substrate, and an integrated inductor formed in the die mount base with a configuration that creates a vertically-extending B field, i.e., parallel to the substrate major plane of each VMD and orthogonal to each HMD and the package substrate. As discussed above, the package substrate and/or the substate of each HMD may (or may not) be formed from an high resistivity substrate material to further reduce eddy current loss in the integrated inductor.

In some embodiments, the ODM package includes a horizontally-extending die mount base including a plurality of transistors and interconnect structures, with an inductor module formed by selected interconnect structures in the horizontally-extending die mount base.

In some embodiments, the integrated inductor comprises a spiral inductor. For example, the integrated inductor may comprise a spiral inductor formed according to any teachings of co-pending U.S. application Ser. No. 16/549,635 filed Aug. 23, 2019 and entitled "Techniques for Making Integrated Inductors and Related Semiconductor Devices, Electronic Systems, and Methods," the entire contents of which application are hereby incorporated by reference for all purposes.

In other embodiments, an ODM package may include at least one die mounted orthogonally to a die mount base, and an integrated inductor formed in one of the orthogonally mounted die(s). For example, an MOMD package may include at least one VMD and at least one HMD mounted to a horizontal die mount base, and an integrated inductor formed in one of the orthogonally mounted die(s), such that the inductor B field extends parallel to the substrate major plane of each HMD, and also parallel to the package substrate, but orthogonal to the substrate major plane of each VMD. In some embodiments, the substate of each VMD may (or may not) be formed from an high resistivity substrate material to further reduce eddy current loss in the integrated inductor.

Another aspect provides a method of assembling an ODM package. The method may include mounting a die mount base including an integrated inductor to a package substrate, and mounting at least one die in an orientation orthogonal to the die mount base such that the core magnetic field (B field) of the integrated inductor extends parallel to the substrate major plane of each orthogonally-mounted die. For example, in some embodiments, a method of assembling an ODM package includes mounting a horizontally-extending die mount base including an integrated inductor to a horizontally-extending package substrate, and mounting at least one VMD to the die mount base such that inductor B field extends parallel to the substrate major plane of each mounted VMD, to thereby reduce eddy currents loss in the integrated inductor. In some embodiments, the package substrate, extending orthogonal to the B field, may be formed from an high resistivity substrate material to further reduce eddy current loss in the inductor.

In other embodiments, a method of assembling an MOMD package includes mounting a horizontally-extending die mount base including an integrated inductor to a horizontally-extending package substrate, and mounting at least one HMD and at least one VMD to the die mount base such that inductor B field extends parallel to the substrate major plane of each VMD, but orthogonal to the substrate major plane of each HMD and the package substrate. In some embodiments, the package substrate and/or the substate of each HMD may (or may not) be formed from an high resistivity substrate material to further reduce eddy current loss in the integrated inductor.

In other embodiments, a method of assembling an MOMD package may include mounting a horizontally-extending die mount base to a horizontally-extending package substrate, and mounting at least one VMD and at least one HMD to the die mount base, wherein a particular VMD includes an integrated inductor formed therein, such that the B field of the inductor extends parallel to the substrate major plane of each HMD, and also parallel to the package substrate, but orthogonal to the substrate major plane of each VMD. In some embodiments, the substate of each VMD may (or may not) be formed from an high resistivity substrate material to further reduce eddy current loss in the integrated inductor.

BRIEF DESCRIPTION OF THE DRAWINGS

Example aspects of the present disclosure are described below in conjunction with the figures, in which:

FIGS. 6A-6C illustrate an example process of mounting an example vertically-mounted die (VMD) in a vertical orientation with respect to an example MOMD die mount base, according to one example embodiment;

FIGS. 11A-11E illustrate an example process for forming U-shaped, cup-shaped, or arch-shaped contacts on a VMD, according to one example embodiment.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
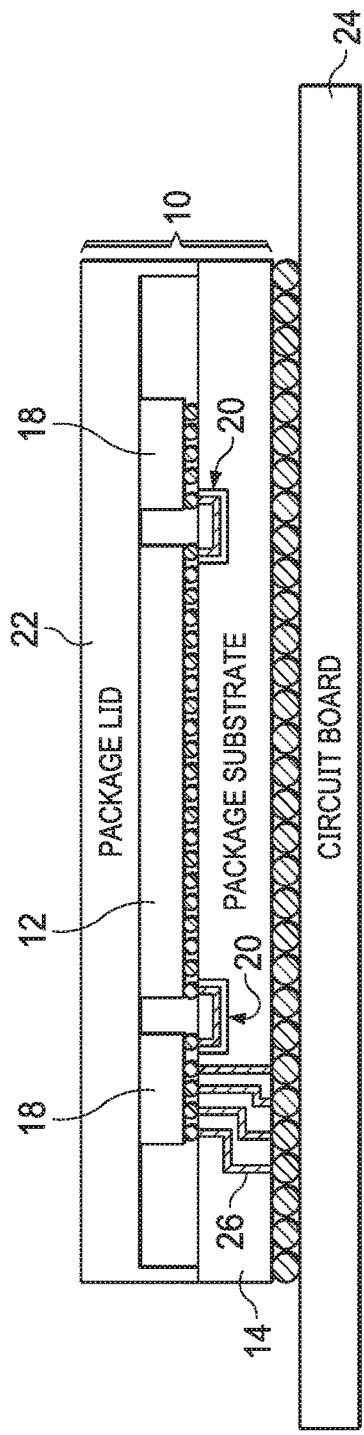
FIG. 1 shows a cross-section of a conventional multi-die FPGA package.
Figure 2:
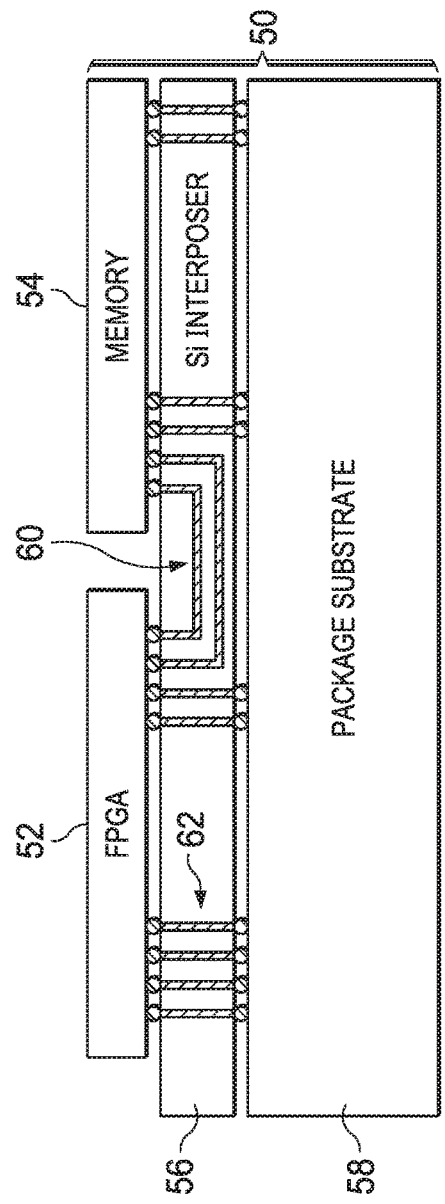
FIG. 2 shows a cross-section of another conventional multi-die FPGA package.
Figure 3A:
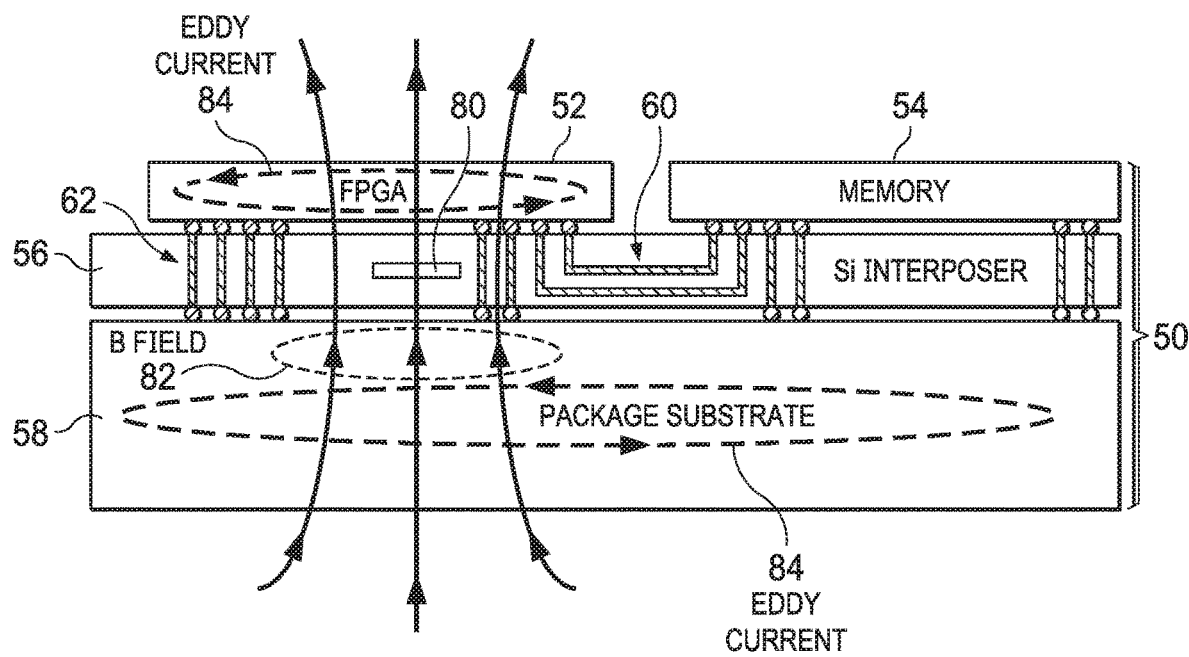
FIG. 3A shows an example conventional integrated inductor formed in the interposer of the conventional multi-die FPGA package of FIG. 2.
Figure 3B:
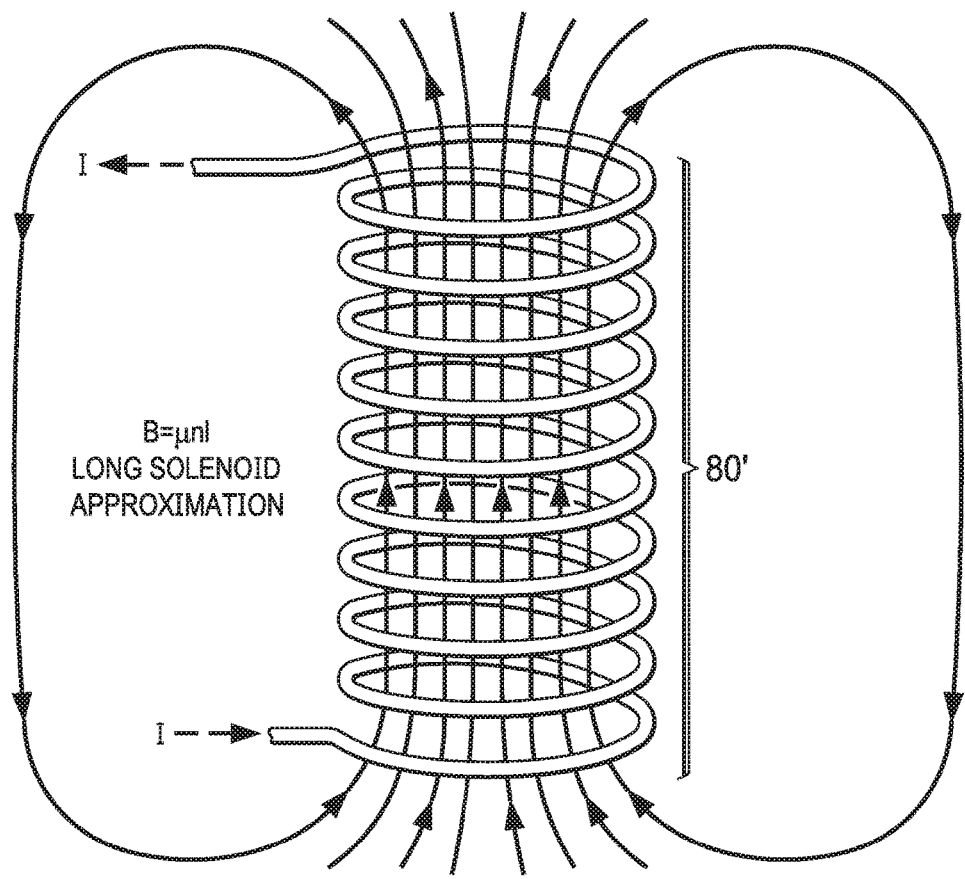
FIG. 3B shows a representation of the integrated inductor of FIG. 3A, modelled as a cylindrical coil (solenoid), and the core magnetic field (B field) generated by the solenoid inductor.
Figure 4A:
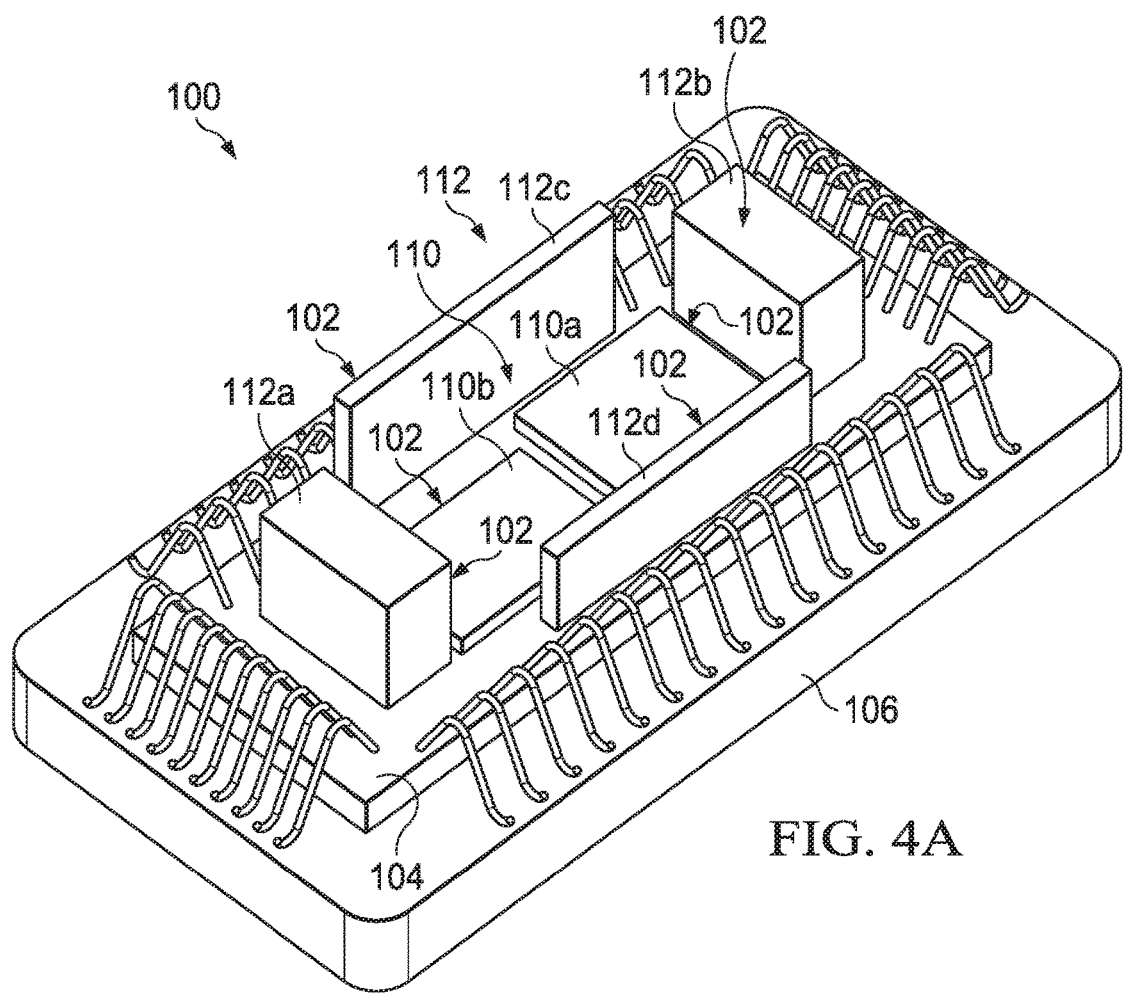
FIGS. 4A and 4B illustrate a top three-dimensional view and a side view, respectively, of an example mixed-orientation multi-die ("MOMD") package, according to one example embodiment of the present disclosure.
Figure 4B:
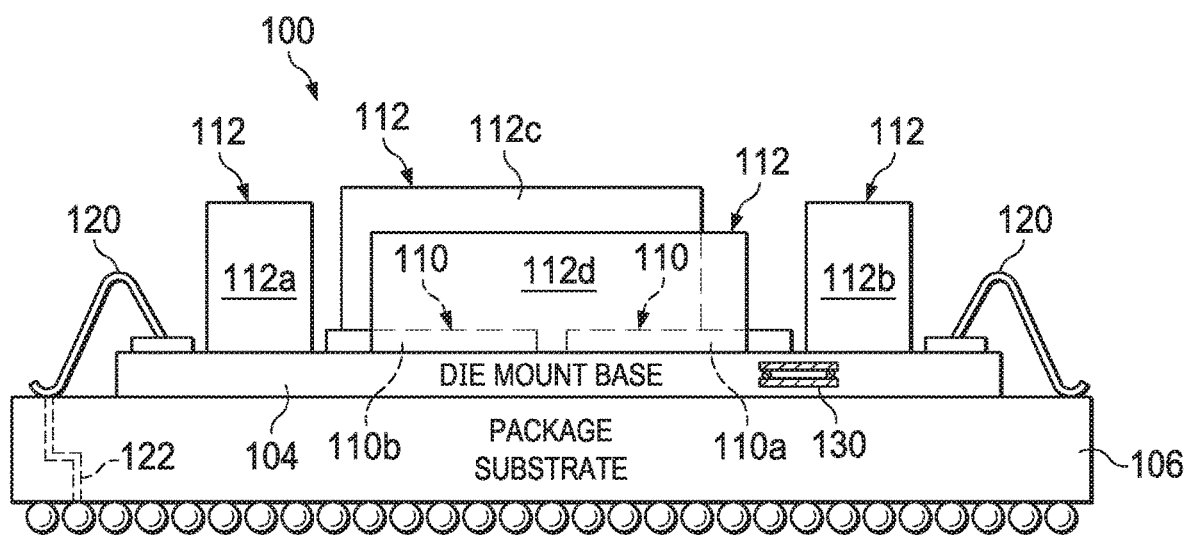

FIGS. 4A and 4B illustrate an example top three-dimensional view and an example side view, respectively, of an example mixed-orientation multi-die ("MOMD") package 100, according to one example embodiment of the present disclosure. The example MOMD package 100 may include a plurality of dies 102 mounted on a horizontally-extending die mount base 104, which is in turn mounted on a package substrate 106. The plurality of dies 102 mounted on the horizontally-extending die mount base 104 may include multiple different types of dies, and one or more instance of each type of die. In addition, the plurality of dies 102 may be mounted on the horizontally-extending die mount base 104 in at least two different orientations, for example, horizontally and vertically, which defines a "mixed-orientation" package.

Example types of dies 102 may include: FPGA dies, graphic processing units (GPUs), microcontrollers, encryption or security related dies, power-related dies (e.g., DC-DC converters, supervisors, and/or low-dropout (LDO) regulators), high-voltage input/output dies, motor drivers, power drivers, digital-analog converters, analog-digital converters, LED drivers, smoke detectors, piezoelectric drivers, digital potentiometers, sensors, touch-sensing inputs (e.g., proximity/3D sensors, buttons, sliders, and/or touch screens), amplifiers, filters, clocks or other timing devices, memory devices (e.g., EEPROM, serial flash, and serial SRAM), USB devices (e.g., smart hubs, switches, transceivers, and/or bridges), auto/industrial communication devices (e.g., Media Oriented Systems Transport (MOST) devices, RS232 device, RS485 devices, Controller Area Network (CAN) devices, and/or Local Interconnect Network (LIN) devices, wireless communication devices (e.g., Wi-Fi devices, Bluetooth devices, LoRa devices, and/or zigbee/MiWi devices), and Ethernet devices), batteries, antennae, capacitors, inductors, heat sinks/heat dissipators, and/or any other types of devices suitable for inclusion in an integrated circuit package.

MOMD package 100 may include both (a) one or more dies 102 mounted horizontally as horizontally-mounted dies or "HMDs" 110 and (b) one or more dies 102 mounted vertically as vertically-mounted dies or "VMDs" 112. In some embodiments, it may be preferable or necessary to mount certain dies 102 on the horizontally-extending die mount base 104 horizontally as HMDs 110, e.g., to provide a sufficiently large area of contact between the die 102 and horizontally-extending die mount base 104, and/or to provide a sufficient or required number of conductive contacts between the die 102 and horizontally-extending die mount base 104 for the proper operation of the die 102. For example, it may be preferable or necessary to mount "high-performance" dies 102 horizontally as HMDs 110 to allow sufficient or required contacts between such dies 102 and the horizontally-extending die mount base 104 (e.g., for data communications between the die 102 and a PCB on which MOMD package 100 is mounted). As used herein, a high-performance die is configured for operation at an operating frequency of at least 300 MHz. Examples of high-performance dies include microcontrollers and microprocessors configured for operation at an operating frequency of at least 300 MHz, e.g., certain FPGA dies and graphics processing unit (GPU) dies.

Other dies 102, e.g., dies requiring a smaller area of contact between the die 102 and horizontally-extending die mount base 104, may be mounted on the horizontally-extending die mount base 104 vertically as VMDs 112, e.g., to reduce the total footprint of the MOMD package 100. For example, certain non-high-performance dies may be mounted vertically as VMDs 112.

As used herein, a die is "horizontally-mounted" (i.e., an HMD) if a largest side of the die lies in a plane extending parallel or substantially parallel with (<45° offset from) the major plane of the package substrate (e.g., the largest side of the die lies in a horizontal plane parallel with a horizontally-oriented package substrate). In contrast, a die is "vertically-mounted" (i.e., a VMD) if a largest side of the die lies in a plane extending perpendicular or substantially perpendicular with (>45° offset from) the major plane of the package substrate (e.g., the largest side of the die lies in a vertical plane extending perpendicular from a horizontally-oriented package substrate). For a die having the shape of a rectangular solid, a largest side of the die is a side having a surface area at least as large as each other side of the die. For a die having a shape other than a rectangular solid, a largest side of the die is defined by the smallest rectangular solid that can contain the die ("smallest die-containing rectangular solid" or "SDCRS"); thus, the largest side of such non-rectangular-solid die is a side of its SDCRS having a surface area at least as large as each other side of the SDCRS.

In the specific example shown in FIGS. 4A and 4B, the example MOMD package 110 includes (a) two high-performance dies 102 mounted as HMDs 110: a FGPA die 110a and a GPU die 110b, and (b) four non-high performance dies 102 mounted as VMDs 112: a non-volatile memory die 112a, a DRAM die 112b, an input/output device die 112c, and a high voltage/analog device die 112d. However, the embodiment shown in FIGS. 4A and 4B is only one example; MOMD packages according to the present disclosure may include any number and types of HMD(s) and VMD(s). In some embodiments, VMDs 112 may be formed with a rectangular shape that is elongated in a first horizontal direction as compared with a second horizontal direction orthogonal to the first horizontal direction (e.g., by a factor of at least 2, at least 3, at least 4, at least 5, or greater than 5), e.g., to provide additional area for contact pads and/or to reduce communication latency to high-performance HMD(s) 110. VMDs 112 may be mounted or inserted manually, or automated by robot pick and place, depending on the embodiment.

The various dies 102 mounted on the horizontally-extending die mount base 104 may be connected to each other by conductive interconnects (shown in FIG. 5 discussed below) formed in the horizontally-extending die mount base 104, connected to the package substrate 106 by wire bond connections 120, and further connected to an underlying PCB (or other device to which the package 100 is mounted) by conductors 122 extending vertically through the package substrate 106.

In some embodiments, at least one integrated inductor 130 may be formed in the die mount base 104, e.g., from metal interconnect elements formed in and/or on die mount base 104. The integrated inductor 130 may be configured such that the core magnetic field (B field) of the inductor extends vertically, i.e., parallel to a substrate plane of each VMD 112, which provides a small eddy current in each VMD substrate and thus contributes little or no substrate loss to the inductor 130. Various aspects and configurations of the integrated inductor 130 are discussed in more detail below, with reference to FIGS. 13A-18B.

Figure 5:
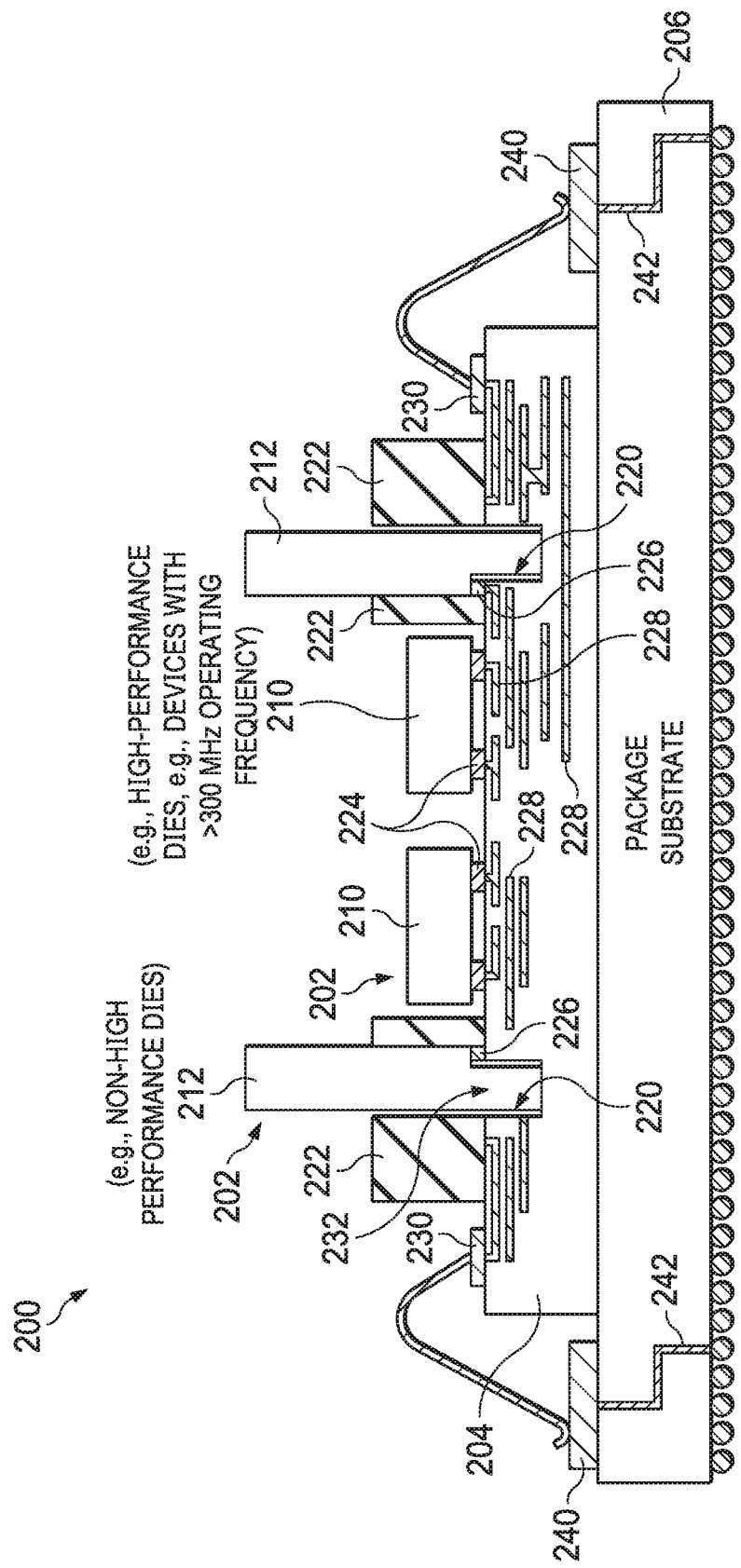
FIG. 5 is a side cross-sectional view an example MOMD package, according to one example embodiment.

FIG. 5 is a side cross-sectional view an example MOMD package 200, according to one example embodiment. As shown, MOMD package 200 includes a plurality of dies 202 mounted on a on a horizontally-extending die mount base 204, which is in turn mounted on a package substrate 206. The plurality of dies 202 mounted on the horizontally-extending die mount base 204 include both (a) horizontally-mounted dies (HMDs) 210 and vertically-mounted dies (VMDs) 212. In particular, the cross-section shown in FIG. 5 shows a pair of HMDs 210 and a pair of VMDs 212.

MOMD package 200 may include any number and types of dies 202, each arranged either horizontally as an HMD 210 or vertically as a VMD 212. For example, in some embodiments, MOMD package 200 includes at least one high-performance die mounted to the horizontally-extending die mount base 204 as an HMD 210 and at least one non-high-performance die mounted to the horizontally-extending die mount base 204 as a VMD 212. In some embodiments, each HMD 210 in MOMD package 200 is a high-performance die and each VMD 212 in MOMD package 200 is a non-high-performance die. For example, in one embodiment MOMD package 200 includes (a) a high-performance FPGA die and a high-performance GPU die, each mounted horizontally as HMDs 210, and (b) a number of other dies, e.g., non-high-performance dies, mounted horizontally as VMDs 212. There is no requirement that the VMDs be non-high-performance dies; for example, one or more VMDs 212 may be a high-performance die. As shown in FIG. 5, the horizontally-extending die mount base 204 may include vertically-extending VMD slots 220, alignment structures 222, HMD contacts 224, VMD contact(s) 226, metal interconnect elements 228, wire bond pads 230, and/or any other suitable structures or features. Each vertically-extending VMD slot 220 may be shaped and sized to receive at least a portion of a respective VMD 212 mounted to the horizontally-extending die mount base 204. For example, each respective VMD slot 220 may be shaped and sized to receive a bottom portion 232 of a respective VMD 212, wherein the bottom portion 232 is the portion of the VMD 212 arranged to fit within the respective VMD slot 220. As used herein, a VMD slot 220 may comprise any slot, groove, recess, via, or opening configured to receive at least a portion of a VMD 212 mounted to an MOMD package 200. In some embodiments, VMD slots 220 may be deeper, in a vertical direction, than possible variations in the length of the VMD bottom portion 232, in the vertical direction, e.g., due to dicing variation. The number of VMD slots 220, and thus the number or VMDs 212 mounted to an MOMD package 200, may be limited only by the overall size of MOMD package 200.

In some embodiments, reclaim or test-wafer grade silicon may be used for the die mount base 204, to reduce costs. In some embodiments, copper interconnect may be used for metal interconnect elements 228 formed in the die mount base 204.

Figure 6A:
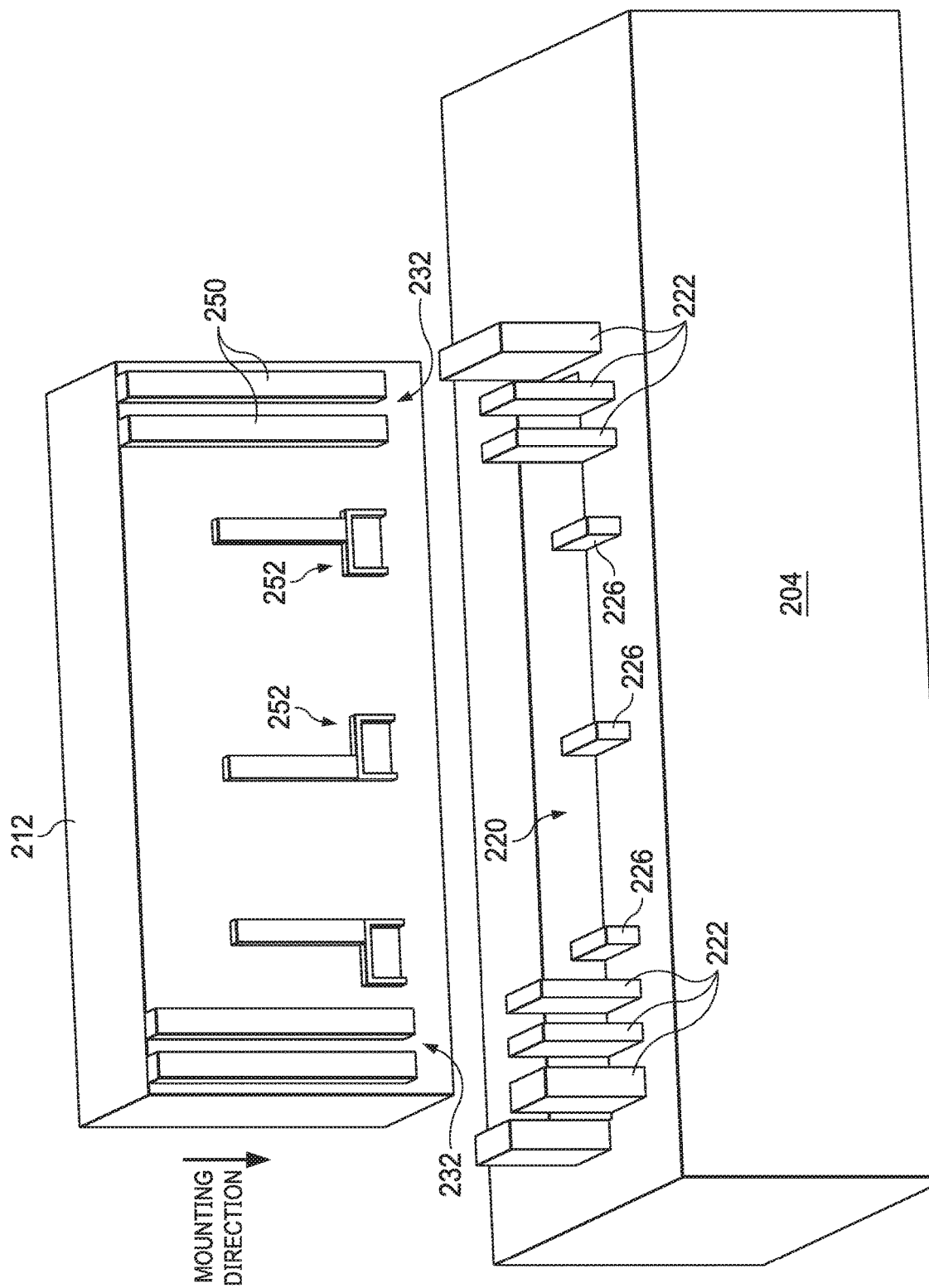

Alignment structures 222 include any structures configured to (a) align and/or guide a mounting process of a VMD 212, e.g., to align and guide an insertion of a VMD 212 into a respective vertically-extending VMD slot 220, and/or (b) provide structural support to an inserted/mounted VMD 212, and/or (c) provide heat transfer functionality for an inserted/mounted VMD 212. Alignment structures 222 may include or define plates, rails, pins, channels, slots, grooves, holes, or any other protrusions or recesses. For example, alignment structures 222 may include physical structures that protrude from a surface of the die mount base 204, e.g., structures protruding upwards from an upper or top surface of die mount base 204 (wherein this upper or top surface of die mount base 204 may be parallel to the major plane of the package substrate 206), or structures protruding laterally from a lateral sidewall of a vertically-extending VMD slot 220. In some embodiments, alignment structures 222 may be configured to interact with corresponding alignment structures provided on a VMD 212 to align and/or guide a mounting of the VMD 212 to the die mount base 204, e.g., as shown in FIGS. 6A-6C discussed below. Alignment structures 222 may be formed from any suitable material, for example, a polymer (e.g., polyimide) or other elastic or pliable material. In some embodiments, alignment structures 222 may be soft and/or sacrificial (e.g., a soft, sacrificial polymer) to help align corresponding alignment structures provided on the VMD 212 (e.g., alignment bars or rails) without damaging the die circuitry of the VMD 212.

HMD contacts 224 may include any structures configured to create a conductive contact between a mounted HMD 210 and a conductive element provided in or on the die mount base 204 (e.g., a metal interconnect element 228 or surface trace formed on die mount base 204). Similarly, VMD contacts 226 may include any structures configured to create a conductive contact between a mounted VMD 212 and a conductive element provided in or on the die mount base 204 (e.g., a metal interconnect element 228 or surface trace formed on die mount base 204). Example HMD contacts 224 and VMD contacts 226 include contact pads, contact pins/holes, and solder balls.

Metal interconnect elements 228 may include any conductive lines or other elements for conductively connecting one or more dies 202 to each other, to wire bond pads 230, and/or to other conductive structures formed in, or on, the die mount base 204 or the package substrate 206 (e.g., TSVs formed in the package substrate 206). In some embodiments, metal interconnect elements 228 provide the structure and function of one or more metal layers typically formed internal to a die 202 (HMD 210 or VMD 212) mounted to the die mount base 204 (e.g., one or more metal layers typically formed in an FGPA or other high-performance die), such that these layers may not need to be formed during the manufacturing of the respective die 202. Thus, the number of metal layers formed in at least one die 202 (e.g., an FPGA) during manufacturing may be reduced (i.e., replaced by the metal interconnect elements 228), which may provide a significant cost savings.

In some embodiments, at least one integrated inductor may be constructed from selected metal interconnect elements 228. Each integrated inductor may have a core magnetic field (B field) extending parallel to each mounted VMD 212, to thereby reduce eddy current loss of each respective integrated inductor. A detailed description of various example configurations of such integrated inductors is provided below with respect to FIGS. 14-18B.

As noted above and shown in FIG. 4, metal interconnect elements 228 may be connected to wire bond pads 230 on the die mount base 204, which may be wire bonded to corresponding wire bond pads 240 formed on the package substrate 206, which in turn may be connected to TSVs or other conductive lines 242 passing vertically through the package substrate 206, to thereby provide conductive paths between dies 202 mounted on MOMD package 200 and a PCB to which the MOMD package 200 is mounted.

FIGS. 6A-6C illustrate an example process of mounting an example VMD 212 in a vertical orientation with respect to an example die mount base 204, according to one example embodiment. In some embodiments, the VMD mounting process may be aligned and/or guided by alignment structures 222 provided on the die mount base 204, which may interact with one or more structures of the VMD 212. In some embodiments, e.g., as shown in FIGS. 6A-6C, the VMD 212 may include alignment structures 250 configured to interact with alignment structures 222 provided on the die mount base 204 to align and/or guide the mounting of VMD 212, e.g., to align and guide a bottom portion 232 of VMD 212 (see FIG. 5A) into VMD slot 220 formed in the die mount base 204.

Like alignment structures 222, alignment structures 250 of VMD 212 may include or define plates, rails, pins, channels, slots, grooves, holes, or any other protrusions or recesses. For example, alignment structures 250 may include protrusions configured to be received or guided within corresponding slots, channels, grooves, or other recesses defined by alignment structures 222 of the die mount base 204; alternatively, alignment structures 222 of the die mount base 204 may include protrusions configured to be received or guided within corresponding slots, channels, grooves, or other recesses defined by alignment structures 250 of VMD 212. In the particular example shown in FIGS. 6A-6C, alignment structures 222 and alignment structures 250 each include guide plates or rails that define slots or channels configured to receive or guide the guide plates or rails of the other component (i.e., VMD 212 or die mount base 204). For example, as shown in FIGS. 6B and 6C, alignment structures 250 of VMD include pairs of guide rails that define a slot between each pair of guide rails, wherein the slot defined by each pairs of guide rails 250 is configured to receive and guide a corresponding guide plate 222 protruding from the top of the die mount base 204. In some embodiments, alignment structures 222 and/or alignment structures 250 (e.g., rails or bars) may allow for both physical alignment and optical alignment of the VMD 212 to the die mount base 204.

VMD 212 may include contacts 252 configured to engage with VMD contacts 226 to provide conductive connections between VMD 212 and die mount base 204. In the illustrated example, contacts 252 have a U-shaped or cup-shaped design configured to receive VMD contacts 226 to ensure an effective connection.

As shown in FIGS. 6A and 6B, the VMD 212 may be moved toward the die mount base 204 in the indicated mounting direction, into a position in which alignment structures 250 and engaged with alignment structures 222 for aligning or guiding the further movement of VMD toward the die mount base 204. As shown, the respective structures may be designed such that the alignment structures 250 make contact with the alignment structures 222 before the conductive contacts 252 come into contact with the VMD contacts 226, e.g., to prevent damage of the respective contacts.

As shown in FIGS. 6B and 6C, the VMD 212 may be moved further in the mounting direction, aligned or guided by alignment structures 250 and 222, until a bottom portion 232 of VMD 212 is received in the VMD slot 220 in the die mount base 204, and further until contacts 252 provided on VMD 212 engage with VMD contacts 226 provided on die mount base 204. The connections between contacts 252 and VMD contacts 226 may be soldered. In some embodiments, VMD contacts 226 (or contacts 252) may be pre-coated with solder material, such that after mounting the VMD 212 as shown in FIGS. 6A-6C, a heating process may be performed to solder contacts 252 to VMD contacts 226 (thereby soldering the VMD 212 to die mount base 204).

Figure 7A:
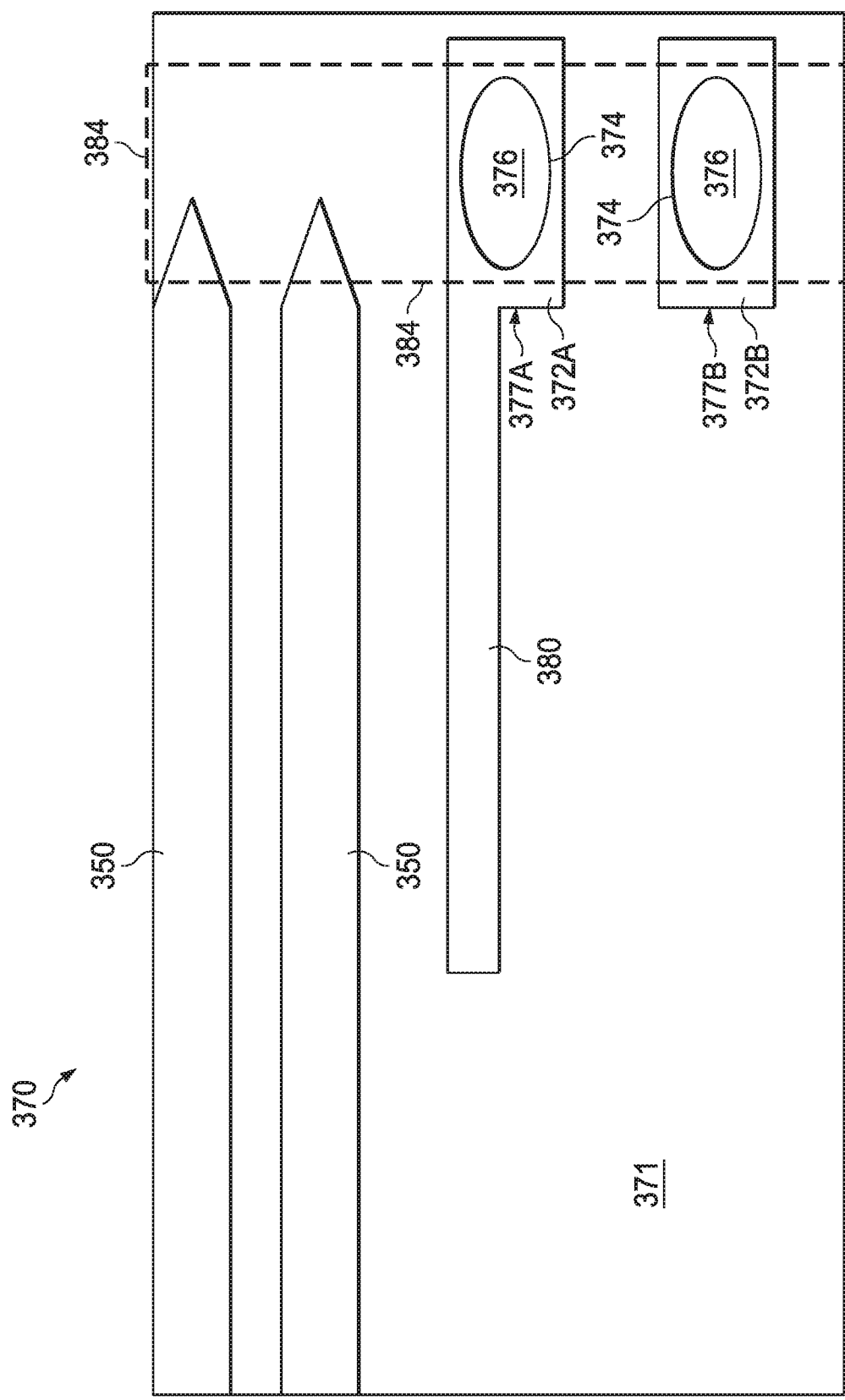
FIGS. 7A-7G are a series of side views illustrating an example process of forming an example VMD and mounting the VMD to a MOMD die mount base, according to one example embodiment.
Figure 7B:
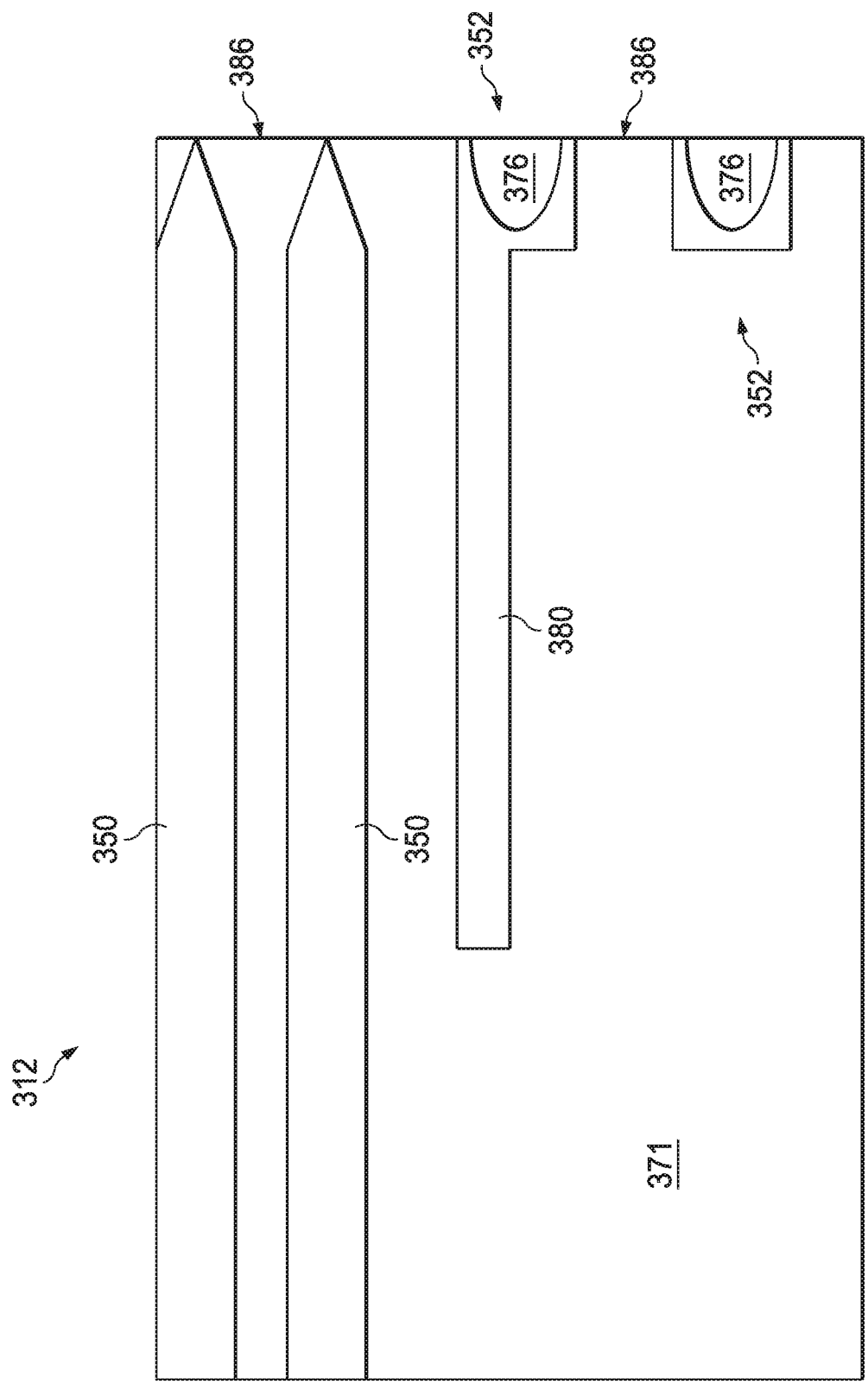

FIGS. 7A-7G are a series of side views illustrating an example process of forming an example VMD and mounting the example VMD to a die mount base 304, from a side view perspective, according to one example embodiment. FIG. 7A illustrates a VMD structure 370 prior to a die cut process (e.g., laser scribe or saw dicing), FIG. 7B illustrates the VMD structure 370 after the die cut process, thereby defining a VMD 312, and FIGS. 7C-7G illustrate a process of the VMD 312 being mounted to a die mount base 304.

Referring first to FIG. 7A, a VMD structure 370 is formed with a pair of alignment guide plates or rails 350 and a pair of contact structures 372A, 372B projecting outwardly from an outer front surface 371 of VMD structure 370 (e.g., similar to alignment structures 250 and contacts 260 projecting from front surface of VMD 212 shown in FIGS. 6A-6C). In some embodiments, alignment guide plates/rails 350 may be positioned relative to a scribe region/scribe line, indicated at 384, such that a cutting of the VMD structure 370 with the scribe region 384 (wherein the width of the cut is smaller than the scribe region 384, and thus removes only a portion of the scribe region 384) a tapered or angled end region of each alignment guide plate/rail 350 may coincide with a leading edge 386 of the resulting VMD 312, e.g., as shown in FIG. 7B.

Figure 7C:
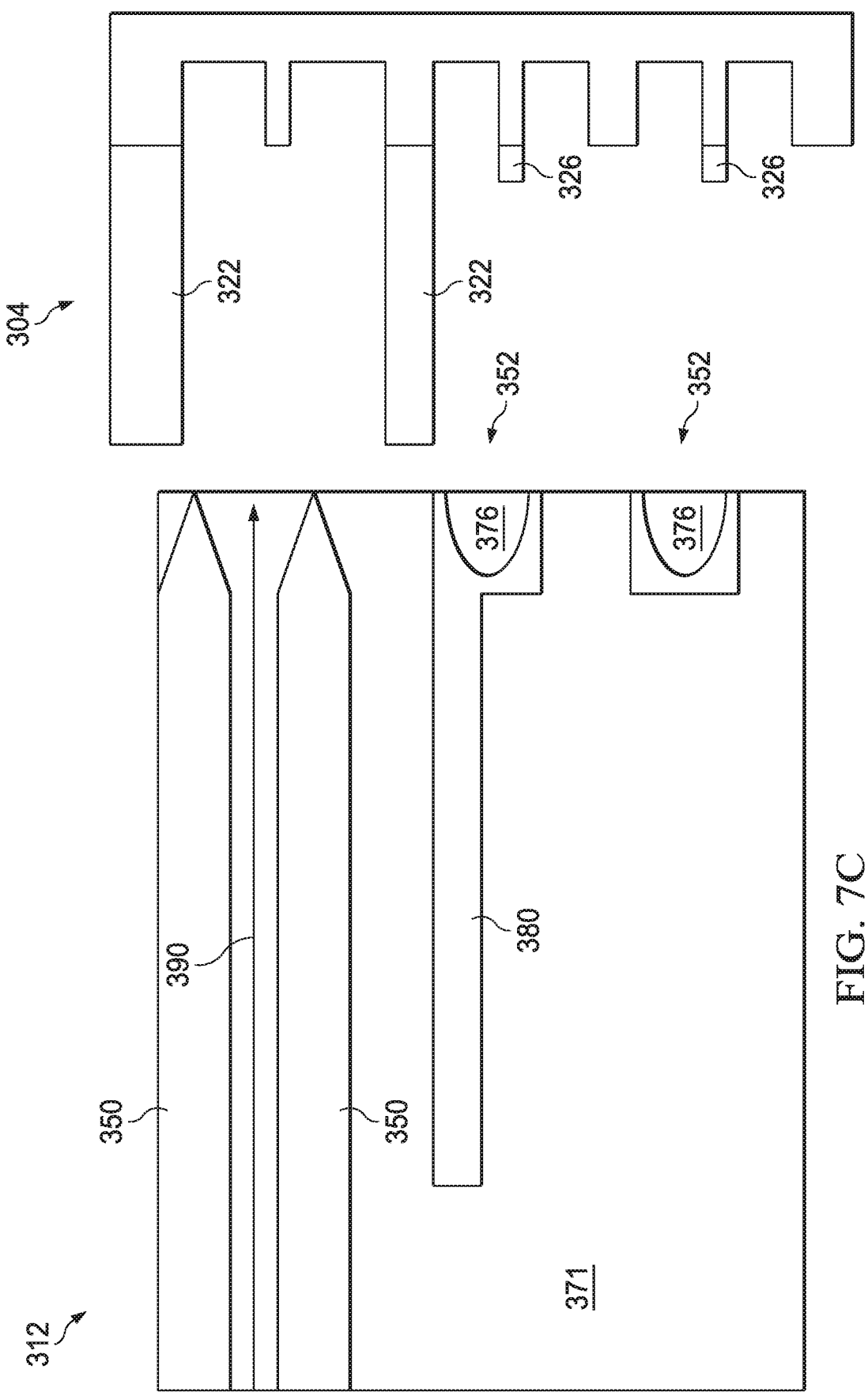
Figure 7D:
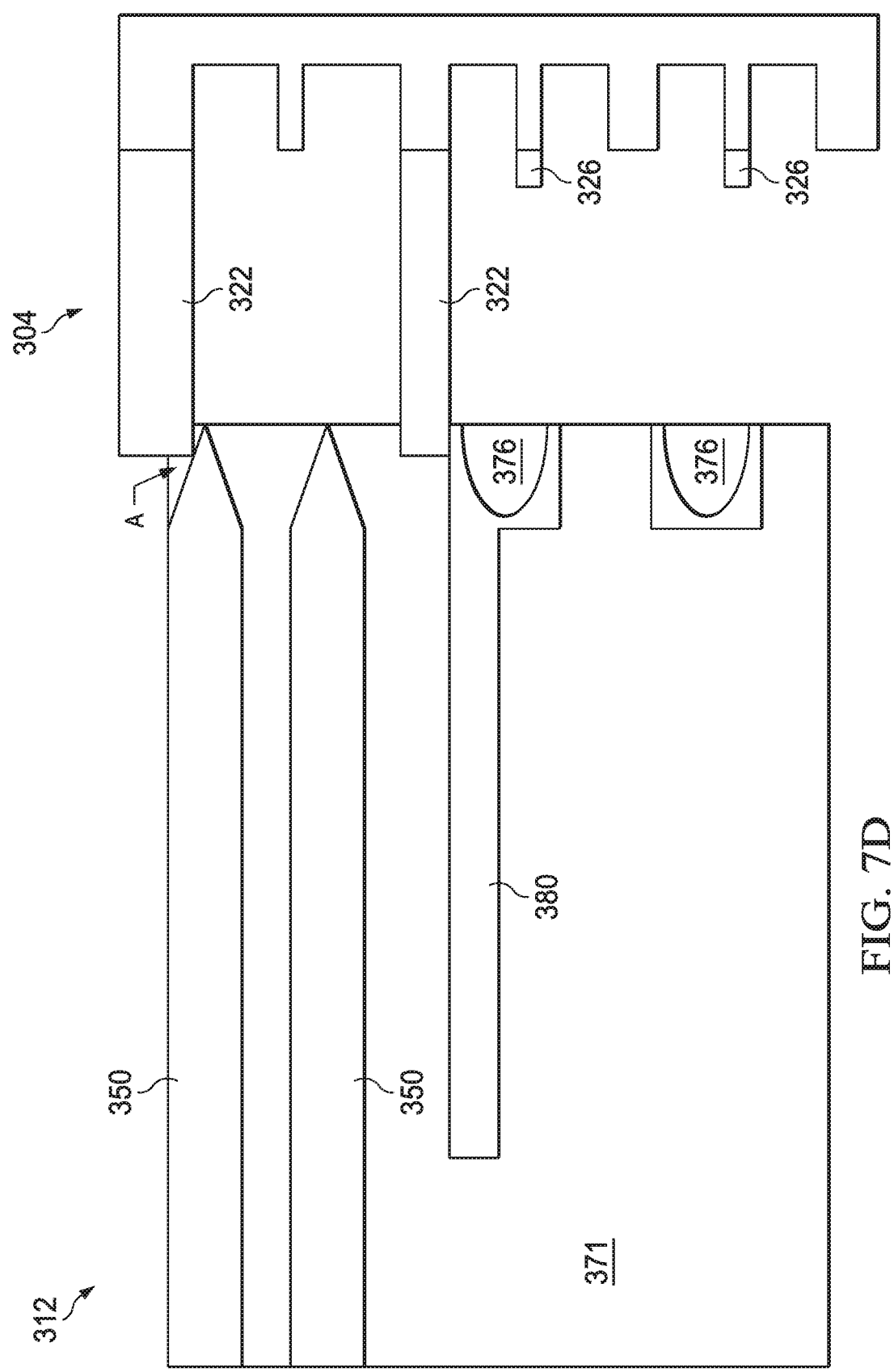
Figure 7E:
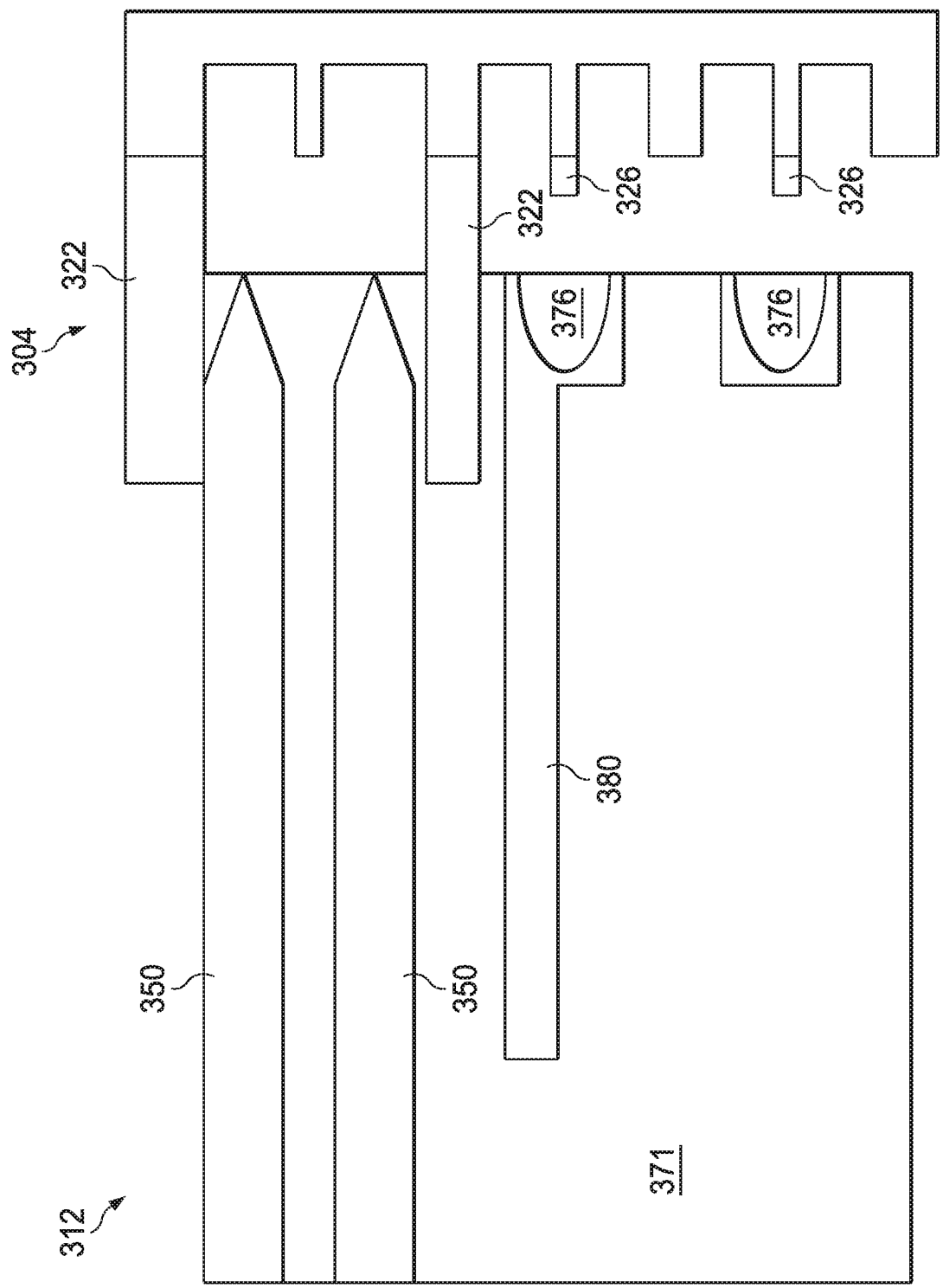
Figure 7F:
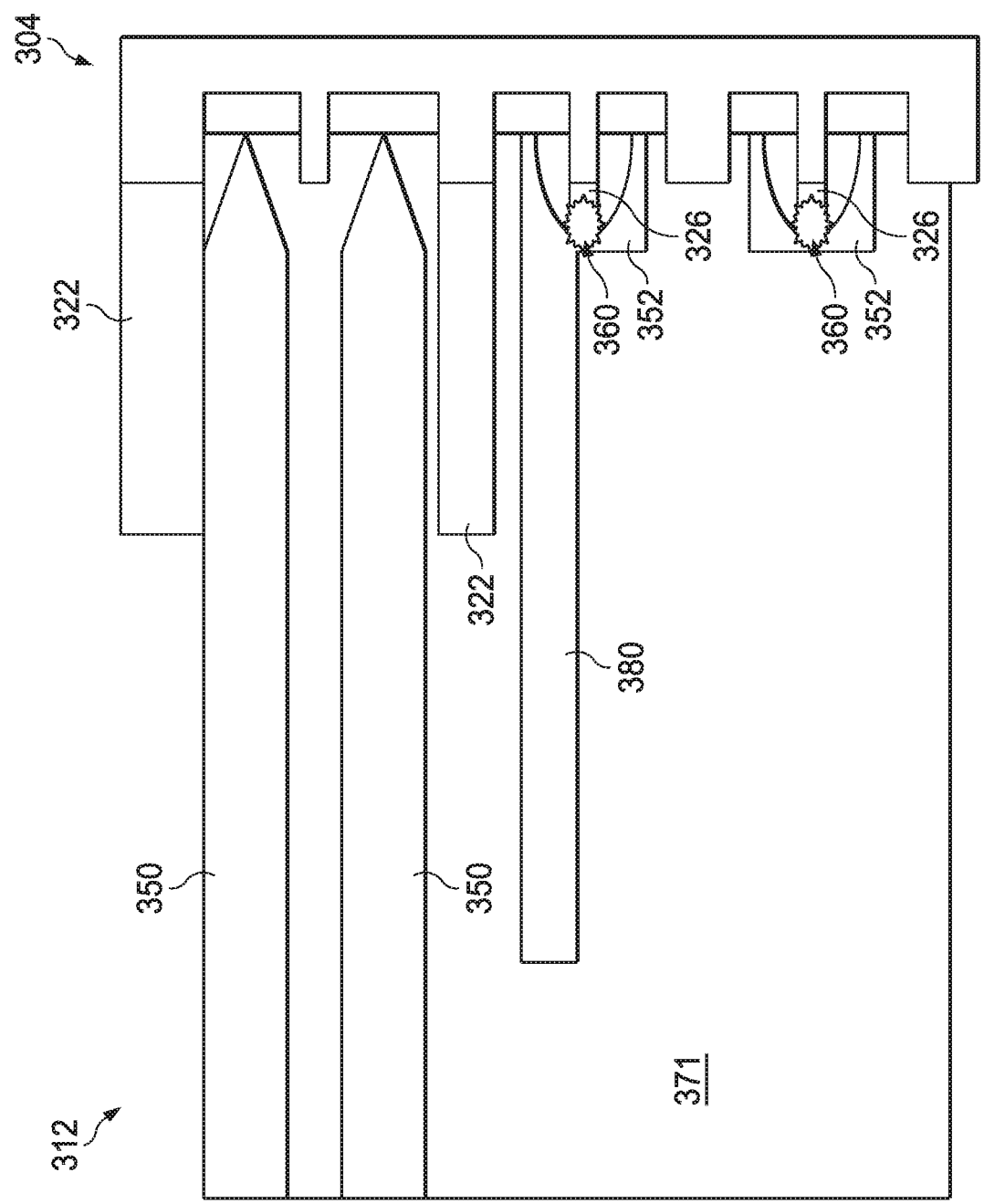
Figure 7G:
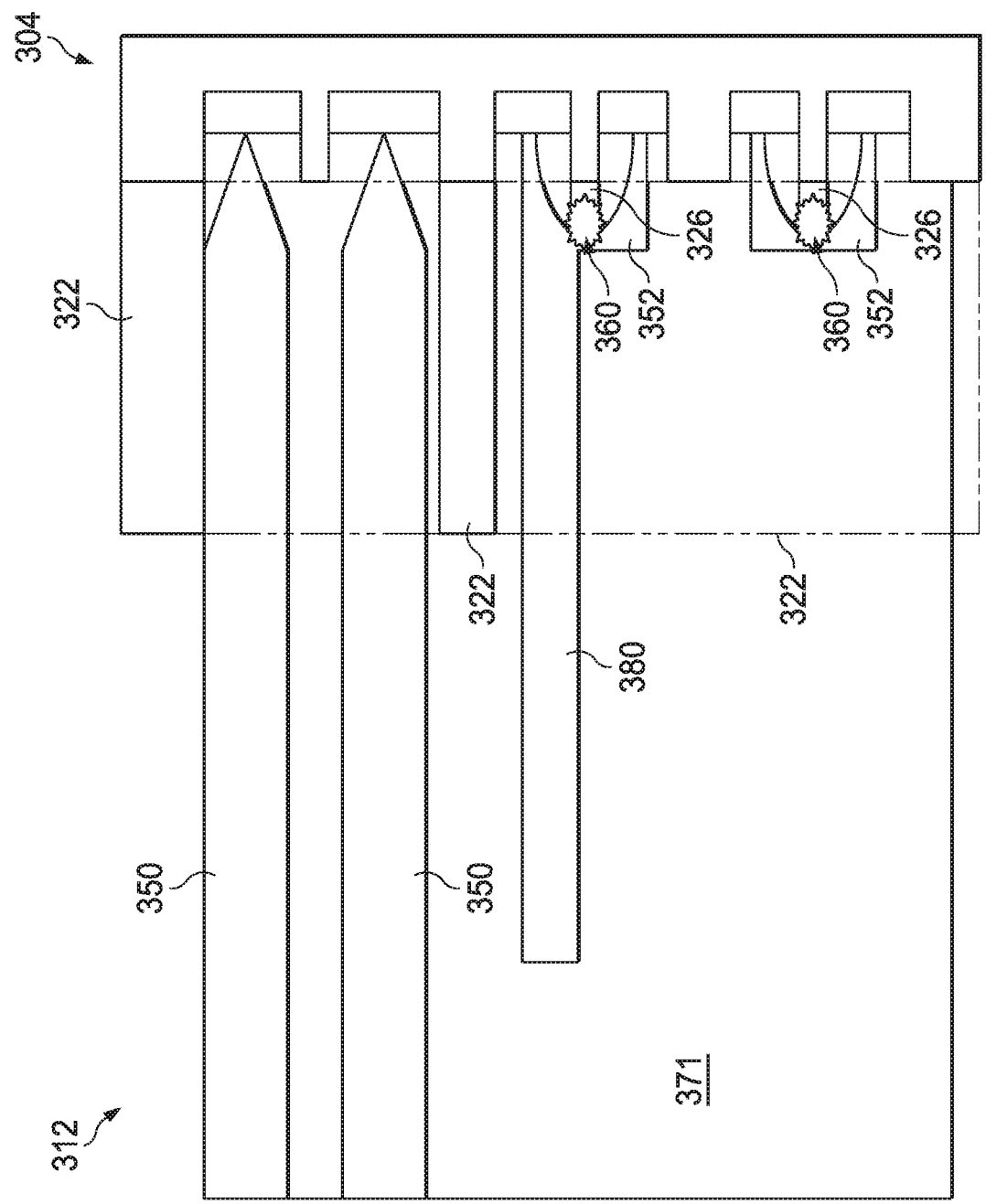

Contact structures 372A and 372B may be connected to wiring or other conductive elements of the VMD structure 370, and may be configured to engage with corresponding VMD contacts provided on a die mount base 304 of a MOMD package, e.g., as shown in FIGS. 7F-7G discussed below. In the example shown in FIG. 7A, contact structure 372A is connected to a wire 380 formed on the outer side of the VMD structure 370, while contact 372B may be connected to wiring formed within the interior of VMD structure 370 (and thus hidden from the side view of FIG. 7A). Contact structures 372A and 372B may be formed from any suitable conductive material, e.g., aluminum, copper, or tungsten. As shown, a recess 374 may be formed in each contact structure 372A and 372B in a direction extending into the page, and terminating at a bottom surface 376 recessed (in the direction extending into the page) from the surrounding front surfaces 377A and 377B of contact structures 372A and 372B. In some embodiments, the exposed bottom surfaces 376 may represent a lower topography layer of VMD structure 370, i.e., in the direction extending into the page, as compared with guide rails 350, wire 380.

In some embodiments, contact structures 372A and 372B may be formed at a position relative to the scribe region/scribe line 384 such that after the VMD structure 370 is cut through the scribe region 384, a leading end portion of each contact structure 372A and 372B forms a respective contact 352 having a U-shape, cup-shape, or arched shaped that opens at the leading edge 386 of the resulting VMD 312, e.g., as shown in FIG. 7B. The open-ended U-shape, cup-shape, or arched shaped of each contact 352A, 352B may be configured to receive a corresponding VMD contact upon mounting the VMD 312 to a die mounting structure 304, e.g., as shown in FIGS. 7F-7G discussed below.

As noted above, FIGS. 7C-7G show a process of mounting of the VMD 312 to an example die mount base 304. As shown in FIG. 7C, the die mount base 304 may include alignment structures 322, which may be formed from polyimide, another polymer material, or any other suitable material. Alignment structures 322 are configured to interact with alignment structures 350 on VMD 312, to align and guide the mounting of VMD 312 to die mount base 304. A space between adjacent alignment structures 350 may define an optical alignment channel 390 for visually or optically aligning the mounting of VMD 312, e.g., by visually or optically identifying specific structures of die mount base 304 through the optical alignment channel 390.

Die mount base 304 may include VMD contacts 326 configured to engage with the contacts 352 on VMD 312, to provide conductive coupling between VMD 312 and die mount base 304, e.g., for electrical communications between VMD 312 and a PCB to which the MOMD package including VMD 312 and die mount base 304 is mounted.

As shown in FIG. 7D, as the VMD 312 approaches the die mount base 304, interaction(s) between alignment structures 350 and 322 may physically align VMD 312 relative to die mount base 304, as indicated at area "A." FIG. 7E shows VMD 312 further advanced toward die mount base 304, with alignment structures 350 aligned between alignment structures 322.

As shown in FIG. 7F, VMD 312 may continue to be advanced, until contact 352 physically engage with VMD contacts 326, to define conductive connections between VMD 312 and die mount base 304. The connection between contacts 352 and VMD contacts 326 may then be soldered, as indicated at 360. In some embodiments, VMD contacts 326 (and/or contacts 352) may be pre-coated with solder material, such that after mounting the VMD 312 as shown in FIGS. 6C-6F, a heating process may be performed to solder contacts 352 to VMD contacts 326 (thereby soldering the VMD 312 to die mount base 304). As shown, the leading edge of VMD 312 may be separated (or "floating") from the bottom surface of the die mount base 304, such that the solder contact between solder contacts 352 and VMD contacts 326 is the only point of contact to ensure proper contact (e.g., accounting for manufacturing variations) and alignment of VMD 312.

In some embodiments, alignment structures 322 provided on the die mount base 304 may defined a recess in which a leading portion of the VMD 312 is received during the mounting of the VMD 312, such that the leading portion of the mounted VMD 312 is surrounded or partially surrounded by the alignment structures 322. FIG. 7G shows one example of such configuration, in which polymer alignment structures 322 surround the perimeter of the leading end of the mounted VMD 312.

Figure 8:
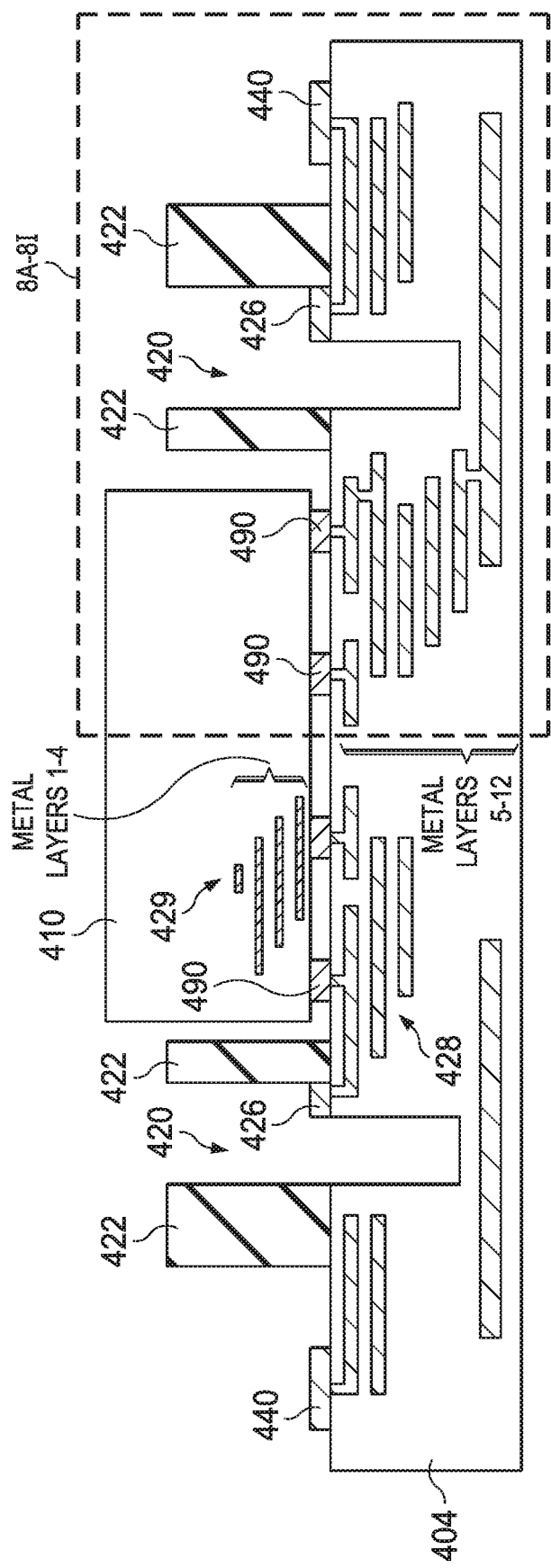
FIG. 8 illustrates a cross-section of an example die mount base of an example MOMD package, after mounting a horizontally-mounted die (HMD) but before mounting a pair of vertically-mounted dies (VMDs) to the die mount base, according to one example embodiment of the present disclosure.

FIG. 8 illustrates a cross-section of an example horizontally-extending die mount base 404 of an example MOMD package, after mounting a HMD 410 but before mounting a pair of VMDs (not shown) to the horizontally-extending die mount base 404, according to one example embodiment of the present disclosure. As shown, the horizontally-extending die mount base 404 may include vertically-extending VMD slots 420 for receiving portions of respective VMDs, and alignment structures 422 (e.g., polyimide structures) for aligning or guiding the mounting of VMDs in which (a) the VMDs are partially inserted into vertically-extending VMD slots 420 and (b) contacts on the VMDs are soldered to VMD contact pads 426 (e.g., aluminum-solder bond pads). VMD contact pads 426 may be arranged with any suitable pattern and density. In some embodiments, with micro-alignment and pad-level redistribution, VMD contact pads 426 may be provided at a density of 100 s/mm or even 1000 s/mm.

The HMD 410, e.g., a high performance FPGA, GPU, or logic chip, may be solder mounted to contact pads 490 (e.g., aluminum-solder flat micro pads) provided on the die mount base 404. The die mount base 404 may include metal interconnect elements 428 that connect HMD 410 to other die(s) (e.g., VMD(s) and/or other HMD(s) mounted on the die mount base 404) and/or to other elements formed in the die mount base 404. The metal interconnect elements 428 may provide the structure and function of one or more metal layers typically formed internal to HMD 410 (e.g., one or more metal layers typically formed in a high-performance FGPA, GPU, or logic chip), such that these layers may be omitted from the manufacturing of the HMD 410. Thus, the number of metal layers formed in HMD 410 during manufacturing may be reduced (replaced by the metal interconnect elements 428), which may provide a significant cost savings.

In the illustrated example, HMD 410 is a type of die (e.g., FPGA) that utilizes 12 metal layers, conventionally manufactured as integral structures in the die. However, in the illustrated embodiment, metal interconnect elements 428 provide the functionality of metal layers 5-12 of the 12 metal layers utilized by HMD 410, and thus only metal layers 1-4, indicated at 429, are formed within HMD 410. It may be significantly less expensive to form metal layers in the die mount base 404 as opposed to manufacturing such metal layers within HMD 410. Thus, by forming a portion of the metal layers of HMD 410 as metal interconnect elements 428 in the die mount base 404 (in this example, metal layers 5-12 of the 12 metal layers utilized by the HMD 410), the overall cost of the MOMD package may be significantly reduced.

The die mount base 404 may also include wire bond pads 440 for wire bonding the die mount base 404 to wire bond pads on a package substrate to which the die mount base 404 is mounted.

Figure 9A:
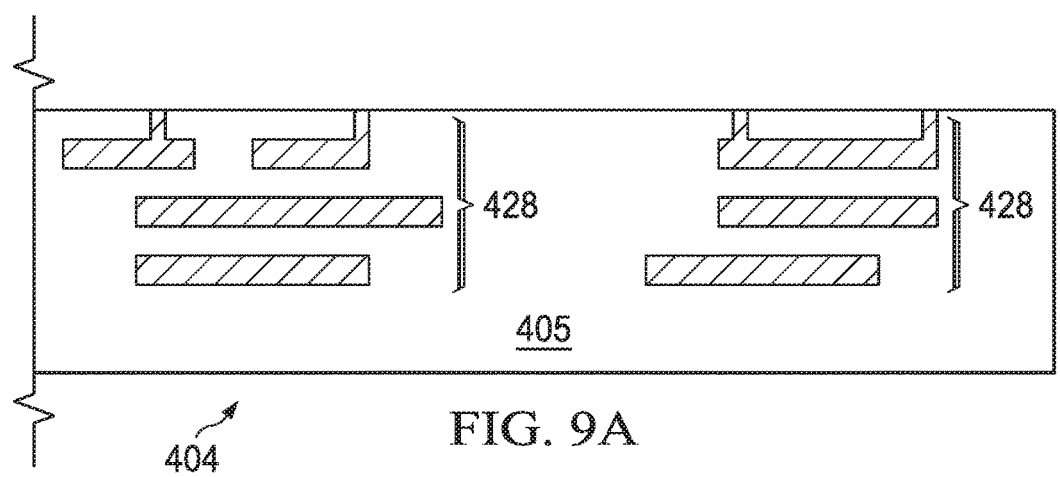
FIGS. 9A-9I are a series of cross-sectional views illustrating an example process for forming the MOMD die mount base shown in FIG. 8, according to one example embodiment.

FIGS. 9A-9I are a series of cross-sectional views illustrating an example process for forming the MOMD die mount base 404 shown in FIG. 8, according to one example embodiment. In particular, FIGS. 9A-9I are focused on the portion of the die mount base 404 indicated in FIG. 8 by the dashed boundary 9A-9I. As shown in FIG. 9A, a pattern of metal interconnects 428 may be formed in a substrate 405, e.g., using any processing techniques known in the art. Substrate 405 may be formed from any suitable material or materials, including semiconductor material(s), e.g., silicon, or non-semiconductor material(s), e.g., quartz.

Metal interconnect elements 428 may (a) provide metal routing for interconnecting multiple dies subsequently mounted to the die mount base 404 (e.g., one or more HMDs and/or one or more VMDs), and/or (b) provide at least a portion of the routing or functionality of metal layer(s) conventionally manufactured integrally within one or more dies, e.g., as discussed above regarding metal layer 5-12 shown in FIG. 8.

In some embodiments, at least one integrated inductor may be constructed from selected metal interconnect elements 428. Each integrated inductor may have a core magnetic field (B field) extending parallel to each mounted VMD 412, to thereby reduce eddy current loss of each respective integrated inductor. A detailed description of various example configurations of such integrated inductors is provided below with respect to FIGS. 14-18B.

In some embodiments, substrate 405 may comprise an inexpensive reclaim silicon substrate or non-electrical grade wafer, which may reduce the total cost of the die mount base 404. Interconnects 428 may be formed from metal (e.g., copper, aluminum, or tungsten) or any other electrically conductive material.

Figure 9B:
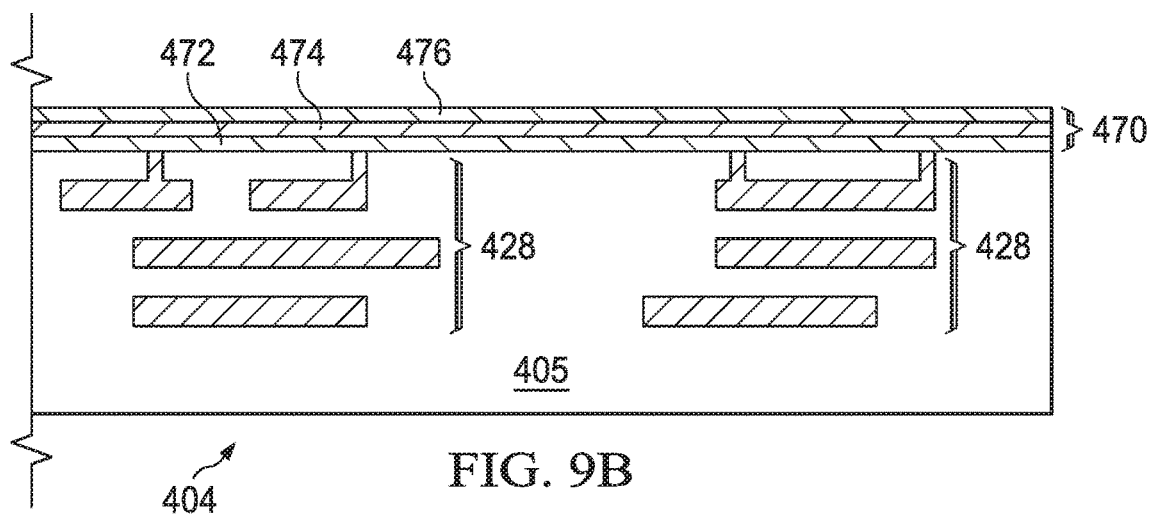

As shown in FIG. 9B, a contact layer stack 470 may be formed, e.g., by depositing a barrier metal layer (e.g., TaN, TiN, or Ta+TaN) 472, depositing an aluminum layer 474, and depositing a solder layer (e.g., tin) 476.

Figure 9C:
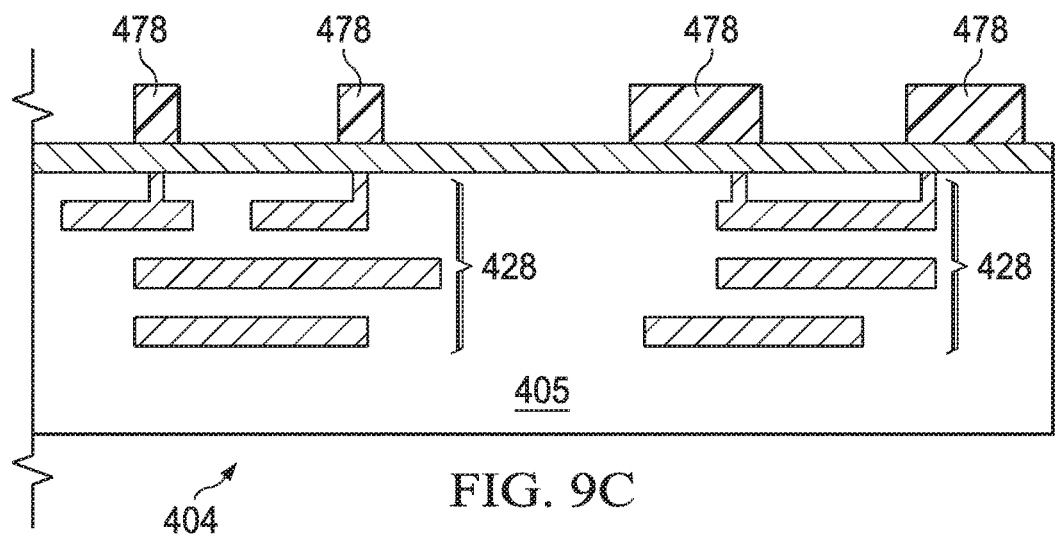

As shown in FIG. 9C, a photomask may be formed and patterned (e.g., using known techniques) to form a plurality of mask regions 478 over a number of areas on the contact layer stack 470 at which contacts are to be formed from the contact layer stack 470 (e.g., one or more HMD contacts 490, VMD contacts 426, and/or wire bond pads 440).

Figure 9D:
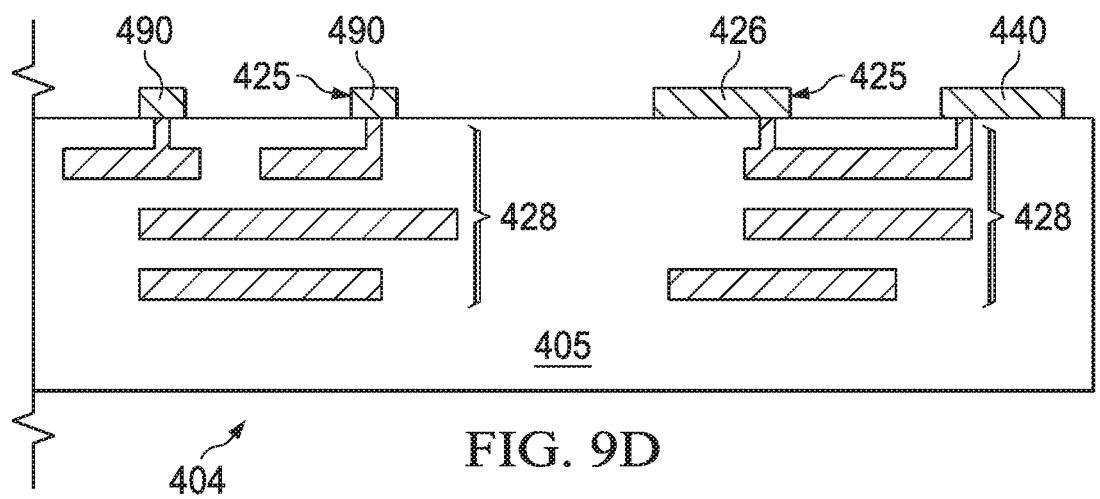

As shown in FIG. 9D, an etch and clean process is performed to remove portions of contact layer stack 470 and then mask regions 478 to define a number of conductive contacts 425, e.g., each contact 425 being an HMD contact 490 (for mounting an HMD thereto), a VMD contact 426 (for mounting a VMD thereto), or a wire bond pad 440 (for wire bonding the electronics of the die mount base 404 to an underlying package substrate to which the die mount base 404 is subsequently mounted). As shown, each conductive contact 425 contacts a selected metal interconnect 428. Each conductive contact 425 may be formed from any suitable conductive material. In one embodiments, each conductive contact 425 comprises an aluminum-solder bond pad.

Figure 9E:
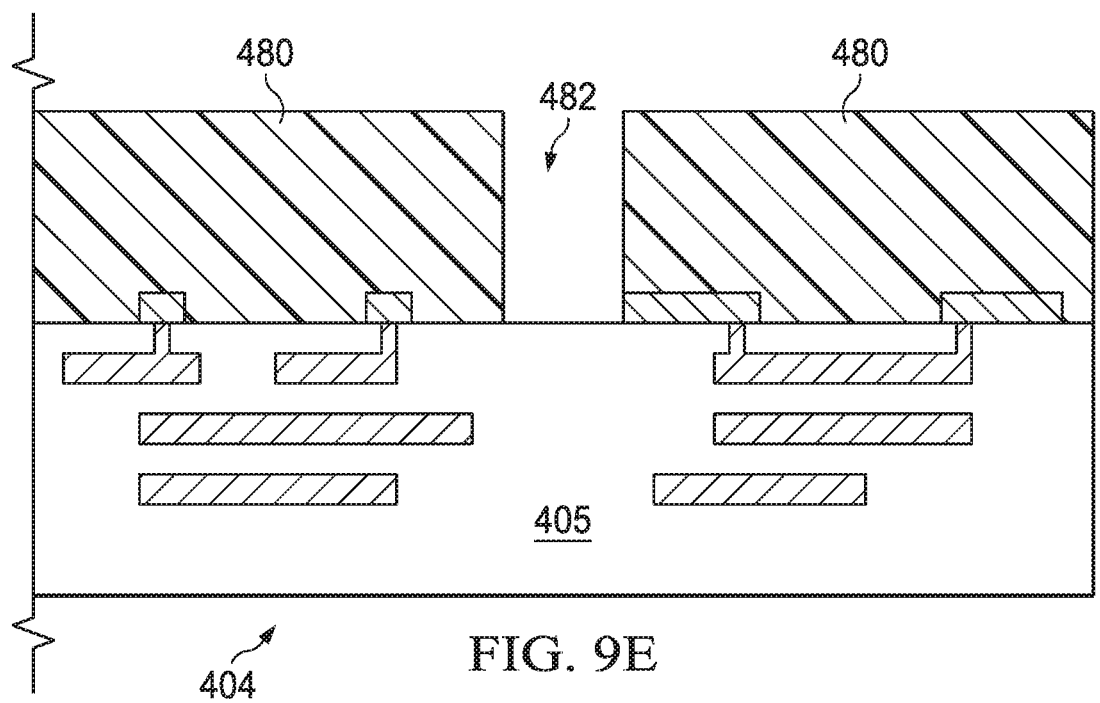

As shown in FIG. 9E, a photomask 480 is formed and patterned to form an opening 482 for etching a VMD slot in the substrate 405 for receiving a VMD mounted to the die mount base 404.

Figure 9F:
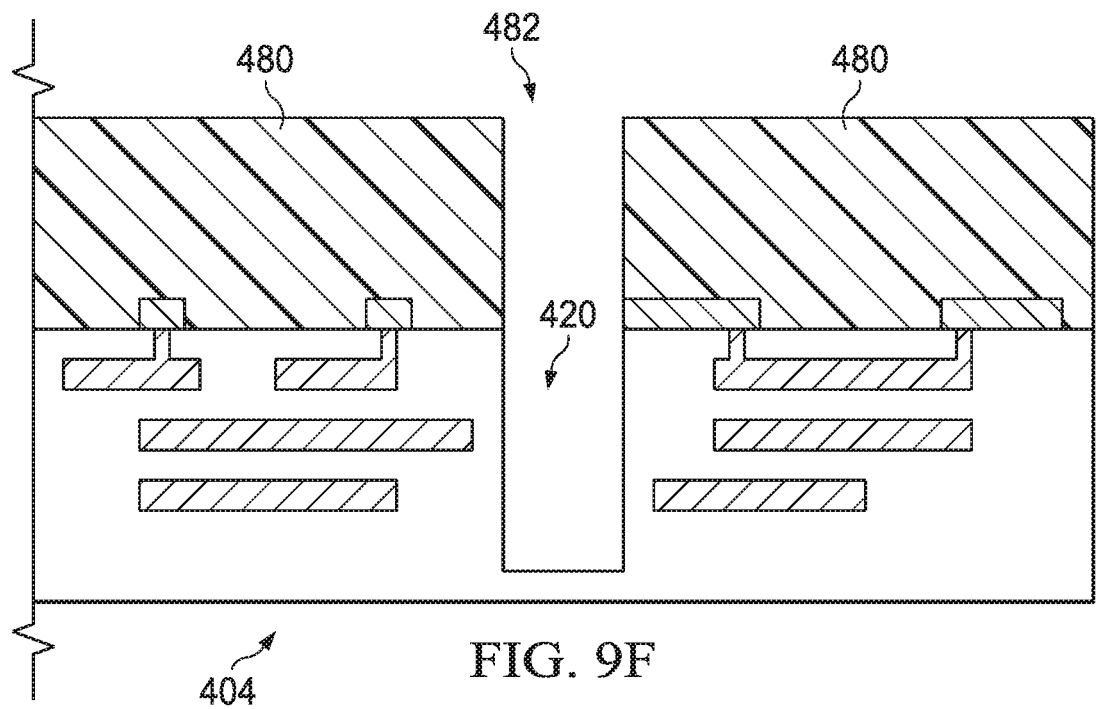
Figure 10:
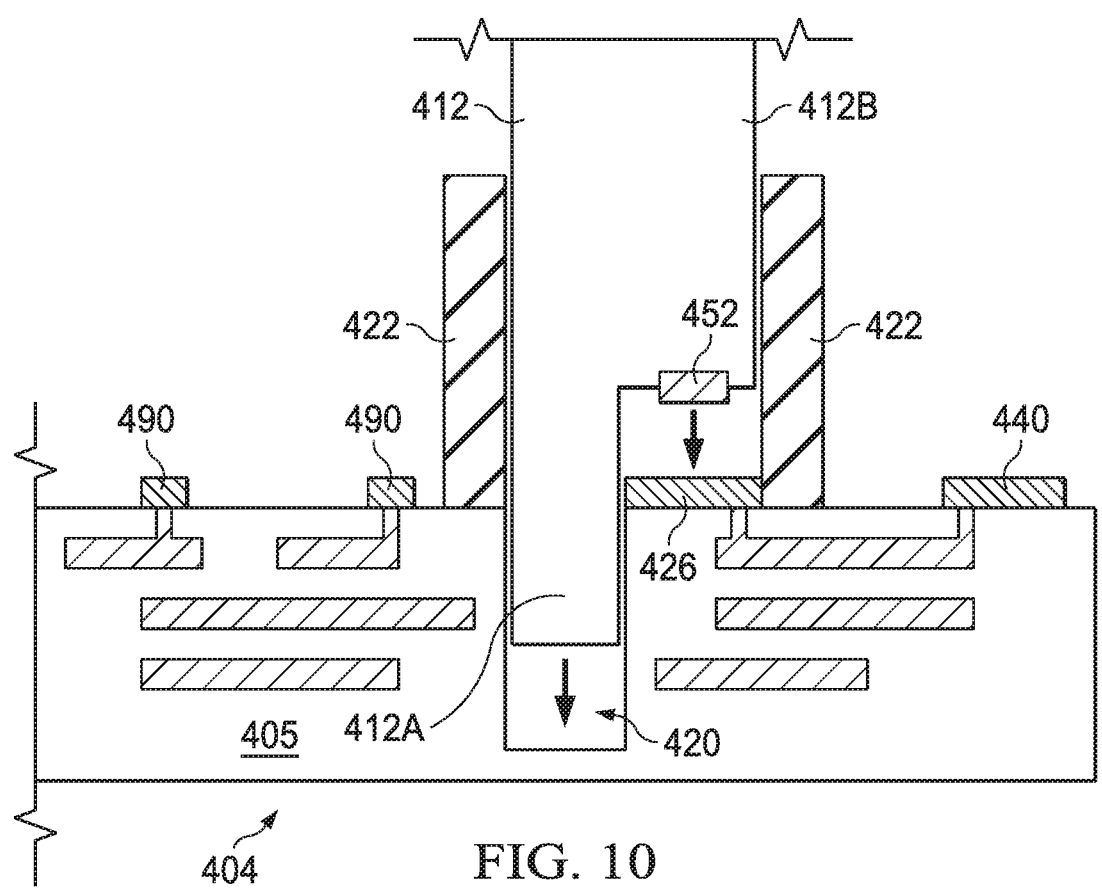
FIG. 10 is a cross-sectional view illustrating a vertical mounting of an example VMD to the example MOMD die mount base shown in FIG. 9I, according to one example embodiment.

As shown in FIG. 9F, an etch is performed through opening 482 to create a vertically-extending VMD slot 420 configured to receive a portion of a VMD mounted to the die mount base 404 (for example, as shown in FIG. 10 discussed below).

Figure 9G:
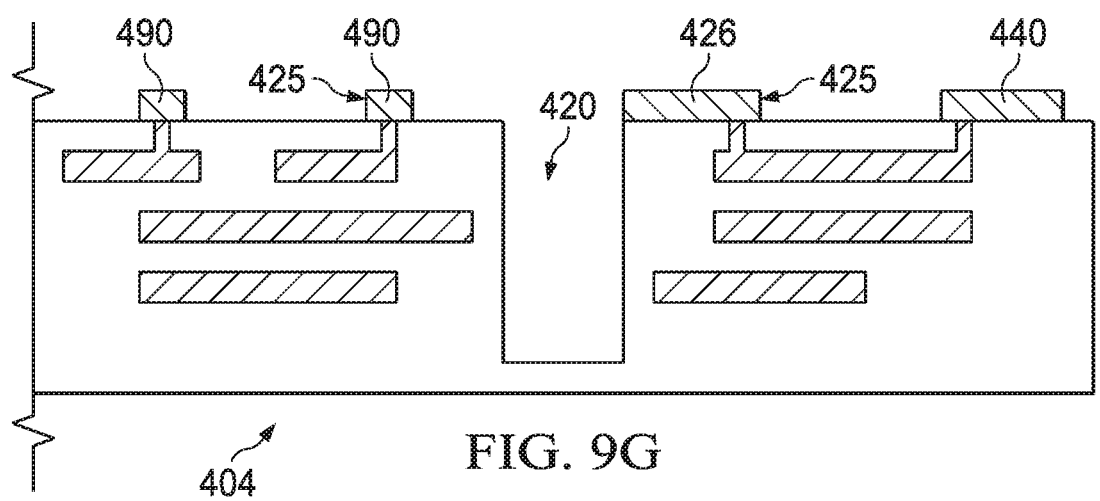

As shown in FIG. 9G, a clean process may be performed to remove remaining portions of photomask 480 from the structure of FIG. 9F now including the VMD slot 420, thus exposing the previously-formed conductive contacts 425, e.g., HMD contact(s) 490, VMD contact(s) 426, and/or wire bond pad(s) 440.

Figure 9H:
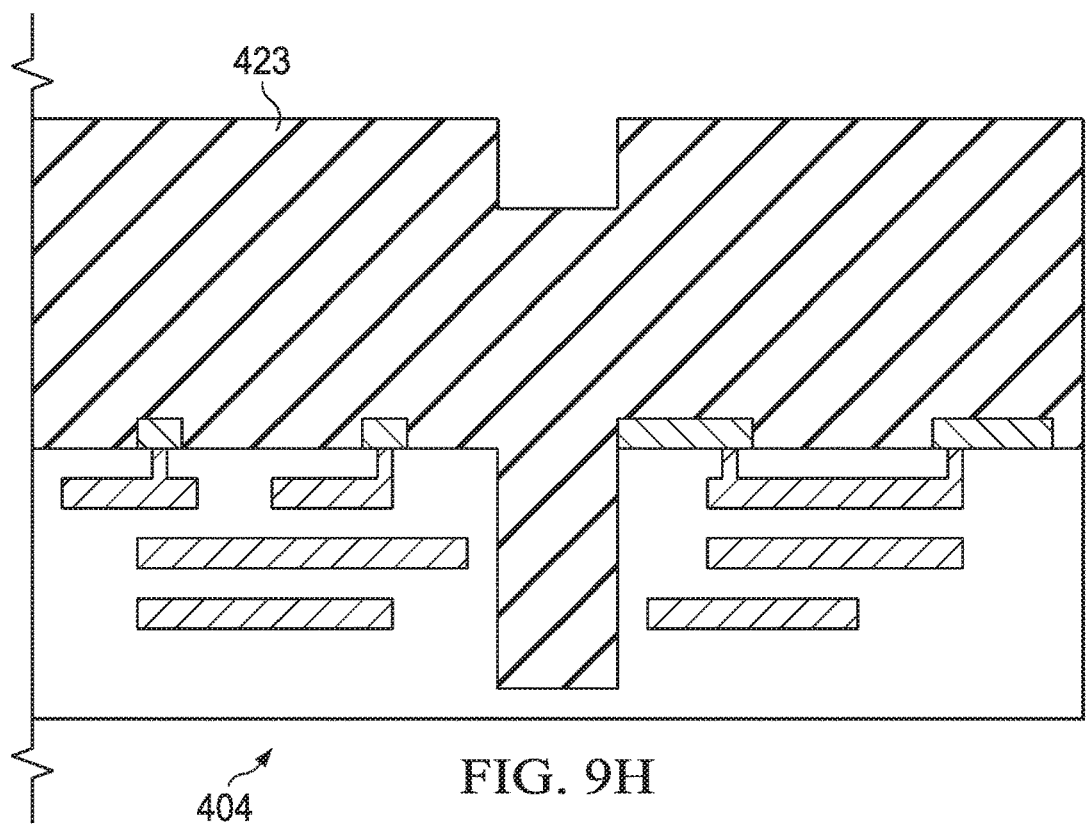

As shown in FIG. 9H, an alignment structure layer 423 is deposited over the structure. Alignment structure layer 423 may comprise any suitable material. For example, alignment structure layer 423 may comprise a flexible or malleable material, e.g., a polyimide material, or alternatively, a rigid material. In some embodiments, alignment structure layer 423 may comprise a photosensitive material, e.g., a photosensitive polyimide, as discussed below regarding FIG. 9I.

Figure 9I:
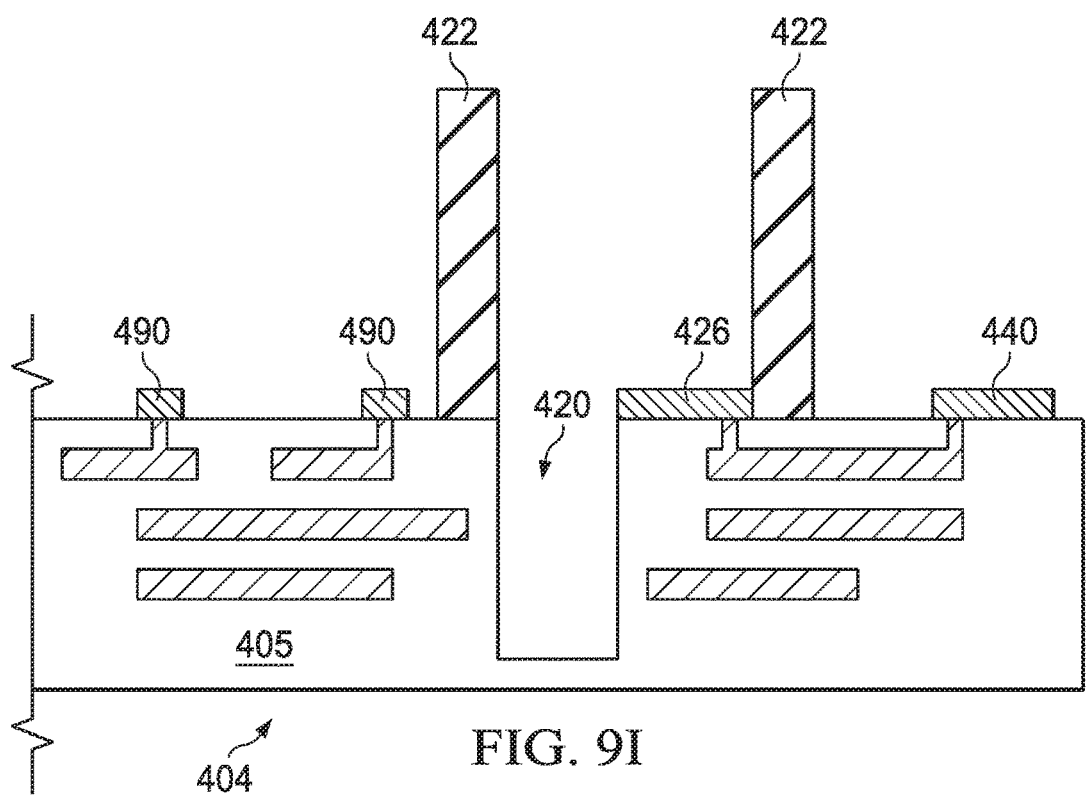

As shown in FIG. 9I, portions of the alignment structure layer 423 of FIG. 9H may be removed to define one or more alignment structures 422. In some embodiments, the portions of alignment structure layer 423 may be removed by etching or using known photolithography techniques. For example, in embodiments in which alignment structure layer 423 comprises a photosensitive material, e.g., a photosensitive polyimide, alignment structure layer 423 may be selectively exposed, developed, and cleaned to define alignment structure(s) 422.

Alignment structure(s) 422 may include any structures configured to (a) align and/or guide a mounting process of a VMD to the die mount base 404 and/or (b) provide structural support to an inserted/mounted VMD, and/or (c) provide heat transfer functionality for an inserted/mounted VMD. For example, the pair of alignment structures 422 shown in FIG. 9I may be configured to align and/or guide the mounting of a VMD in a downward direction between the pair of alignment structures 422. In some embodiments, the alignment structures 422 may guide a leading (bottom) portion of the VMD into the VMD slot 420, as shown in FIG. 10 discussed below.

FIG. 10 is a cross-sectional view illustrating a vertical mounting of an example VMD 412 to the example MOMD die mount base 404 shown in FIG. 9I, according to one example embodiment. The VMD 412 may be positioned between the pair of alignment structures 422 and moved vertically (downwardly in the orientation shown in FIG. 10). The alignment structures 422 may align and guide the vertical insertion of the VMD 412, such that a leading portion 412A of the VMD 412 is guided into the VMD slot 420 formed in the substrate 405. The VMD 412 may be inserted until one or more conductive contacts 452 on VMD 412 engage with corresponding VMD contact(s) 426. In some embodiments, VMD contact(s) 426 and/or contact(s) 452 may be pre-coated with solder material, such that after mounting the VMD 412, a heating process may be performed to solder contacts 452 to VMD contacts 426, thereby soldering the VMD 212 to the die mount base 404.

As discussed above regarding FIGS. 6A and 7A-7B, VMD contacts 426 provided on VMD 412 for conductively connecting the VMD 412 to die mount base 404 of an MOMD package may have a U-shaped, cup-shaped, or arch-shaped design configured to receive a corresponding VMD contact 426 upon mounting the VMD 412 to the die mounting structure 304, e.g., as shown in FIGS. 7A-7G.

Figure 11A:
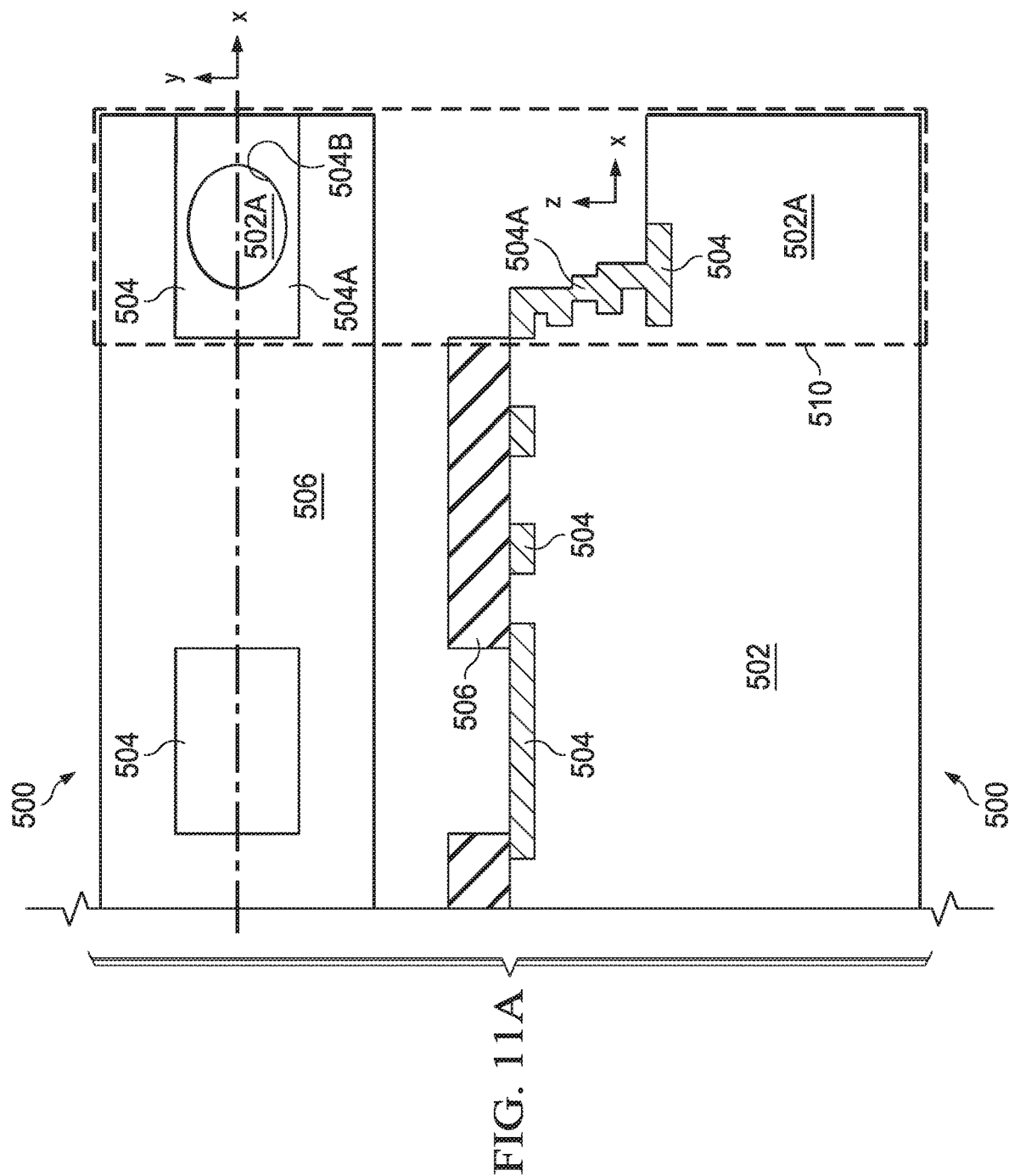

FIGS. 11A-11E illustrate an example process for forming U-shaped, cup-shaped, or arch-shaped contacts on a VMD, according to one example embodiment. FIG. 11A shows a top-down view (top) and a cross-sectional view (bottom) of a section of a VMD die wafer 500. As shown, conductive structures 504 are formed on a VMD body 502. Conductive structures 504 may include including metal lines, interconnects, vias, and/or other conductive structures formed from a conductive metal, e.g., copper or aluminum.

A leading end portion 502A of the VMD body 502 may have a reduced dimension in at least one direction (e.g., the z-direction shown in FIG. 11A). This reduced-sized leading end portion 502A may be sized for insertion into a VMD slot formed in a die mount base 404, for example as shown in FIG. 10 with respect to leading portion 412A of VMD 412 configured for insertion into VMD slot 420. The leading end portion 502A of VMD body 502 may be formed in a scribe line region 510 through which the VMD die wafer 500 may subsequently be cut or diced (where the width of the cut is smaller than the scribe region 510, and thus removes only a portion of the scribe region 510), e.g., as discussed below with reference to FIG. 11E. Conductive structures 504 may include a contact coupling structure 504A on, or at, the leading end portion 502A for conductively connecting a subsequently formed contact 552 (to be described in relation to FIG. 11B) to at least one conductive structure 504 and/or other electronic elements provided in the VMD die wafer 500. The contact coupling structure 504A may comprise a three-dimensional structure extending along the x-direction, y-direction, and z-directions shown in FIG. 11A.

The contact coupling structure 504A may be shaped and sized for creating a U-shape, cup-shape, or arched contact 552 configured for engagement with a corresponding VMD contact on an MOMD die mount base upon mounting the VMD to the die mount base, as discussed below. For example, as shown in the top view at the upper portion of FIG. 11A, the contact coupling structure 504A may define a curved opening 504B that exposes a portion of the leading end portion 502A of the VMD body 502. The curved opening 504B may define a circular shape, oval shape, elliptical shape, or other curved shape. Further, as shown in the cross-section view in the lower portion of FIG. 11A, the contact coupling structure 504A may extend in the z-direction, e.g., by forming a series of contiguously connected metal structures at multiple successive layers in the x-direction.

A passivation layer 506 may be formed over the VMD die wafer 500 and patterned and etched to expose selected regions of the conductive structures 504.

Figure 11B:
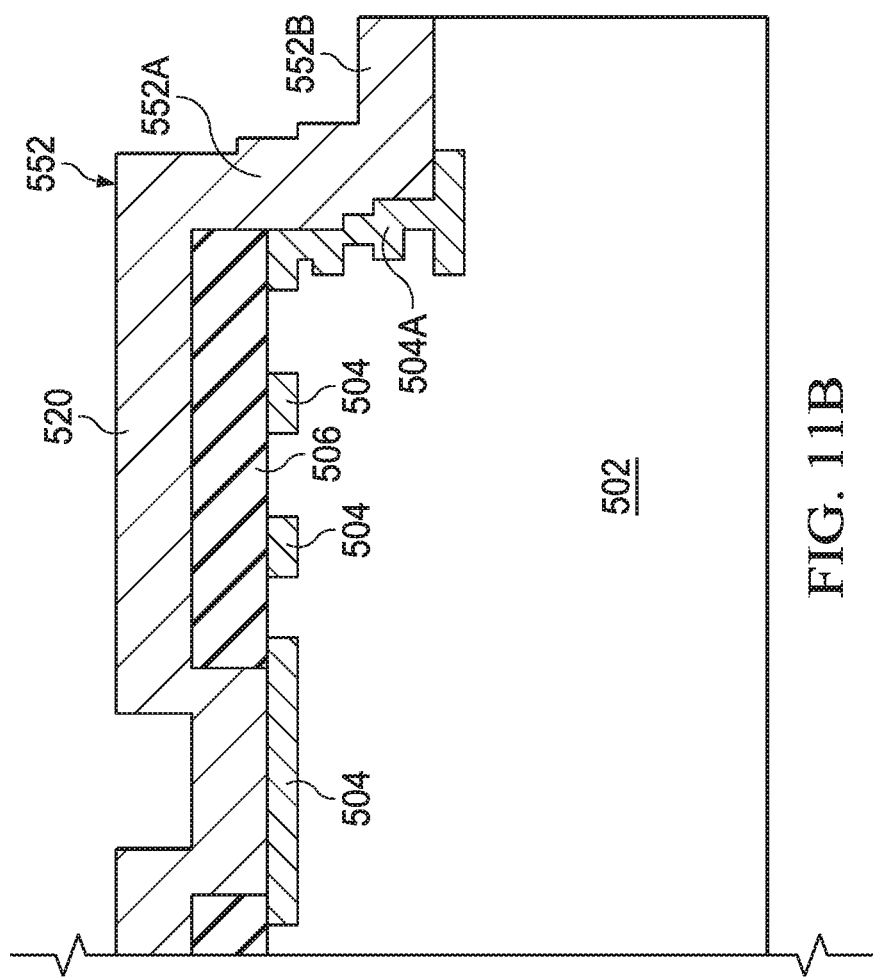

As shown in the cross-sectional view of FIG. 11B, a metal layer 520 may be deposited over the VMD die wafer 500, extending over exposed surfaces of the passivation layer 506, conductive structures 504 (including contact coupling structure 504A), and/or VMD body 502. In some embodiments, metal layer 520 may comprise aluminum, copper, or other soft metal. The metal layer 520 may include a contact portion 552 in contact with the underlying contact coupling structure 504A. The contact portion 552 may include (a) have a U-shaped, cup-shaped, or arch-shaped portion 552A when viewed from a top view (i.e., the perspective of the top portion of FIG. 11A) and (b) a flat or planar base or back portion 552B.

As shown in the cross-sectional view of FIG. 11C, the metal layer 520 is patterned and etched, using any known photolithographic techniques, to define (a) a contact 552 defined by remaining contact portions 552A and 552B and/or (b) one or more additional metal structures 524, which may define (i) at least one conductive contact pad and/or (ii) at least one alignment structure configured to interact with corresponding alignment structures provided on an MOMD die mount base to align and/or guide the mounting of the VMD to the die mount base, e.g., at shown in FIGS. 6A-6C with respect to alignment structures 250 that interact with alignment structures 222 provided on die mount base 204.

Figure 11D:
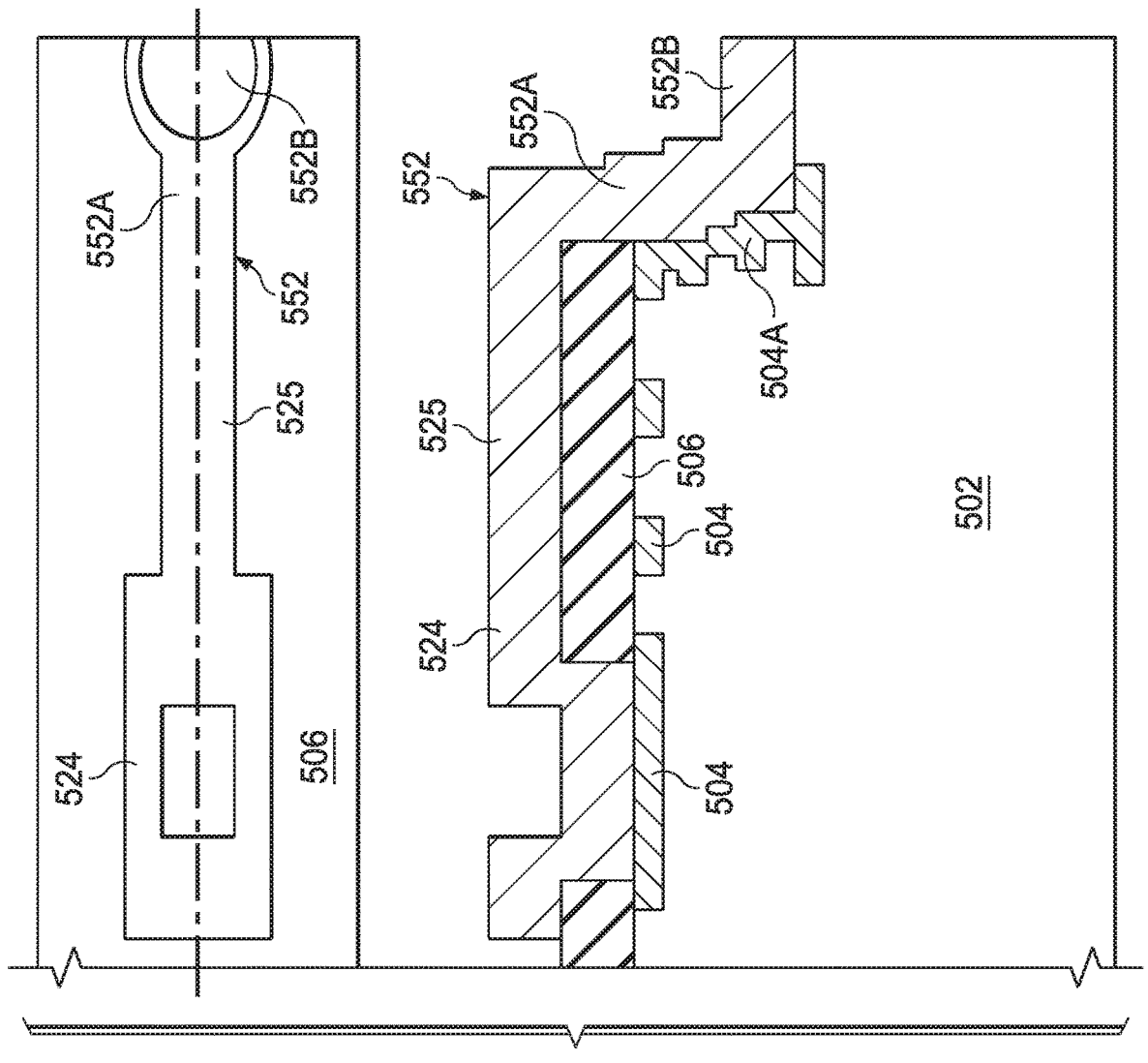

FIG. 11D shows an alternative embodiment, in which contact 552 is connected to a contact structure 524 by an exterior metal strap 525 formed on the passivation layer 506.

As shown in the cross-sectional view of FIG. 11E, which continues from the embodiment shown in FIG. 11C, by the VMD die wafer 500 may be cut or diced as indicated by dashed line D, e.g., by a laser die cut operation, to thereby define a VMD 512 configured for vertical mounting to a die mount base.

Figure 12:
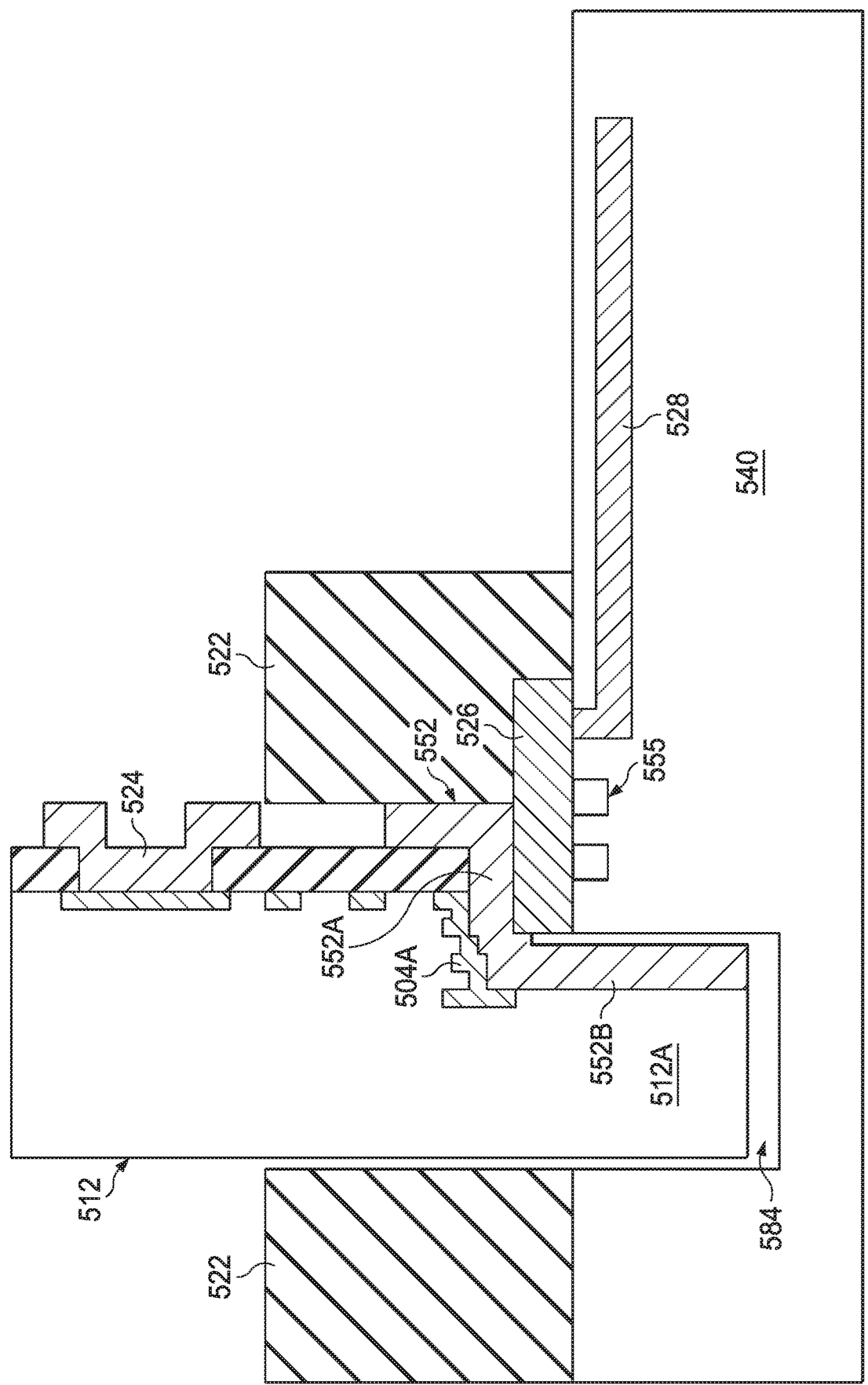
FIG. 12 is a cross-sectional view showing an example VMD, formed according to the process shown in FIGS. 11A-11E, mounted to an example MOMD die mount base, according to one example embodiment.

FIG. 12 is a cross-sectional view showing the example VMD 512 (formed according to the process shown in FIGS. 11A-11E) mounted to an example MOMD die mount base 540, according to one example embodiment. In this example, the VMD 512 is mounted vertically between a pair of polyimide alignment structures 522, with a leading portion 512A of VMD 512 received in a VMD slot 584 formed in the die mount base 540. The U-shaped, cup-shaped, or arched contact portion 552A of contact 552 on the VMD 512 engages with a tin-coated aluminum contact pad 526 provided on the die mount base 540, which is connected to a copper interconnect 528 formed within the die mount base 540. The U-shaped, cup-shaped, or arched contact portion 552A may wrap around the contact pad 526, and the contact portion 552A and/or the contact pad 526 may deform upon downward pressure applied to the VMD 512, to provide an improved contact between contact 552 and contact pad 526. A solder process may then be performed to solder the contact portion 552A to the contact pad 526. The die mount base 540 may include one or more voids or shock pad structures 555 underneath the contact pad 526 to prevent or reduce cracking or other physical damage caused by the mounting of the VMD 512.

As discussed above, some embodiments of the present disclosure provide IC packages, e.g., system-on-chip (SoC) or system-in-package (SiP) products, that include at least one integrated inductor having a core magnetic field (B field) that extends parallel to the substrate major plane of die(s) or chiplet(s) included in or mounted to the product. Orienting the inductor B field parallel to the substrate major plane of a die/chiplet reduces the magnetic field strength to a weak, $2^{nd}$ order effect, as compared with a strong, $1^{st}$ order effect of the magnetic field strength in conventional designs in which the inductor B field extends perpendicular to the die/chiplet substrate major plane. Further, orienting the inductor B field parallel to the die/chiplet substrate major plane, as opposed to orthogonal in conventional designs, significantly reduces a diameter or width of inductor-related eddy current loops within the die/chiplet substrate, e.g., from an eddy current loop having a diameter or width extending across the 10-100 mm lateral width of the substrate (in an example conventional design) to an eddy current loop having a diameter or width extending across the 0.025-0.1 mm (after backgrinding) vertical thickness of the substrate (in an example embodiment of the present invention). As a result, orienting the inductor B field parallel to the die/chiplet substrate major plane may substantially reduce the eddy currents within each die/chiplet substrate, and thereby reduce energy loss of the indictor.

Some embodiments provide an SiP package including VMD(s) mounted to a horizontally-extending package substrate or die mount base, and at least one integrated inductor (e.g., formed from metal interconnect elements in the die mount base) oriented such that the core magnetic field (B field) of each inductor extends vertically, i.e., parallel to the substrate major plane of each mounted VMD. For example, as discussed above with respect to FIG. 4B, example MOMD 100 may include at least one integrated inductor 130 formed in the die mount base 104. As another example, as discussed above with respect to FIGS. 5 and 8, example MOMD 200 may include at least one integrated inductor formed by metal interconnect elements 228 formed in die mount base 204 (FIG. 5), and example MOMD 400 may include at least one integrated inductor formed by metal interconnect elements 428 formed in die mount base 404 (FIG. 8).

Figure 13A:
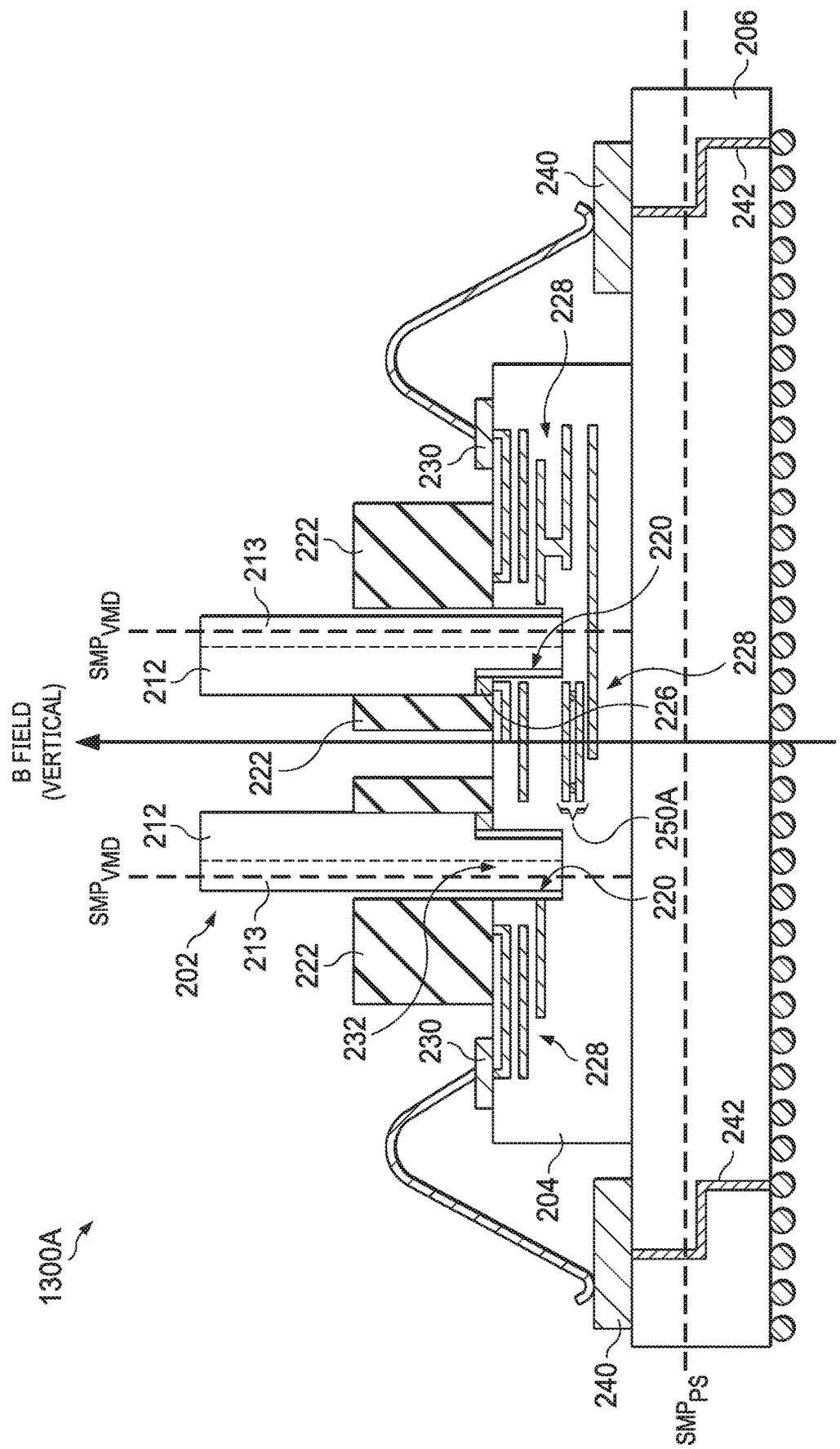
FIG. 13A illustrates an example ODM package including VMDs mounted on a horizontally-extending die mount base, and an integrated inductor formed in the die mount base, according to one example embodiment of the present disclosure.

FIG. 13A illustrates an example ODM package 1300A including an integrated inductor 250A, according to one example embodiment. ODM package 1300A corresponds with the example MOMD package 200 shown in FIG. 5 (discussed above), but without any HMDs. Thus, numbered elements shown in FIG. 13A correspond with numbered elements shown in FIG. 5, using the same reference numbers to represent similar elements. Accordingly, as shown in FIG. 13A, ODM package 1300A includes a plurality of VMDs 212 mounted vertically on a horizontally-extending die mount base 204, which in turn is mounted on a horizontally-extending package substrate 206, and including an integrated inductor 250A formed in the die mount base 204. In particular, the integrated inductor 250A is formed using metal interconnect elements 228 (e.g., copper interconnect) formed in or on die mount base 204.

Integrated inductor 250A may have any suitable form or configuration, for example any of the example inductor configurations shown in FIGS. 14-18B and discussed below. As one example only, integrated inductor 250A may have a spiral shape including one or more turns each formed in a plane parallel to the package substrate 206. In the illustrated example, inductor 250A includes two coils formed in two parallel planes and connected by via(s) or other metal interconnect element(s) 228. Thus, the integrated inductor 250A generates a core magnetic field (B field) that extends vertically, i.e., parallel to the substrate major plane ($SMP_{VMD}$) of each VMD 212, and orthogonal to the substrate major plane ($SMP_{PS}$) of the package substrate 206. The vertically-extending substrate of each VMD 212 is indicated at 213. The orientation of the inductor B field parallel to the substrate major plane ($SMP_{VMD}$) of each VMD substrate 213 may significantly reduce the eddy currents (both in strength and current loop size) within the VMD substrates 213, to thereby reduce the overall loss of the integrated inductor 250A, as compared with an IC package with an integrated inductor having a B extending orthogonal to the mounted dies/chiplets of the IC package. In addition, package substrate 206, which extends orthogonal to the inductor B field, may be formed from at least one high resistivity substrate material, which results in only a small eddy current in the package substrate 206, and thus contributes little or no substrate loss to inductor 250A.

Although only a single integrated inductor 250A is explicitly shown in FIG. 13A, it should be understood that any number of integrated inductors 250A may be formed at any suitable locations in die mount base 204, e.g., wherein each integrated inductor 250A is formed by selected metal interconnect elements 228 within die mount base 204.

Figure 13B:
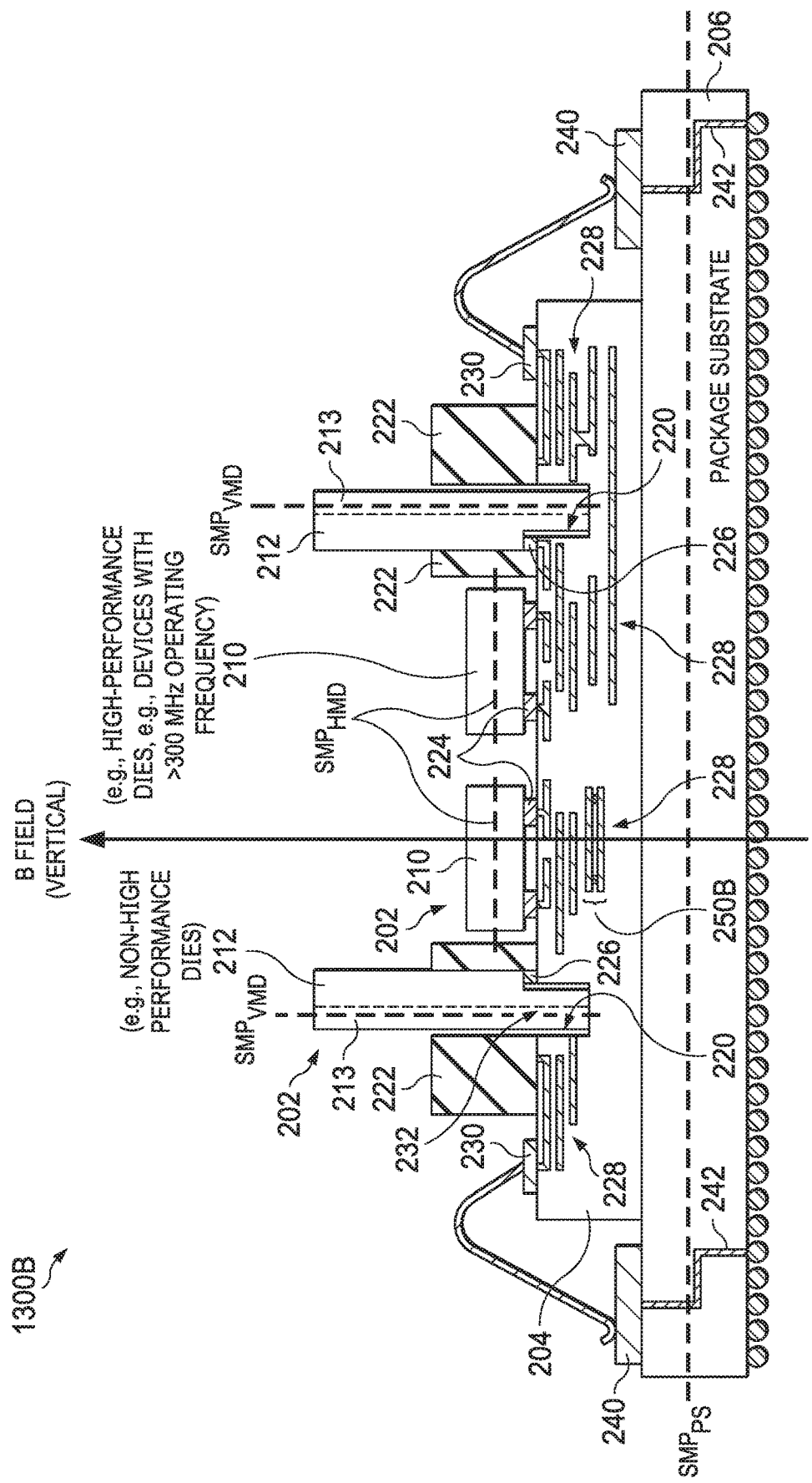
FIG. 13B illustrates an example MOMD package including HMDs and VMDs mounted on a horizontally-extending die mount base, and an integrated inductor formed in the die mount base, according to one example embodiment of the present disclosure.

FIG. 13B illustrates an example ODM package 1300B similar to ODM package 1300A shown in FIG. 13A, but also including HMDs 21, according to one example embodiment. Thus, as ODM package 1300B includes both VMDs and HMDs, ODM package 1300B is a mixed-orientation multi-die package and thus referred to has MOMD package 1300B. MOMD package 1300B corresponds with MOMD package 200 shown in FIG. 5 (discussed above), and including an integrated inductor 250B. Thus, numbered elements shown in FIG. 13B correspond with numbered elements shown in FIG. 5, using the same reference numbers to represent similar elements. Accordingly, as shown in FIG. 13B, MOMD package 1300A includes HMDs 210 and VMDs 212 mounted on a horizontally-extending die mount base 204, which in turn is mounted on a horizontally-extending package substrate 206, and including integrated inductor 250B formed in the die mount base 204. In particular, the integrated inductor 250B is formed using metal interconnect elements 228 (e.g., copper interconnect) formed in or on the die mount base 204.

Integrated inductor 250B may have any suitable form or configuration, for example any of the example inductor configurations shown in FIGS. 14-18B and discussed below. As one example only, integrated inductor 250B may have a spiral shape including one or more turns each formed in a plane parallel to the package substrate 206. In the illustrated example, inductor 250B includes two coils formed in two parallel planes and connected by via(s) or other metal interconnect element(s) 228. Thus, the integrated inductor 250B generates a core magnetic field (B field) that extends vertically, i.e., parallel to the substrate major plane ($SMP_{VMD}$) of each VMD 212, but orthogonal to the substrate major plane ($SMP_{PS}$) of the package substrate 206 and the substrate major plane ($SMP_{HMD}$) each HMD 210. The vertically-extending substrate of each VMD 212 is indicated at 213. The orientation of the inductor B field parallel to the substrate major plane ($SMP_{VMD}$) of each VMD substrate 213 may significantly reduce the eddy currents (both in strength and current loop size) within the VMD substrates 213, to thereby reduce the overall loss of the integrated inductor 250B, as compared with an IC package with an integrated inductor having a B extending orthogonal to the mounted dies/chiplets of the IC package. In addition, in some embodiments, one or more of the substrates oriented orthogonal to the inductor B field, i.e., package substrate 206 and the substrate of each respective HMD 212, may be formed from high resistivity substrate material(s) to further reduce the overall substrate loss at inductor 250B.

Although only a single integrated inductor 250B is explicitly shown in FIG. 13B, it should be understood that any number of integrated inductors 250B may be formed at any suitable locations in die mount base 204, e.g., wherein each integrated inductor 250B is formed by selected metal interconnect elements 228 within die mount base 204.

Figure 13C:
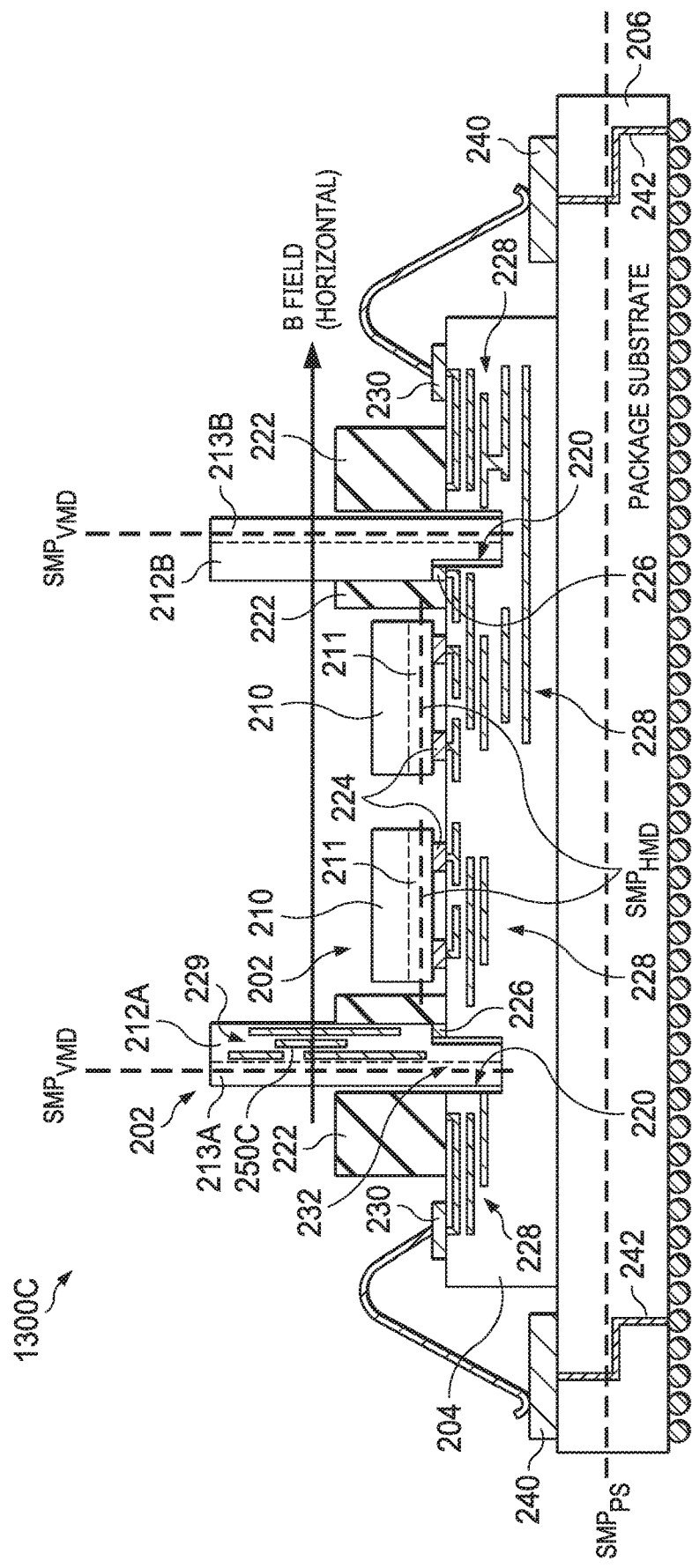
FIG. 13C illustrates an example MOMD package including HMDs and VMDs mounted on a horizontally-extending die mount base, and an integrated inductor formed in one of the mounted VMDs, according to one example embodiment of the present disclosure.

FIG. 13C illustrates an example MOMD package 1300C similar to MOMD package 1300B shown in FIG. 13B, but (unlike MOMD package 1300B) including an integrated inductor formed in a particular VMD and having a horizontally-extending B field, according to one example embodiment. Accordingly, as shown in FIG. 13C, MOMD package 1300C includes HMDs 210 and VMDs 212A, 212B mounted on a horizontally-extending die mount base 204, which in turn is mounted on a horizontally-extending package substrate 206, and including integrated inductor 250C formed in VMD 212A with an orientation that defines a horizontally-extending B field of integrated inductor 250C. For example, integrated inductor 250C may be formed using elements of one or more vertically-extending metal layers 229 formed in or on VMD 212A. The horizontally-extending inductor B field extends parallel to each HMD substrate 211 and parallel to the package substrate 206, but orthogonal to VMD substrates 213A and 213B. The orientation of the inductor B field parallel to each HMD substrate 211 and parallel to package substrate 206 may significantly reduce the eddy currents (both in strength and current loop size) within each HMD substrate 211 and within package substrate 206, to thereby reduce the overall loss of the integrated inductor 250C. In addition, in some embodiments, one or both of VMD substrates 213A and 213B, each oriented orthogonal to the inductor B field, may be formed from high resistivity substrate material(s) to further reduce the overall substrate loss at inductor 250C Each integrated inductor 250A, 250B, and 250C shown in FIGS. 13A-13C may each have any suitable form or configuration. FIGS. 14-18B illustrate some example configurations of integrated inductors 250A, 250B, and 250C. The orientations of the example integrated inductors shown in FIGS. 14-18B correspond with embodiments in which the inductor is formed in a horizontally-extending die mount base, e.g., the embodiments shown in FIGS. 13A and 13B, to define a vertically-extending B field. In alternative embodiments in which the inductor is formed in a VMD, e.g., the embodiments shown in FIG. 13C, the integrated inductors shown in FIGS. 14-18B may be oriented orthogonal to the illustrated orientations, to thereby define a horizontally-extending B field as shown in FIG. 13C.

Figure 14:
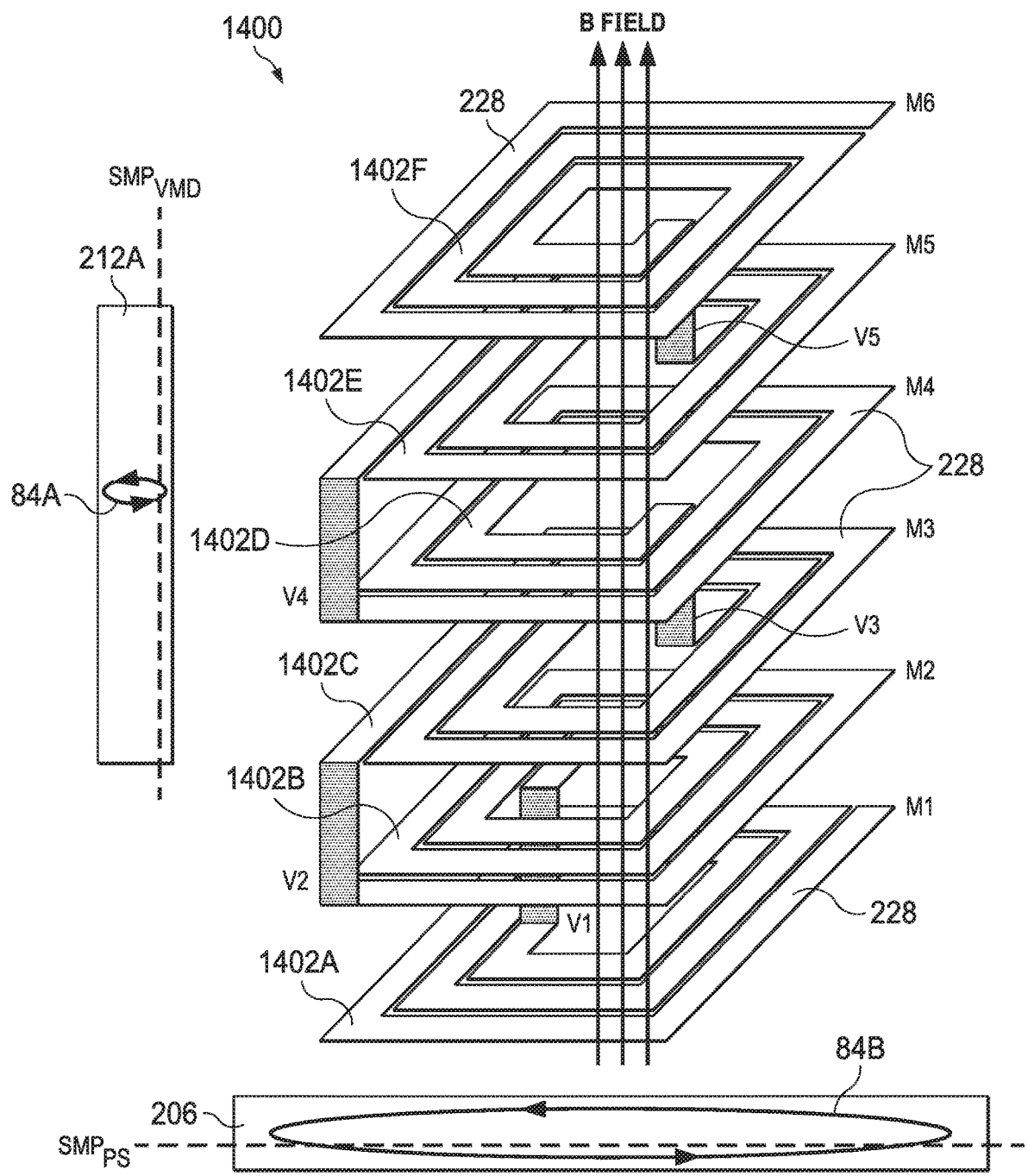
FIG. 14 illustrates a first example configuration of an integrated inductor for use in an ODM package, e.g., any of the packages shown in FIGS. 13A-13C, according to one example embodiment.

FIG. 14 illustrates a first example configuration of an integrated inductor, indicated at 1400, for use in ODM 1300A, MOMD 1300B, and/or MOMD 1300C shown in FIGS. 13A-13C, according to one example embodiment. Integrated inductor 1400 is a stacked inductor that may be constructed from metal layers and/or interconnect elements in or on a horizontally-extending die mount base (e.g., die mount base 204 shown in FIGS. 13A and 13B) or from metal layers and/or interconnect elements in or on a vertically-extending VMD (e.g., VMD 212A shown in FIG. 13C).

In the illustrated example, inductor 1400 includes six coils 1402A-1402F formed in six metal layers M1-M6 and connected to each other by vias V1-V5. In some embodiments, the wiring density of the inductor coils can be further improved using a double patterning technique, as known in the art.

In some embodiments, integrated inductor 1400 may be formed without adding additional process steps to the underlying process flow for die mount base 204, and may thus be constructed at low cost.

In addition to the integrated inductor 1400, FIG. 14 illustrates a representation (not to scale) of the package substrate 206 on which the die mount base 204 containing the integrated inductor 1400 is mounted, along with a selected VMD 212A mounted to the die mount base 204, to illustrate the orientation of the integrated inductor 1400 relative to the package substrate 206 and each VMD 212 in the example OMD 1300A of FIG. 13A or MOMD 1300B of FIG. 13B (integrated inductor 1400 may be oriented orthogonal to the illustrated orientation for use in the embodiment of FIG. 13C). VMD 212A may comprise a die/chiplet with a lossy silicon substrate. As shown, the vertically-extending inductor B field is parallel to the substrate major plane ($SMP_{VMD}$) of VMD 212A and thus creates a small eddy current loop 84A perpendicular to the substrate major plane ($SMP_{VMD}$) of VMD 212A, and thus little or no substrate loss in the integrated inductor 1400. In addition, the vertically-extending inductor B field is perpendicular to the substrate major plane ($SMP_{PS}$) of the package substrate 206, which creates a large eddy current loop 84B parallel to the package substrate 206. However, the package substrate 206 may be formed from high resistivity substrate material(s), thus providing a weak eddy current and thus little or no substrate loss in the integrated inductor 1400.

Figure 15:
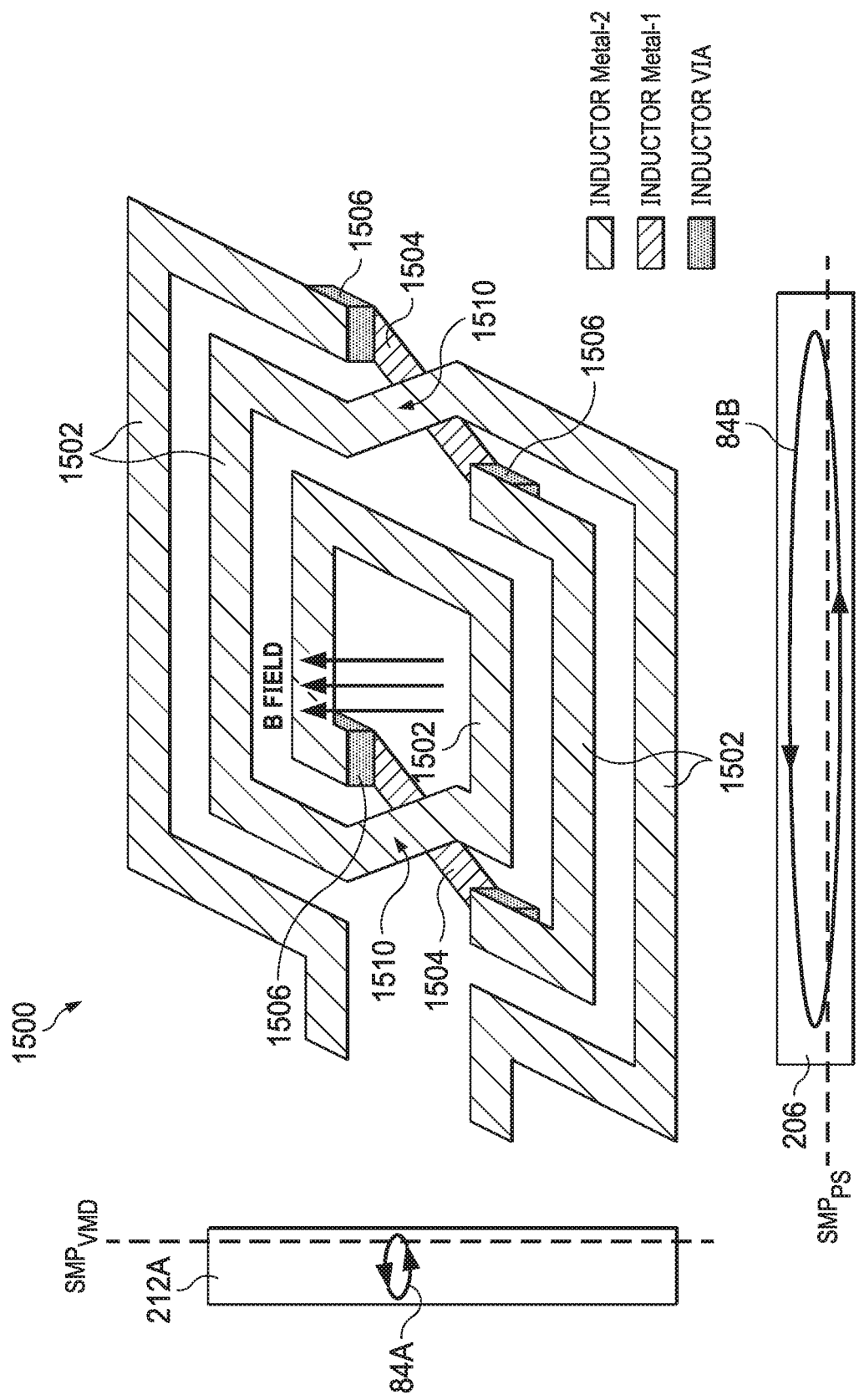
FIG. 15 illustrates a second example configuration of an integrated inductor for use in an ODM package, e.g., any of the packages shown in FIGS. 13A-13C, according to another example embodiment.

FIG. 15 illustrates a second example configuration of an integrated inductor, indicated at 1500, for use in ODM 1300A, MOMD 1300B, and/or MOMD 1300C shown in FIGS. 13A-13C, according to one example embodiment. Integrated inductor 1500 is a planar, symmetrical spiral inductor that may be constructed from metal layers and/or interconnect elements in or on a horizontally-extending die mount base (e.g., die mount base 204 shown in FIGS. 13A and 13B) or from metal layers and/or interconnect elements in or on a vertically-extending VMD (e.g., VMD 212A shown in FIG. 13C). For example, coil sections 1502 may be formed in a first metal layer and coil sections 1504 formed in a second metal layer parallel to the first metal layer and connected to the first metal layer by metal vias 1506 extending orthogonal to the first and second metal layers. In the example orientation shown in FIG. 15, the coil sections 1504 formed in the second metal layer pass below (and vertically spaced apart from) the first metal layer coil sections 1502 at overlap locations indicated at 1510, to define a single continuous inductor coil including three turns (N=3).

In some embodiments, the first and second metal coil sections 1502, 1504 and metal vias 1506 are relatively thick, e.g., in the range of 2 µm-4 µm, to reduce resistance losses.

In addition to the integrated inductor 1500, FIG. 15 illustrates a representation (not to scale) of the package substrate 206 on which the die mount base (e.g., die mount base 204 shown in FIGS. 13A and 13B) containing the integrated inductor 1500 is mounted, along with a selected VMD 212A mounted to the die mount base 204, to illustrate the orientation of the integrated inductor 1500 relative to the package substrate 206 and to each VMD 212 in the example OMD 1300A of FIG. 13A or MOMD 1300B of FIG. 13B (integrated inductor 1500 may be oriented orthogonal to the illustrated orientation for use in the embodiment of FIG. 13C). VMD 212A may comprise a die/chiplet with a lossy silicon substrate. As shown, the vertically-extending inductor B field is parallel to the substrate major plane ($SMP_{VMD}$) of VMD 212A and thus creates a small eddy current loop 84A perpendicular to the substrate major plane ($SMP_{VMD}$) of VMD 212A, and thus little or no substrate loss in the integrated inductor 1500. In addition, the vertically-extending inductor B field is perpendicular to the substrate major plane ($SMP_{PS}$) of the package substrate 206, which creates a large eddy current loop 84B parallel to the package substrate 206. However, the package substrate 206 may be formed from high resistivity substrate material(s), thus providing a weak eddy current and thus little or no substrate loss in the integrated inductor 1500.

Figure 16A:
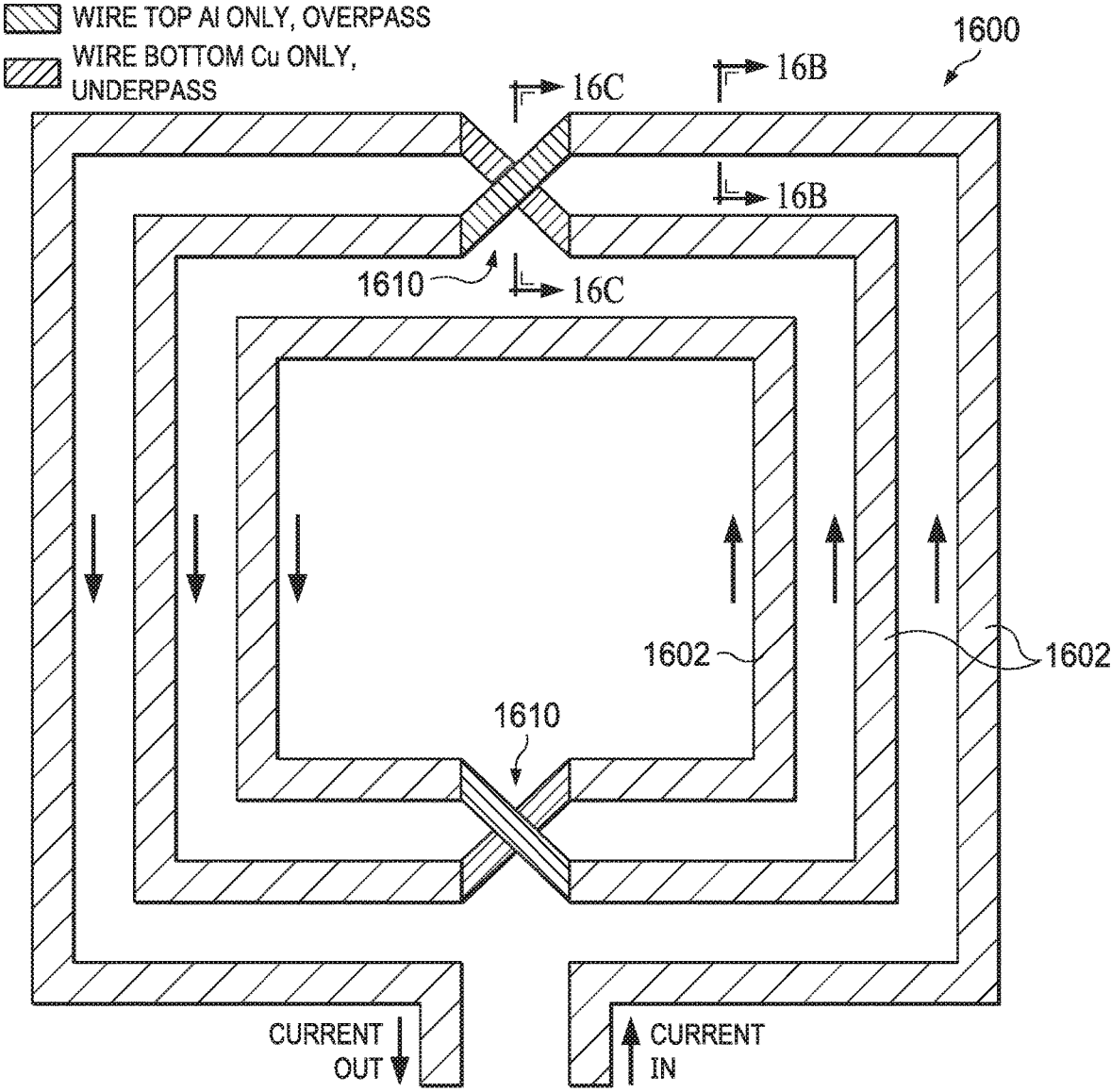
FIGS. 16A, 16B, and 16C are a top view and two cross-sectional views, respectively, of a third example configuration of an integrated inductor for use in an ODM package, e.g., any of the packages shown in FIGS. 13A-13C, according to another example embodiment.

FIG. 16A is a top view of a third example configuration of an integrated inductor, indicated at 1600, for use in ODM 1300A, MOMD 1300B, and/or MOMD 1300C shown in FIGS. 13A-13C, according to another example embodiment. Integrated inductor 1600 is described in co-pending U.S. patent application Ser. No. 16/549,635 filed Aug. 23, 2019 and entitled "Techniques for Making Integrated Inductors and Related Semiconductor Devices, Electronic Systems, and Methods," the entire contents of which application are hereby incorporated by reference for all purposes. Like integrated inductor 1500 shown in FIG. 15, integrated inductor 1600 is a planar, symmetrical spiral inductor. The example integrated inductor 1600 has a square coil shape with three turns (N=3).

However, unlike integrated inductor 1500, integrated inductor 1600 utilizes the full thickness of two metal layers, without via connection. In particular, two metal layers (e.g., a Cu layer and an Al layer) are shunted together in the vertical direction to create a low resistance inductor coil wire 1602 having a vertical thickness spanning two metal layers except at the locations of wire overlaps, indicated at 1610.

Figure 16B:
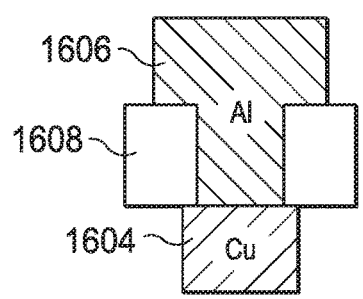

FIG. 16B shows a cross-section of the dual-layer inductor coil wire 1602 taken through line 16B-16B shown in FIG. 16A. As shown, the inductor coil wire 1602 includes a lower copper region 1604 formed in a first metal layer, and an upper aluminum region 1606 formed in a second metal layer, and extending down into a trench formed in a passivation region 1608 and into contact with the underlying copper region 1604.

Figure 16C:
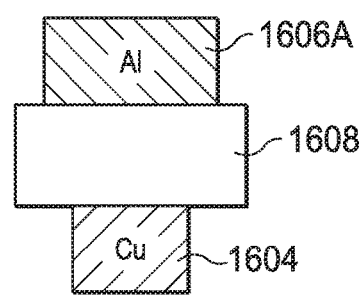

In contrast, FIG. 16C shows a cross-section of an overlap region 1610, in particular a cross-section through line 16C-16C shown in FIG. 16A. As shown, the upper aluminum region 1606 is separated (and electrically isolated) from the lower copper region 1604 by the passivation region 1608, such that the upper aluminum region 1606 may cross over the lower copper region 1604 to thereby provide a continuous conductive path of the inductor coil 1602. As noted above, the illustrated example of inductor 1600 is a square shaped coil including three turns. In other embodiments, inductor 1600 may have a hexagonal, octagonal, or circular shape, for example, which may further lower the resistance (R) for a given inductance value (L), but may increase the layout complexity of the integrated inductor.

Figure 17A:
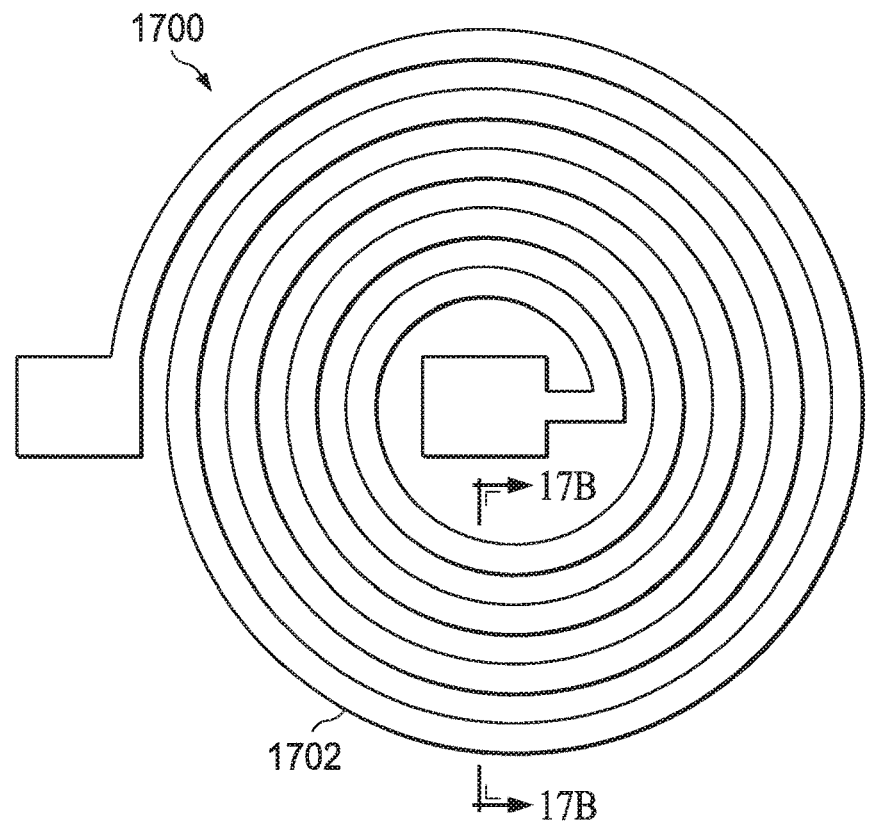
FIGS. 17A and 17B are a top view and cross-sectional view, respectively, of a fourth example configuration of an integrated inductor for use in an ODM package, e.g., any of the packages shown in FIGS. 13A-13C, according to another example embodiment.

FIG. 17A is a top view of a fourth example configuration of an integrated inductor, indicated at 1700, for use in ODM 1300A, MOMD 1300B, and/or MOMD 1300C shown in FIGS. 13A-13C, according to another example embodiment. Integrated inductor 1700 is a spiral inductor including a continuous inductor wire 1702 formed in a circular spiral shape. The spiral inductor wire 1702 may be constructed from a stack of horizontal metal layers connected vertically by via connections, within the die mount base 204 (or alternatively, in the embodiment of FIG. 13C, spiral inductor wire 1702 formed in VMD 212A may be constructed from a stack of vertically-extending metal layers connected by horizontally-extending via connections).

Figure 17B:
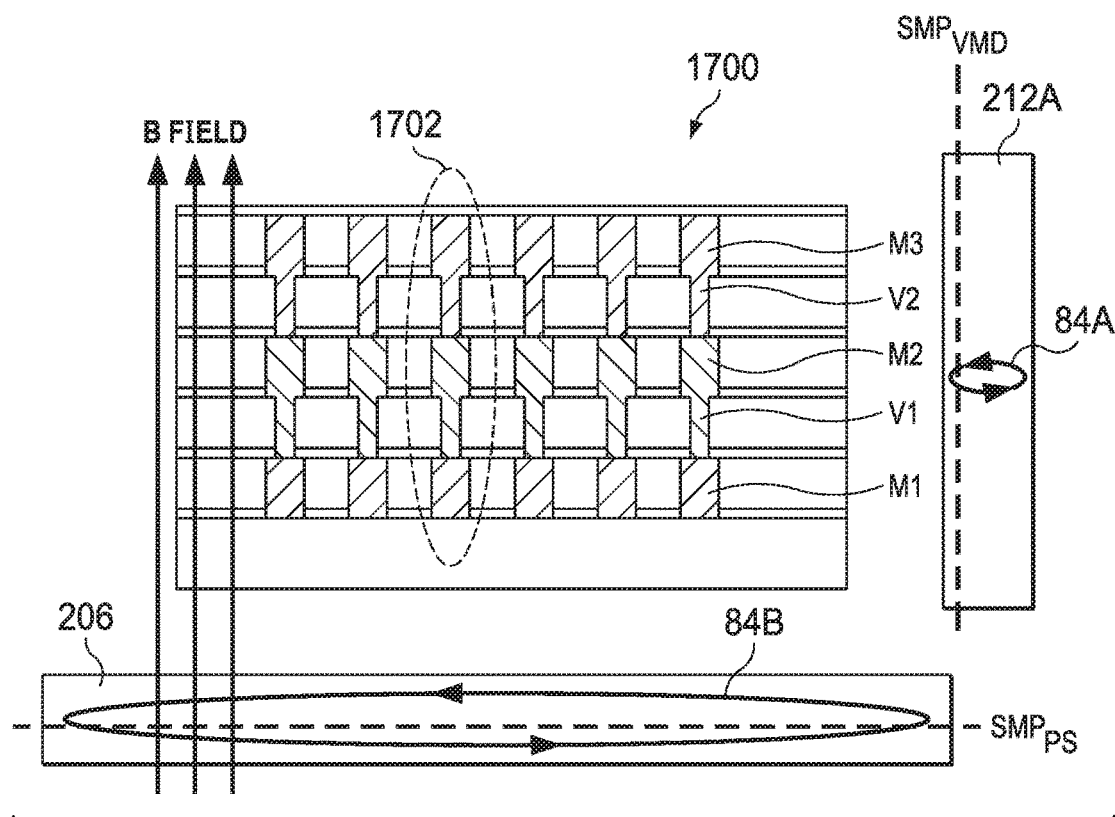

FIG. 17B is a cross-sectional view of integrated inductor 1700 taken through line 17B-17B shown in FIG. 17A. FIG. 17B also includes a representation (not to scale) of the package substrate 206 on which the die mount base (e.g., die mount base 204 shown in FIGS. 13A and 13B) containing the integrated inductor 1700 is mounted, along with a selected VMD 212A mounted to the die mount base 204, to illustrate the orientation of the integrated inductor 1700 relative to the package substrate 206 and to each VMD 212 in the example OMD 1300A of FIG. 13A or MOMD 1300B of FIG. 13B (integrated inductor 1700 may be oriented orthogonal to the illustrated orientation for use in the embodiment of FIG. 13C). As shown in FIG. 17B, the example inductor wire 1702 is constructed from three metal layers M1, M2, and M3 respectively connected by vias V1 and V2. In other embodiments, inductor wire 1702 may be similarly constructed from any number of metal layers connected by vias. Integrated inductor 1700 may be formed without adding additional process steps to the underlying process flow for die mount base 204, and may thus be constructed at low cost.

As with the embodiments shown in FIGS. 14-16C discussed above, the vertically-extending inductor B field of integrated inductor 1700 is parallel to the substrate major plane ($SMP_{VMD}$) of VMD 212A and thus creates a small eddy current loop 84A perpendicular to the substrate major plane ($SMP_{VMD}$) of VMD 212A, and thus little or no substrate loss in the integrated inductor 1700. In addition, the vertically-extending inductor B field of integrated inductor 1700 is perpendicular to the substrate major plane ($SMP_{PS}$) of the package substrate 206, which creates a large eddy current loop 84B parallel to the package substrate 206. However, as discussed above, the package substrate 206 may be formed from high resistivity substrate material(s), thus providing a weak eddy current and thus little or no substrate loss in the integrated inductor 1700. In some embodiments, the wiring density of the inductor coil 1702 can be further improved using a double patterning technique, as known in the art.

In some embodiments, a magnetic core is added at the center of any of the example integrated inductor configurations disclosed herein, e.g., integrated inductor 1400, 1500, 1600, or 1700, to increase magnetic permeability and thereby increase inductance of the respective inductor, as compared to the respective inductor without a magnetic core (e.g., an air-core inductor).

Figure 18A:
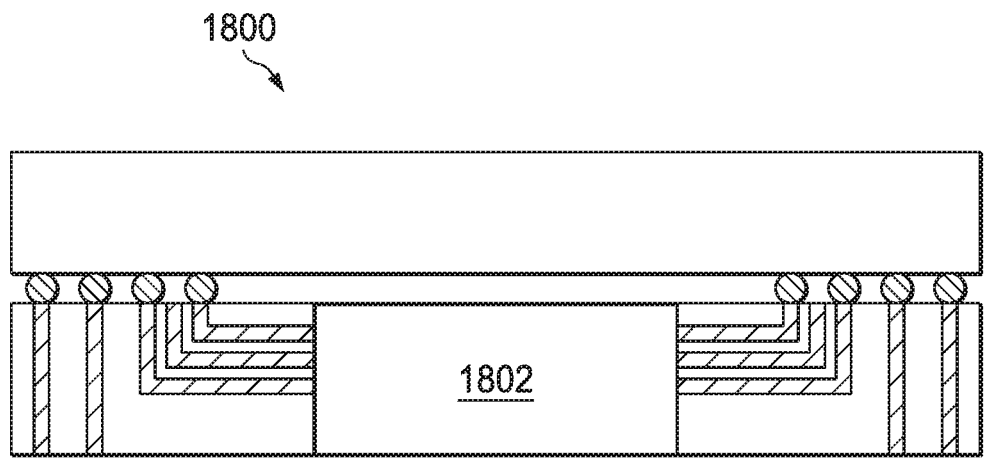
FIGS. 18A and 18B are cross-sectional views illustrating a process of forming a magnetic core in an integrated inductor, e.g., any of the example integrated inductor configurations disclosed herein, according to one example embodiment.
Figure 18B:
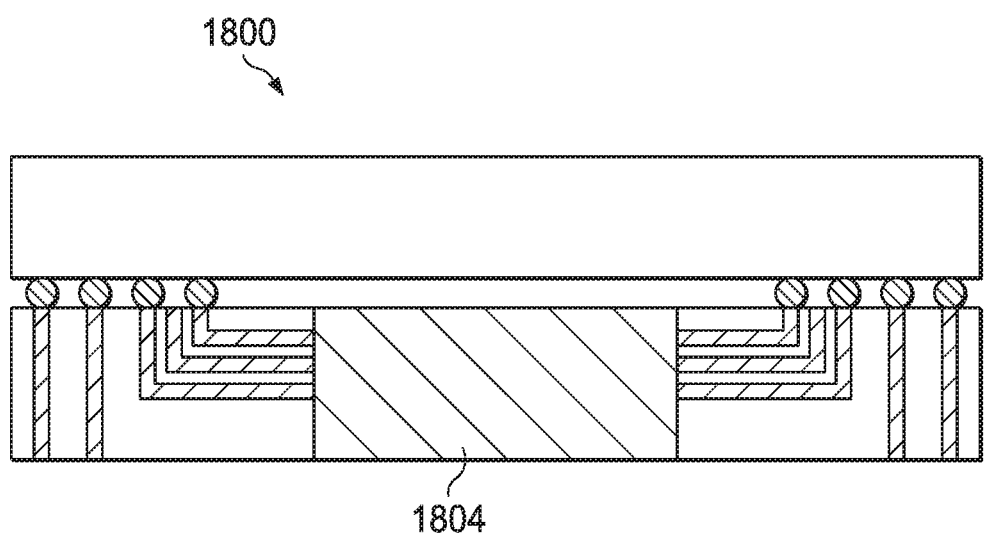

FIGS. 18A and 18B are cross-sectional views illustrating a process of forming a magnetic core in an integrated inductor 1800 (e.g., any of the example integrated inductor configurations disclosed herein). As shown in FIG. 18A, at least one hole 1802 is formed in the center of the integrated inductor 1800. Then, as shown in FIG. 18B, each hole 1802 is filled with at least one magnetic material 1804, and excess magnetic material may then be removed, e.g., by chemical mechanical planarization (CMP). In some embodiments, a damascene process may be used to create and fill each hole 1802 with magnetic material 1804. Some example magnetic materials suitable for the core include iron, manganese-zinc ferrite (MnZn), and nickel-zinc ferrite (NiZn), for example. Material contamination (traps in the middle of band gap) is generally not an issue, in particular where the structure in which the integrated inductor is formed (e.g., die mount base 204 in the embodiments of FIGS. 13A-13B or VMD 212A in the embodiment shown in FIG. 13C) does not include transistors formed therein.

The invention claimed is:

1. An integrated circuit (IC) package, comprising:
   an IC package substrate having a horizontal IC package substrate major plane;
   a die mount base arranged on the IC package substrate and having a horizontal die mount base substrate major plane parallel to the horizontal IC package substrate major plane;
   a vertically-mounted die (VMD) mounted to the die mount base in a vertical orientation, the VMD comprising a VMD die substrate having a vertical die substrate major plane; and
   an integrated inductor having a core magnetic field (B field) extending parallel to at least one of (a) the IC package substrate major plane and (b) the VMD die substrate major plane.

2. The IC package of claim 1, wherein the integrated inductor is formed in the die mount base with the B field of the integrated inductor extending vertically.

3. The IC package of claim 1, further comprising at least one additional VMD mounted to the die mount base in a vertical orientation.

4. The IC package of claim 1, further comprising a horizontally-mounted die (HMD) mounted to the die mount base in a horizontal orientation.

5. The IC package of claim 4, wherein:
   the HMD comprises a device having an operating frequency of at least 300 MHz; and
   the VMD comprises a device having an operating frequency of less than 300 MHz.

6. The IC package of claim 1, wherein the VMD die substrate is formed from a more lossy material than the IC package substrate.

7. The IC package of claim 1, wherein the IC package substrate has a resistivity of greater than 5 ohm-cm.

8. The IC package of claim 1, wherein the IC package substrate comprises sapphire.

9. The IC package of claim 1, wherein the IC package substrate comprises purified silicon having a resistivity of greater than 5 ohm-cm.

10. The IC package of claim 1, wherein the integrated inductor is formed from selected metal interconnect elements in the die mount base.

11. The IC package of claim 1, wherein the integrated inductor comprises a spiral inductor.

12. The IC package of claim 1, comprising:
a vertically-extending groove formed in the die mount base;
wherein the VMD is received in the vertically-extending groove in the die mount base.

13. The IC package of claim 1, wherein the integrated inductor is formed in the VMD and the B field of the integrated inductor extends horizontally, parallel to the IC package substrate major plane.

14. The IC package of claim 13, further comprising a horizontally-mounted die (HMD) mounted to the die mount base in a horizontal orientation and having an HMD substrate extending in an HMD substrate major plane extending parallel to the horizontally-extending B field of the integrated inductor.

15. An integrated circuit (IC) package, comprising:
an IC package substrate having a horizontally-extending IC package substrate major plane;
a vertically-mounted die (VMD) mounted in the IC package in a vertical orientation, the VMD comprising a VMD die substrate having a vertically-extending die substrate major plane extending perpendicular to the horizontally-extending IC package substrate major plane; and
an integrated inductor having a core magnetic field (B field) extending parallel to at least one of (a) the horizontally-extending IC package substrate major plane and (b) the VMD die substrate major plane.

16. The IC package of claim 15, wherein the integrated inductor is formed in a horizontally extending die mount base with the B field of the integrated inductor extending vertically, wherein the VMD is mounted to the horizontally extending die mount base in the vertical orientation.

17. The IC package of claim 15, wherein the integrated inductor is formed in the VMD and the B field of the integrated inductor extends parallel to the horizontally-extending IC package substrate major plane.

18. The IC package of claim 15, further comprising a horizontally-mounted die (HMD) mounted in the IC package in a horizontal orientation.

* * * * *